(12) United States Patent
Tsao et al.

(10) Patent No.: US 12,240,952 B2
(45) Date of Patent: Mar. 4, 2025

(54) METHODS AND COMPOSITIONS FOR FILMS, MASTERBATCH, YARNS, FABRICS, AND ARTICLES COMPRISING SAME

(71) Applicant: BRRR! INC., Atlanta, GA (US)

(72) Inventors: Cheng-Shang Tsao, Taipei (TW); Hung-Yuan Su, Taoyuan (TW)

(73) Assignee: BRRR! Inc., Atlanta, GA (US)

( * ) Notice: Subject to any disclaimer, the term of this patent is extended or adjusted under 35 U.S.C. 154(b) by 0 days.

(21) Appl. No.: 18/266,582

(22) PCT Filed: Dec. 11, 2021

(86) PCT No.: PCT/US2021/062987
§ 371 (c)(1),
(2) Date: Jun. 9, 2023

(87) PCT Pub. No.: WO2022/126003
PCT Pub. Date: Jun. 16, 2022

(65) Prior Publication Data
US 2023/0391965 A1    Dec. 7, 2023

Related U.S. Application Data

(60) Provisional application No. 63/124,477, filed on Dec. 11, 2020.

(51) Int. Cl.
| C08J 3/22 | (2006.01) |
| C08K 3/22 | (2006.01) |
| C08K 3/26 | (2006.01) |
| C23C 14/08 | (2006.01) |
| C23C 14/20 | (2006.01) |
| C23C 14/35 | (2006.01) |
| C23C 14/58 | (2006.01) |
| D01D 1/00 | (2006.01) |
| D01D 5/088 | (2006.01) |
| D01F 1/10 | (2006.01) |
| D01F 6/62 | (2006.01) |
| D02G 3/02 | (2006.01) |
| D03D 13/00 | (2006.01) |
| D03D 15/283 | (2021.01) |
| D03D 15/52 | (2021.01) |

(52) U.S. Cl.
CPC .......... *C08J 3/226* (2013.01); *C08K 3/22* (2013.01); *C08K 3/26* (2013.01); *C23C 14/086* (2013.01); *C23C 14/205* (2013.01); *C23C 14/352* (2013.01); *C23C 14/584* (2013.01); *D01D 1/00* (2013.01); *D01D 5/088* (2013.01); *D01F 1/10* (2013.01); *D01F 6/62* (2013.01); *D02G 3/02* (2013.01); *D03D 13/008* (2013.01); *D03D 15/283* (2021.01); *D03D 15/52* (2021.01); *C08J 2367/00* (2013.01); *C08J 2377/00* (2013.01); *C08K 2003/2241* (2013.01); *C08K 2003/265* (2013.01); *C08K 2201/011* (2013.01); *D10B 2331/04* (2013.01)

(58) Field of Classification Search
None
See application file for complete search history.

(56) References Cited

U.S. PATENT DOCUMENTS

| 2016/0152002 | A1* | 6/2016 | Inui | B32B 37/12 |
| | | | | 428/172 |
| 2016/0365540 | A1* | 12/2016 | Xiao | H10K 50/8445 |
| 2020/0208305 | A1 | 7/2020 | Su et al. | |
| 2020/0353720 | A1 | 11/2020 | Cui et al. | |

FOREIGN PATENT DOCUMENTS

| EP | 3 954 741 A1 | 2/2022 |
| JP | 2005-004899 A | 1/2005 |

OTHER PUBLICATIONS

Kim et al. (Aluminum-doped zinc oxide thin films grown on various substrates using facing target sputtering system Applied Surface Science 421 (2017) 18-23 (Year: 2017).*

Matsuoka et al. (rf and de discharge characteristics for opposed-targets sputtering J. Appl. Phys. 60 (6) Sep. 15, 1986). (Year: 1986).*

* cited by examiner

*Primary Examiner* — Robert T Butcher
(74) *Attorney, Agent, or Firm* — Thomas|Horstemeyer

(57) ABSTRACT

In one aspect, the disclosure relates to cooling films comprising a substrate and one or more cooling materials deposited on the substrate. The disclosed cooling films can be used to prepare the disclosed cooling masterbatch materials. The disclosed cooling masterbatch materials can be used to prepare disclosed cooling yarns. The one or more cooling materials deposited on the substrate of a disclosed cooling film, dispersed in a disclosed cooling masterbatch material, or in disclosed cooling yarn are nano-sized particles. In still further aspects, the present disclosure pertains to a fabric comprising a disclosed cooling yarn. This abstract is intended as a scanning tool for purposes of searching in the particular art and is not intended to be limiting of the present disclosure.

12 Claims, 6 Drawing Sheets

METHODS AND COMPOSITIONS FOR FILMS, MASTERBATCH, YARNS, FABRICS, AND ARTICLES COMPRISING SAME

CROSS-REFERENCE TO RELATED APPLICATIONS

This application is the 35 U.S.C. § 371 national stage application of PCT Application No. PCT/US2021/062987, filed Dec. 11, 2021, where the PCT claims priority to, and the benefit of, U.S. provisional application entitled "METHODS AND COMPOSITIONS FOR COOLING YARNS AND FABRICS, AND ARTICLES COMPRISING SAME" having Ser. No. 63/124,477, filed Dec. 11, 2020, both of which are herein incorporated by reference in their entireties.

BACKGROUND

Textile materials that have cooling properties, e.g., minimize heat retention, mitigate heat absorption from the external environment, and/or provide a cooling tactile sensation or perception are highly desirable. Such textile materials would have a number of applications, including sportswear, apparel, upholstery, and other textile applications, in which thermal comfort would improve performance and/or the user experience. In addition, it is desirable that incorporation of cooling properties into textile materials be accompanied by improvements in one or more of Qmax, thermal effusivity, wicking, drying time, blocking UV and/or IR radiation, and the like.

However, for widespread use of such textile materials cost and ease of manufacturing considerations are paramount. That is, it is important that a textile material having improved cooling properties meet market requirements in terms of cost, be accessible from a manufacturing perspective, and be scalable. For example, systems and processes for preparing a cooling composition comprising nanoparticle materials in a form that can be used in a masterbatch for use with standard methods of yarn spinning such as melt spinning, dry spinning, gel spinning and solvent spinning are lacking in the field.

Thus, despite advances in textile research, there remains an important need for materials and processes that can be used in production of yarns and fabrics that have nanoparticle cooling compositions providing improved cooling properties, e.g., minimize heat retention, mitigate heat absorption from the external environment, and/or provide a cooling tactile sensation or perception, while maintaining the hand feel and function. These needs and other needs are satisfied by the present disclosure.

SUMMARY

In one aspect, the disclosure relates to cooling masterbatch materials comprising cooling compositions comprising aluminum nanoparticles, zinc oxide nanoparticles, titanium dioxide nanoparticles, calcium carbonate nanoparticles, and combinations thereof. The disclosed cooling masterbatch materials can be used to prepare disclosed cooling yarns. The one or more cooling materials deposited on the substrate of a disclosed cooling film, dispersed in a disclosed cooling masterbatch material, or in disclosed cooling yarn are nano-sized particles. In still further aspects, the present disclosure pertains to a cooling fabric comprising a disclosed cooling yarn. Also disclosed are articles comprising a disclosed cooling fabric. In various aspects, the aluminum nanoparticles and zinc oxide nanoparticles are prepared by sputter depositing these nanoparticles on a polymer substrate to form a cooling film comprising a substrate having a layer of a sputtered material comprising nanoparticles of a cooling composition. The cooling film can be used in the preparation of the disclosed cooling masterbatch materials. The cooling masterbatch materials can further comprise titanium dioxide nanoparticles and/or calcium carbonate nanoparticles formed by ultrasonic depolymerization.

Disclosed are methods of forming a cooling film, the methods comprising: placing a plurality of sputtering targets in a sputtering chamber of sputtering device; placing a substrate in a substrate holder disposed above the plurality of sputtering targets; applying a DC magnetic field to the sputtering targets; and depositing a layer of sputtered material on a surface of the substrate; wherein the plurality of sputtering targets comprise a sputtering material selected from aluminum, zinc oxide, and combinations thereof; wherein the layer of sputtered material comprises nanoparticles of a cooling composition; wherein the cooling composition comprises a material selected from aluminum, zinc oxide, and combinations thereof; and wherein the substrate comprises a polymer; thereby forming a cooling film comprising a substrate having thereon a layer of sputtered material.

Also disclosed are cooling pre-masterbatch compositions comprising a disclosed cooling film.

Also disclosed are cooling pre-masterbatch compositions comprising: a cooling film comprising substrate with a layer of a cooling composition thereon on a surface of the substrate; wherein the layer of the cooling composition comprises nanoparticles of a cooling composition selected from aluminum, zinc oxide, and combinations thereof; and wherein the substrate comprises a polymer.

Also disclosed are methods for preparing a cooling masterbatch composition, comprising: providing a premelt mixture comprising a premelt polymer and a premelt cooling material; wherein the premelt polymer is selected from a polyester, a polyamide, and combinations thereof; and wherein the premelt cooling material is selected from: (a) a disclosed cooling pre-masterbatch composition; (b) titanium dioxide nanoparticles; (c) calcium carbonate nanoparticles; and (d) combinations of (a), (b) and (c); wherein the cooling pre-masterbatch composition, when present, is in the premelt mixture in an amount of from about 1 wt % to about 10 wt %; wherein the titanium dioxide, when present, is in the premelt mixture in an amount of from about 5 wt % to about 80 wt %; wherein the calcium carbonate, when present, is in the premelt mixture in an amount of from about 5 wt % to about 80 wt %; and wherein the wt % is based on the total weight of the premelt polymer and the premelt cooling material; melting the premelt mixture to form a melt mixture; and extruding the melt mixture; thereby providing the cooling masterbatch composition.

Also disclosed are cooling masterbatch compositions prepared by the disclosed methods of making a cooling masterbatch composition.

Also disclosed are cooling masterbatch compositions comprising: a masterbatch polymer selected from a polyester, a polyamide, and combinations thereof; a masterbatch cooling material selected from aluminum, zinc oxide, titanium dioxide, calcium carbonate, and combinations thereof; wherein the aluminum, when present, has an average particle size of from about 1 nm to about 50 nm and is in the cooling masterbatch composition in an amount of from about 0.1 wt % to about 10 wt %; wherein the zinc oxide, when present, has an average particle size of from about 1 nm to about 50 nm and is in the cooling masterbatch composition in an amount of from about 0.1 wt % to about 10 wt %; wherein the titanium dioxide, when present, has an average particle size of from about 10 nm to about 2000 nm and is in the cooling masterbatch composition in an amount of from about 1 wt % to about 90 wt %; and wherein the calcium carbonate, when present, has an average particle size of from about 10 nm to about 2000 nm and is in the cooling masterbatch composition in an amount of from about 1 wt % to about 90 wt %; and wherein the wt % is based on a total weight of the cooling masterbatch material polymer and all materials in the cooling masterbatch material cooling material.

Also disclosed are methods for making a cooling composition filament, comprising: melting a disclosed cooling composition masterbatch; melting a filament polymer; mixing the cooling composition masterbatch and the filament polymer; extruding a filament; thereby providing the cooling composition filament.

Also disclosed are cooling filament made by disclosed methods of making a cooling composition filament.

Also disclosed are yarns comprising a cooling yarn polymer selected from a polyester, a polyamide, and combinations thereof; a cooling material selected from aluminum, zinc oxide, titanium dioxide, calcium carbonate, and combinations thereof; wherein the aluminum, when present, has an average particle size of from about 1 nm to about 50 nm and is in the cooling masterbatch composition in an amount of from about 0.1 wt % to about 10 wt %; wherein the zinc oxide, when present, has an average particle size of from about 1 nm to about 50 nm and is in the cooling masterbatch composition in an amount of from about 0.1 wt % to about 10 wt %; wherein the titanium dioxide, when present, has an average particle size of from about 10 nm to about 2000 nm and is in the cooling masterbatch composition in an amount of from about 1 wt % to about 90 wt %; and wherein the calcium carbonate, when present, has an average particle size of from about 10 nm to about 2000 nm and is in the cooling masterbatch composition in an amount of from about 1 wt % to about 90 wt %; and wherein the wt % is based on a total weight of the cooling masterbatch material polymer and all materials in the cooling masterbatch material cooling material.

Also disclosed are cooling yarns comprising a disclosed cooling filament.

Also disclosed are articles comprising a disclosed cooling yarn.

Also disclosed are fabrics comprising a disclosing cooling yarn.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims. In addition, all optional and preferred features and modifications of the described embodiments are usable in all aspects of the disclosure taught herein. Furthermore, the individual features of the dependent claims, as well as all optional and preferred features and modifications of the described embodiments are combinable and interchangeable with one another.

BRIEF DESCRIPTION OF THE FIGURES

Many aspects of the present disclosure can be better understood with reference to the following drawings. The components in the drawings are not necessarily to scale, emphasis instead being placed upon clearly illustrating the principles of the present disclosure.

Moreover, in the drawings, like reference numerals designate corresponding parts throughout the several views.

FIG. 3A shows an image of a yarn comprising nanoparticles of aluminum with the scale shown in the lower right portion of the figure. FIG. 3B shows the same sample as shown in FIG. 3A, but at a higher magnification with the scale shown in the lower right portion of the figure.

FIG. 4A shows an image titanium dioxide nanoparticles prepared by the disclosed methods of ultrasonic depolymerization with the scale shown in the lower right portion of the figure. FIG. 4B shows the a yarn sample comprising the titanium dioxide nanoparticles shown in FIG. 4A with the scale shown in the lower right portion of the figure.

Figure 1:
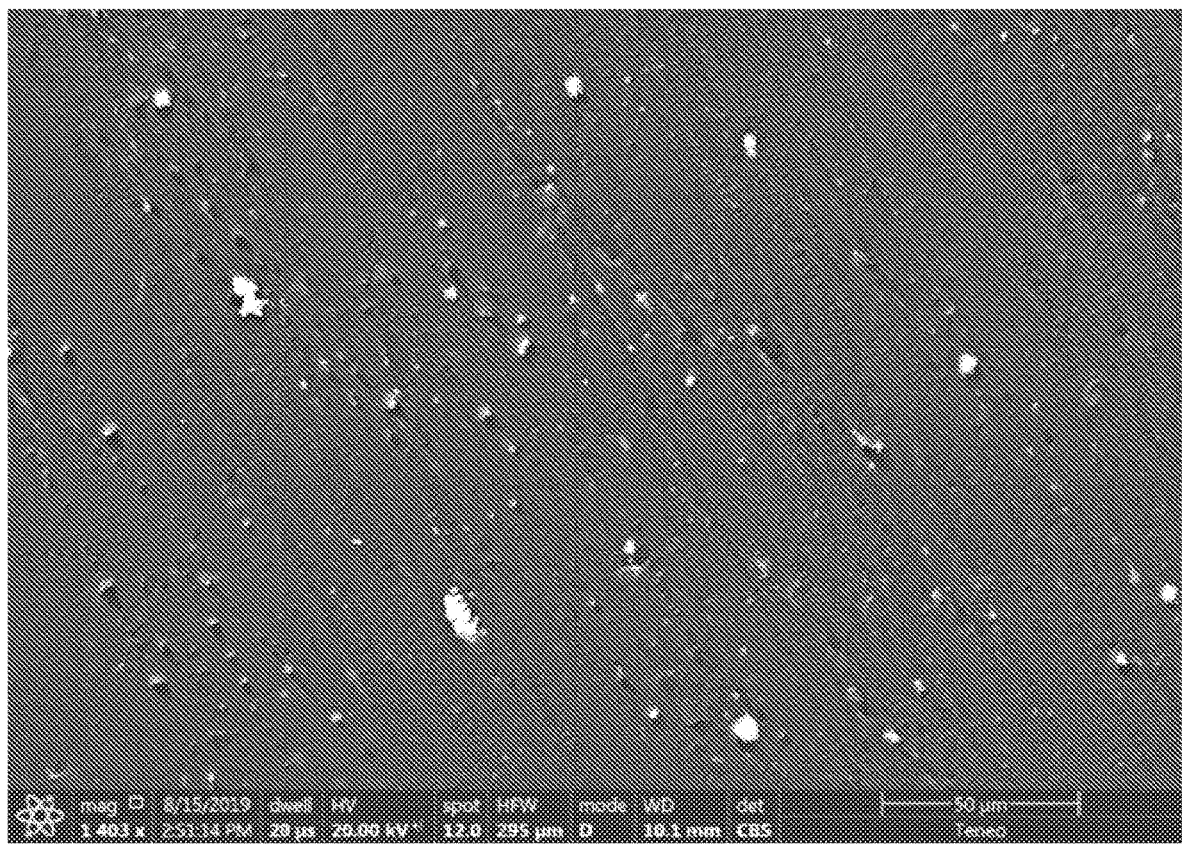
FIG. 1 shows a representative image obtained using scanning electron microscopy ("SEM") of a representative disclosed film comprising polyester having thereon a nanoparticle cooling composition comprising aluminum. A scalar bar (50 μm) for dimensional context is shown in the lower right corner of the figure.

Additional advantages of the disclosure will be set forth in part in the description which follows, and in part will be obvious from the description, or can be learned by practice of the disclosure. The advantages of the disclosure will be realized and attained by means of the elements and combinations particularly pointed out in the appended claims. It is to be understood that both the foregoing general description and the following detailed description are exemplary and explanatory only and are not restrictive of the disclosure, as claimed.

DETAILED DESCRIPTION

Many modifications and other embodiments disclosed herein will come to mind to one skilled in the art to which the disclosed compositions and methods pertain having the benefit of the teachings presented in the foregoing descriptions and the associated drawings. Therefore, it is to be understood that the disclosures are not to be limited to the specific embodiments disclosed and that modifications and other embodiments are intended to be included within the scope of the appended claims. The skilled artisan will recognize many variants and adaptations of the aspects described herein. These variants and adaptations are intended to be included in the teachings of this disclosure and to be encompassed by the claims herein.

Although specific terms are employed herein, they are used in a generic and descriptive sense only and not for purposes of limitation.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure.

Any recited method can be carried out in the order of events recited or in any other order that is logically possible. That is, unless otherwise expressly stated, it is in no way intended that any method or aspect set forth herein be construed as requiring that its steps be performed in a specific order. Accordingly, where a method claim does not specifically state in the claims or descriptions that the steps are to be limited to a specific order, it is no way intended that an order be inferred, in any respect. This holds for any possible non-express basis for interpretation, including matters of logic with respect to arrangement of steps or operational flow, plain meaning derived from grammatical organization or punctuation, or the number or type of aspects described in the specification.

All publications mentioned herein are incorporated herein by reference to disclose and describe the methods and/or materials in connection with which the publications are cited. The publications discussed herein are provided solely for their disclosure prior to the filing date of the present application. Nothing herein is to be construed as an admission that the present invention is not entitled to antedate such publication by virtue of prior invention. Further, the dates of publication provided herein can be different from the actual publication dates, which can require independent confirmation.

While aspects of the present disclosure can be described and claimed in a particular statutory class, such as the system statutory class, this is for convenience only and one of skill in the art will understand that each aspect of the present disclosure can be described and claimed in any statutory class.

It is also to be understood that the terminology used herein is for the purpose of describing particular aspects only and is not intended to be limiting. Unless defined otherwise, all technical and scientific terms used herein have the same meaning as commonly understood by one of ordinary skill in the art to which the disclosed compositions and methods belong. It will be further understood that terms, such as those defined in commonly used dictionaries, should be interpreted as having a meaning that is consistent with their meaning in the context of the specification and relevant art and should not be interpreted in an idealized or overly formal sense unless expressly defined herein.

Prior to describing the various aspects of the present disclosure, the following definitions are provided and should be used unless otherwise indicated. Additional terms may be defined elsewhere in the present disclosure.

A. Definitions

As used herein, "comprising" is to be interpreted as specifying the presence of the stated features, integers, steps, or components as referred to, but does not preclude the presence or addition of one or more features, integers, steps, or components, or groups thereof. Additionally, the term "comprising" is intended to include examples and aspects encompassed by the terms "consisting essentially of" and "consisting of." Similarly, the term "consisting essentially of" is intended to include examples encompassed by the term "consisting of."

As used herein, the term "produced from" is synonymous to "comprising". As used herein, the terms "comprises," "comprising," "includes," "including," "has," "having," "contains" or "containing," or any other variation thereof, are intended to cover a non-exclusive inclusion. For example, a composition, process, method article, or apparatus that comprises a list of elements is not necessarily limited to only those elements but may include other elements not expressly listed or inherent to such composition, process, method, article, or apparatus.

The transitional phrase "consisting of" excludes any element, step, or ingredient not specified. If in the claim, such a phrase would close the claim to the inclusion of materials other than those recited except for impurities ordinarily associated therewith. When the phrase "consisting of" appears in a clause of the body of a claim, rather than immediately following the preamble, it limits only the element set forth in that clause; other elements are not excluded from the claim as a whole.

The transitional phrase "consisting essentially of" is used to define a composition, method or apparatus that includes materials, steps, features, components, or elements, in addition to those literally discussed, provided that the additional materials, steps features, components, or elements do not materially affect the basic and novel characteristic(s) of the claimed invention. The term "consisting essentially of" occupies a middle ground between "comprising" and "consisting of".

Further, unless expressly stated to the contrary, "or" refers to an inclusive "or" and not to an exclusive "or". For example, a condition A "or" B is satisfied by any one of the following: A is true (or present) and B is false (or not present), A is false (or not present) and B is true (or present), and both A and B are true (or present).

As used in the specification and the appended claims, the singular forms "a," "an" and "the" include plural referents unless the context clearly dictates otherwise. Thus, for example, reference to "a polymer," "a yarn," or "a fabric," including, but not limited to, two or more such polymers, yarns, or fabrics, and the like. Therefore "a" or "an" should be read to include one or at least one, and the singular word form of the element or component also includes the plural unless the number is obviously meant to be singular.

It should be noted that ratios, concentrations, amounts, and other numerical data can be expressed herein in a range format. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. Ranges can be expressed herein as from "about" one particular value, and/or to "about" another particular value. Similarly, when values are expressed as approximations, by use of the antecedent "about," it will be understood that the particular value forms a further aspect. For example, if the value "about 10" is disclosed, then "10" is also disclosed.

When a range is expressed, a further aspect includes from the one particular value and/or to the other particular value.

For example, where the stated range includes one or both of the limits, ranges excluding either or both of those included limits are also included in the disclosure, e.g. the phrase "x to y" includes the range from 'x' to 'y' as well as the range greater than 'x' and less than 'y'. The range can also be expressed as an upper limit, e.g. 'about x, y, z, or less' and should be interpreted to include the specific ranges of 'about x', 'about y', and 'about z' as well as the ranges of 'less than x', less than y', and 'less than z'. Likewise, the phrase 'about x, y, z, or greater' should be interpreted to include the specific ranges of 'about x', 'about y', and 'about z' as well as the ranges of 'greater than x', greater than y', and 'greater than z'. In addition, the phrase "about 'x' to 'y'", where 'x' and 'y' are numerical values, includes "about 'x' to about 'y'".

It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a numerical range of "about 0.1% to 5%" should be interpreted to include not only the explicitly recited values of about 0.1% to about 5%, but also include individual values (e.g., about 1%, about 2%, about 3%, and about 4%) and the sub-ranges (e.g., about 0.5% to about 1.1%; about 5% to about 2.4%; about 0.5% to about 3.2%, and about 0.5% to about 4.4%, and other possible sub-ranges) within the indicated range. To further illustrate, when a range of "1 to 5" is recited, the recited range should be construed as including ranges "1 to 4", "1 to 3", "1-2", "1-2 & 4-5", "1-3 & 5", and the like.

As used herein, the terms "about," "approximate," "at or about," and "substantially" mean that the amount or value in question can be the exact value or a value that provides equivalent results or effects as recited in the claims or taught herein. That is, it is understood that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art such that equivalent results or effects are obtained. In some circumstances, the value that provides equivalent results or effects cannot be reasonably determined. In such cases, it is generally understood, as used herein, that "about" and "at or about" mean the nominal value indicated ±10% variation unless otherwise indicated or inferred. In general, an amount, size, formulation, parameter or other quantity or characteristic is "about," "approximate," or "at or about" whether or not expressly stated to be such. It is understood that where "about," "approximate," or "at or about" is used before a quantitative value, the parameter also includes the specific quantitative value itself, unless specifically stated otherwise.

The terms "decrease", "reduced", "reduction" "decrease" or "inhibit" are all used herein generally to mean a decrease by a statistically significant amount. However, for avoidance of doubt, "reduced", "reduction" or "decrease" or "inhibit" means a decrease by at least 10% as compared to a reference level, for example a decrease by at least about 20%, or at least about 30%, or at least about 40%, or at least about 50%, or at least about 60%, or at least about 70%, or at least about 80%, or at least about 90% or up to and including a 100% decrease (e.g. absent level as compared to a reference sample), or any decrease between 10-100% as compared to a reference level.

The terms "increased", "increase" or "enhance" or "activate" are all used herein to generally mean an increase by a statically significant amount; for the avoidance of any doubt, the terms "increased", "increase" or "enhance" or "activate" means an increase of at least 10% as compared to a reference level, for example an increase of at least about 20%, or at least about 30%, or at least about 40%, or at least about 50%, or at least about 60%, or at least about 70%, or at least about 80%, or at least about 90% or up to and including a 100% increase or any increase between 10-100% as compared to a reference level, or at least about a 2-fold, or at least about a 3-fold, or at least about a 4-fold, or at least about a 5-fold or at least about a 10-fold increase, or any increase between 2-fold and 10-fold or greater as compared to a reference level.

The term "statistically significant" or "significantly" refers to statistical significance and generally means at least two standard deviations (2SD) away from a reference level. The term refers to statistical evidence that there is a difference. It is defined as the probability of making a decision to reject the null hypothesis when the null hypothesis is actually true.

As used herein the terms "weight percent," "wt %," and "wt. %," which can be used interchangeably, indicate the percent by weight of a given component based on the total weight of a composition of which it is a component, unless otherwise specified. That is, unless otherwise specified, all wt % values are based on the total weight of the composition. It should be understood that the sum of wt % values for all components in a disclosed composition or formulation are equal to 100. Alternatively, if the wt % value is based on the total weight of a subset of components in a composition, it should be understood that the sum of wt % values the specified components in the disclosed composition or formulation are equal to 100.

As used herein, the term "effective amount" refers to an amount that is sufficient to achieve the desired modification of a physical property of the composition or material. For example, an "effective amount" of a cooling composition refers to an amount that is sufficient to achieve the desired improvement in the property modulated by the cooling composition, e.g. achieving the desired enhancement in Qmax compared to a yarn or fabric without the effective amount. The specific level in terms of wt % in a composition required as an effective amount will depend upon a variety of factors including the amount and type of polymer and yarn, fabric use, and the like.

As used herein, the terms "optional" or "optionally" means that the subsequently described event or circumstance can or cannot occur, and that the description includes instances where said event or circumstance occurs and instances where it does not.

The term "microscale" as used herein comprises a surface having a measurable feature in the range of from about 1 to about 1000 μm.

The term "nanoscale" as used herein comprises a surface having a measurable feature in the range of from about 1 to about 1000 nm.

The term "nanoparticle" as used herein comprises a nanoscale deposit of a homogenous or heterogeneous material. Nanoparticles may be regular or irregular in shape and may be formed from a plurality of co-deposited particles that form a composite nanoscale particle. Nanoparticles may be generally spherical in shape or have a composite shape formed from a plurality of co-deposited generally spherical particles. Exemplary shapes for the nanoparticles include, but are not limited to, spherical, rod, elliptical, cylindrical, disc, and the like. In some embodiments, the nanoparticles have a substantially spherical shape.

As used herein, reference to an element, e.g., a core component comprises Al, Ca, Cu, Fe . . . Zr" or "a core component comprises aluminum, calcium, copper, iron . . . zirconium," is intended to be inclusive of any form or valency of the element as appropriate for a given compound or material in which the element is part of the composition of the compound or material, unless otherwise specified. That is, it is understood that a reference to a particular element in a composition or material is inclusive of ionic forms of the element in typical oxidation states for that element if the composition or material comprises the element as an ionic compound; covalently bonded forms of the element if the composition or material comprises the element as an covalent compound; and elemental forms (i.e., oxidation state of 0) as suitable or appropriate for the indicated if the composition or material comprises the element in an oxidation state of 0, e.g., Al as metallic aluminum.

As used herein, "nanozinc" and "nanozinc oxide," can be used interchangeably, and refer to zinc oxide (i.e., zinc (I) oxide, zinc (II) oxide, zinc (Ill) oxide or combinations thereof) in which the zinc oxide is in a form comprising substantially a particulates, a powder, or combinations thereof, in which the particles and/or powder are nano-sized. That is the particles or powder, as appropriate, generally have a size of about 1 nm to about 1000 nm.

The term "Denier" or abbreviated as "d" as used herein will be understood to be a relative measure of a fineness (or linear density) of a fiber or yarn. Denier is equivalent numerically to the weight in grams per 9,000 meters length of the material. The term "decitex" is another measure of a fineness of a fiber, which is equivalent to the weight in grams of a 10,000 meter length of the material.

As used herein, "multicomponent" refers to a fiber composed of more than one polymer.

As used herein, the term "fiber" refers to refers to any slender, elongated structure that can be carded, combed, or otherwise formed into a thread or filament. A fiber can comprise a natural material (e.g., cotton, linen or wool) or an artificial material (e.g., nylon, polyester). A fiber is a material in which the length to diameter ratio is greater than about 10. Fiber is typically classified according to its fineness. Fiber is generally defined as having a fiber fineness greater than about 15 Denier, usually greater than about 30 Denier. Fine Denier fiber generally refers to a fiber having a fineness less than about 15 Denier. Examples of fibers include "staple fibers", a term that is well-known in the textile art. A reference to "fiber" of "fibers" may mean or include individual fibers or a plurality or bulk of fibers as the situation requires. A plurality of fibers may comprise fibers of different compositions or may be substantially uniform in composition. Thus, by way of illustration, a reference to "natural fiber" or "synthetic fiber" may mean and may include a single fiber of such type or may mean any quantity or plurality of such fibers and they may be comprised in threads, felts, yarns, fabrics materials etc., all as will be apparent from the context.

The fiber can be a synthetic fiber or a natural or organic fiber. As one of skill in the art is well aware, smoothness of the outer surfaces is significantly varied between different fibers. Accordingly, the outer surface of the fiber can be smooth or rough. By way of example only, manmade fibers, such as polyester fibers, usually have a smooth outer surface. In contrast, natural fibers, such as cotton, usually have a rough outer surface. One consequence of the roughness of the outer surface is that rough surfaces take more fluid to completely cover the surface per unit diameter.

As used herein, "fiber" refers to any one of the various types of matter that form the basic elements of a textile and that is characterized by a flexible, macroscopically homogeneous body having a high ratio of length to width and being small in cross section, and may include one or more fibrous materials (e.g., fibers or filaments). It is understood that "fiber" includes "filaments."

As used herein, "filament" refers generally to a continuous fiber of extremely long length, whereas a "staple fiber" means a fiber of finite length. A staple fiber can be a natural fiber or a fiber cut from, for example, a filament.

As used herein, the term "synthetic fiber" refers to a fiber that is not prepared from naturally occurring filaments and include, but are not limited to, fibers made from components by polymerization, polycondensation or polyaddition. Materials for forming the synthetic fibers include, but are limited to, polyesters, polyamides such as nylons, polyacrylics, polyurethanes such as spandex, elastanes, elastodienes, fluoro fibers, acrylics, modacrylics, aramids, polyvinyl chlorides, polyvinylidene chloride, polyethylenes, polypropylenes and vinylals. Synthetic fibers include fibers formed from petroleum products. Synthetic fiber containing materials are those that contain both the purely synthetic fiber and also natural materials.

"Polymers" are understood to include, but are not limited to, homopolymers, copolymers, such as for example, block, graft, random and alternating copolymers, terpolymers, etc. and blends and modifications thereof.

The term "polyamide" as used herein means the well-known fiber-forming substance that is a long-chain synthetic polyamide. The term particularly relates to poly (ε-caprolactam; "nylon 6") and poly (hexamethylene adipamide; "nylon 6,6") as well as their copolymers.

The term "polyester" as used herein is intended to embrace polymers wherein at least 85% of the recurring units are condensation products of dicarboxylic acids and dihydroxy alcohols with linkages created by formation of ester units. This includes aromatic, aliphatic, saturated, and unsaturated di-acids and di-alcohols. The term "polyester" as used herein also includes copolymers (such as block, graft, random and alternating copolymers), blends, and modifications thereof. A common example of a polyester is poly(ethylene terephthalate) which is a condensation product of ethylene glycol and terephthalic acid.

As used herein, the term "polyurethane-polyurea copolymer" refers to synthetic polymers sold as "spandex" or "elastane" under the brand names of LYCRA (Invista), ELASPAN (Invista), ACEPORA (Taekwang), CREORA (Hyosung), INVIYA (Indorama Corporation), ROICA and DORLASTAN (Asahi Kasei), LINEL (Fillattice), and ESPA (Toyobo).

The term "filament fiber" including "monofilament fiber" and "multifilament fiber" means a fiber comprising one or more continuous strands of natural or synthetic material of indefinite (i.e., not predetermined) length, as opposed to a "staple fiber" which is a discontinuous strand of fiber of definite length (i.e., a strand which has been cut or otherwise divided into segments of a predetermined length).

Filaments are generally formed by the melting of polymer pellets or another source of polymer which is then forced through an extrusion die to produce a continuous fiber. A filament can be a single continuous extrusion, or may be a chopped apart extrusion such as to form a staple. This fiber can then be texturized directly (which is uncommon), or can be combined with other filaments to form a filament bundle with the resultant filament bundle can then be texturized.

As used herein, "composite fiber" refers to a continuous fiber in which two distinct polymers are intimately adhered to each other along the length of the fiber. In some instances, a composite filament is a filament or fiber that is composed of at least two distinct polymers which have been spun together to form a single filament or fiber. By the term "distinct polymers" it is meant that each of the at least two polymeric components are arranged in distinct substantially constantly positioned zones across the cross-section of the composite fiber and extend substantially continuously along the length of the fiber. Composite fibers are distinguished from fibers that are extruded from a homogeneous melt blend of polymeric materials in which zones of distinct polymers are not formed. The at least two distinct polymeric components useable herein can be chemically different or they can be chemically the same polymer, but have different physical characteristics, such as tacticity, intrinsic viscosity, melt viscosity, die swell, density, crystallinity, and melting point or softening point. One or more of the polymeric components in the composite fiber can be a blend of different polymers. A composite fiber can have a fiber cross-section that is, for example, a side-by-side, eccentric sheath-core, concentratic sheath-core, or other suitable cross-section.

As understood herein, "filaments", which will be considered single strand synthetic fiber or polymer extrusions, and "yarns" or "filament bundles" are structures comprising a number of filaments combined together. For example, filaments are spun or otherwise interconnected, entangled, or arranged together form a filament bundle or yarn.

The term "yarn" refers a structure comprising a plurality of fibers that have been twisted, spun or otherwise joined together to form the yarn and may include spun yarns, continuous filament yarns, and yarns of core spun construction. The strands that that have been twisted, spun or otherwise joined together can be of natural or synthetic material, such as wool, nylon, or polyester, in a form suitable for sewing, knitting, weaving, or otherwise intertwining to form a textile fabric. In general, "yarn" refers to a product obtained when fibers are aligned. Yarns are products of substantial length and relatively small cross-section. Yarns may be single ply yarns, that is, having one yarn strand, or multiple ply yarns, such as 2-ply yarn that comprises two single yarns twisted together or 3-ply yarn that comprises three yarn strands twisted together. In various aspects, the disclosed composite fibers are used to prepare disclosed yarns. The disclosed yarns can be formed using staple fibers, using continuous fibers, or combinations thereof.

As used herein, "multifilament" means a yarn consisting of many continuous filaments or strands, as opposed to monofilament which is one strand. Most textile filament yarns are multifilament.

As used herein, "CSY" and "core spun yarn" can be used interchangeably to refer to a yarn made by twisting fibers around one or more core fibers or filaments, thus concealing the core fibers or filaments.

As used herein, "FDY" and "fully drawn yarn" can be used interchangeably to refer to filament yarns in which the draw ratio is normal so that full longitudinal orientation of polymer molecules.

As used herein, "POY" and "partially oriented yarn" can be used interchangeably to refer to filament yarns in which the draw ratio is less than normal so that only partial longitudinal orientation of the polymer molecules.

As used herein, the term "filament yarn" refers to a yarn that is composed of more than one fiber filaments that run the whole length of the yarn. Filament yarns can also be referred to as multi-filament yarns. The structure of a filament yarn is influenced by the amount of twist, and in some cases the fiber texturing. The properties of the filament yarn can be influenced by the structure of the yarn, fiber to fiber friction of the constituent fibers, and the properties of the constituent fibers. In some embodiments, the yarn structure and the recombinant protein fiber properties are chosen to impart various characteristics to the resulting yarns. The properties of the yarn can also be influenced by the number of fibers (i.e., filaments) in the yarn. The filament yarns disclosed herein can be multifilament yarns. Throughout this disclosure "filament yarns" can refer to flat filament yarns, textured filament yarns, drawn filament yarns, undrawn filament yarns, or filament yarns of any structure.

As used herein, the term "spun yarn" refers to a yarn that is made by twisting staple fibers together to make a cohesive yarn (or thread, or "single"). The structure of a spun yarn is influenced by the spinning methods parameters. The properties of the spun yarn are influenced by the structure of the yarn, as well as the constituent fibers.

As used herein, the term "blended yarn" refer to a type of yarn comprising various fibers being blended together.

As used herein, the term "warp direction" refers to the length direction or the machine direction of the fabric, and the term "weft direction" refers to the width direction or the cross machine direction of the fabric.

As used herein, the term "textile" shall mean a fiber, filament, yarn, fabric, or any article comprising fabrics and/or yarns, such as garments, articles of clothing, home goods, including, but not limited to, bed and table linens, linens, draperies and curtains, and upholsteries, and the like.

The term "articles of clothing" include any article of clothing including, for example, underwear, t-shirts, shirts, pants, socks, hats, diapers, and jackets.

As used herein, the term "garment" refers to wearable articles comprising fabrics or cloth to any item that is covers or protects some region of the user's body from weather or other factors in the environment outside the body. Exemplary garments, include, but are not limited to, coats, jackets, pants, hats, gloves, shoes, socks, shirts, blouses, dresses, coats, and the like. It is noted that the term "garment" is intended to cover clothing for human or animal use.

The term "linen" as used herein, refers to any article routinely washed in a residential or commercial washing machine besides articles of clothing, including, for example, sheets, blankets, towels, drapery, wash cloths, napkins, table cloths, and pillow cases.

As used herein, the term "fabric" is to be understood in its widest meaning. The term "fabric" may be used for all structures composed of fibers which have been manufactured according to a surface-forming method. Fabrics include materials where one or more different types of yarns, threads, filaments, or fibers that have been woven, knitted, felted, wrapped, spun, co-mingled, coated, coextruded, braided, entangled, applied or otherwise assembled into a desired material. Generally, the fabric has a structure which comprises a series of meshes or openings and filament bundles which define the mesh boundaries, such as woven, knitted, knotted, interwoven or tufted structures. Without limitations, the term "fabric" is intended to include woven fabrics, yarn sheets, knitted fabrics and non-woven fabrics. Further, the fabrics may be constructed from a combination of fibers, threads or yarns. Fabrics comprising different fibers, threads or yarns are also referred to as fabric blends herein. A knitted fabric may be flat knit, circular knit, warp knit, narrow elastic, and lace. A woven fabric may be of any construction, for example sateen, twill, plain weave, oxford weave, basket weave, and narrow elastic and the like.

As used herein, the term "cloth" refers to any textile fabric woven, nonwoven, felted, knitted or otherwise formed from any filament or fiber or plurality of filaments or fibers, including but not limited to thread yarn, monofilaments, and ribbons. Further, the term cloth is intended to include within its scope not only woven, knitted, non-woven, and felted materials, but also sheet materials.

As used herein, the term "strand" is being used as a term generic to both "fiber" and "filament". In this regard, "filaments" are referring to continuous strands of material while "fibers" mean cut or discontinuous strands having a definite length. Thus, while the following discussion may use "strand" or "fiber" or "filament", the discussion can be equally applied to all three terms.

As used herein, the term "wicking" refers to the passage of liquids along or through a textile material or a textile element of a coated fabric, or along interstices formed by a textile element and a coating polymer of a coated fabric. Wicking involves a spontaneous transport of a liquid driven into a porous system by capillary forces.

As used herein, the term "cooling composition" refers to compositions comprising aluminum, zinc, titanium, and calcium, and combinations thereof, e.g., aluminum, zinc oxide, titanium, and calcium carbonate as particular forms of aluminum, zinc, titanium, and calcium.

As discussed herein below, reference to an element, e.g., aluminum, refers to various forms of aluminum including aluminum metal, aluminum oxide, and aluminum alloys unless specifically specified otherwise.

As used herein, the term "cooling film" refers to material comprising a substrate with a layer of a cooling composition thereon on a surface of the substrate. The layer of the cooling composition on the substrate can be prepared using the disclosed method of forming a cooling film comprising depositing a layer of sputtered material on at least one surface of a substrate.

As used herein, the term "sputtering material" refers to a disclosed material, e.g., aluminum, that can be used in the disclosed methods of forming a cooling film and be subjected to sputter depositing on a substrate.

As used herein, the term "sputtered material" refers to a material that has been sputter deposited on a substrate, e.g., a polymer film, such as aluminum and/or zinc oxide.

As used herein, the term "cooling pre-masterbatch composition" refers to a masterbatch composition prepared using a disclosed cooling film comprising a substrate with a layer of a cooling composition thereon on a surface of the substrate. The cooling pre-masterbatch composition can be in the form of chips, pellets, blocks or slabs, or any form that can be conveniently formed by pelletizing, shaving, casting, molding, and the like.

As used herein, the term "cooling masterbatch composition" refers to a material or composition comprising a masterbatch polymer, as disclosed herein, and a cooling composition, e.g., aluminum, zinc oxide, titanium dioxide, and/or calcium carbonate. Further aspects and details of a cooling masterbatch composition are as disclosed herein throughout.

As used herein, the term "nanoparticles" refers to particles have a size range from about 1 nm to about 2000 nm, and all possible particle size ranges therewithin.

It is understood herein throughout that reference to a composition comprising an element, e.g., "a composition comprises Al, Ca, Cu, Fe . . . Zr" or "a composition comprises aluminum, calcium, copper, iron . . . zirconium," is intended to be inclusive of any form or valency of the element as appropriate for a given compound or material in which the element is part of the composition of the compound or material, unless otherwise specified. That is, it is understood that a reference to a particular element in a composition or material is inclusive of ionic forms of the element in typical oxidation states for that element if the composition or material comprises the element as an ionic compound; covalently bonded forms of the element if the composition or material comprises the element as an covalent compound; and elemental forms (i.e., oxidation state of 0) as suitable or appropriate for the indicated if the composition or material comprises the element in an oxidation state of 0, e.g., Al as metallic aluminum. Thus, reference to a composition, as discussed above, is intended to comprise ionic, covalent, and elemental forms of the element as disclosed herein.

For example, reference to a composition comprising aluminum refers to forms of aluminum disclosed herein, such as aluminum metal, $Al_2O_3$, and other disclosed aluminum containing alloys and compounds. Similarly, reference to a composition comprising: (a) calcium refers to materials comprising calcium disclosed herein, such as $CaCO_3$, dolomite, tourmaline, and other disclosed calcium containing minerals and compounds; (b) titanium refers to materials comprising titanium disclosed herein, such as titanium metal and alloys, $TiO_2$, and other disclosed titanium containing metals and compounds; and (d) zinc refers to materials comprising zinc disclosed herein, such as zinc metal, alloys comprising zinc, ZnO, and other disclosed zinc containing minerals and compounds.

In addition, it is understood herein throughout, that an amount of an element, e.g., weight percent, is the overall weight percent for the element in aggregate as determined by elemental analysis and that the element may be present in one or more chemical and/or physical forms. For example, reference to 5 wt % aluminum as determined by element analysis refers to the determination that the material comprises 5 wt % aluminum which may be present in one or more of the disclosed forms of aluminum such as aluminum, an aluminum alloy, and aluminum oxide. This understanding extends to other elements that are specified as having been determined to be present at a certain weight percent as determined by elemental analysis.

As used herein, "particle size" is a number average of size in the longest dimension of the measured particles.

Unless otherwise specified, temperatures referred to herein are based on atmospheric pressure (i.e. one atmosphere).

B. Cooling Compositions—Deposited on a Substrate

In various aspects, disclosed herein are cooling compositions comprising nanoparticles of aluminum and/or zinc, e.g., zinc oxide. In a further aspect, the nanoparticles of aluminum and/or zinc, e.g., zinc oxide, are obtained initially from the disclosed methods of forming a cooling film comprising depositing a layer of sputtered material on at least one surface of substrate, e.g., a first surface and/or a second surface of a substrate. The disclosed cooling films can be used to prepare cooling pre-masterbatch compositions that therein comprise nanoparticles of aluminum and/or zinc, e.g., zinc oxide, initially formed in the sputtering deposition process of making a cooling film. The disclosed cooling pre-masterbatch compositions can be used to prepare disclosed cooling masterbatch compositions comprising a masterbatch polymer and nanoparticles of aluminum, zinc, e.g., zinc oxide, titanium in the form of titanium dioxide, and/or calcium in the form of calcium carbonate.

In a further aspect, the aluminum and/or zinc of a cooling composition deposited on a substrate can comprise a metal oxide. Exemplary, but non-limiting, metal oxides useful for preparation of the cooling material include aluminum oxide, zinc (I) oxide, zinc (II) oxide, zinc (III) oxide, titanium oxide (also referred to as titanium dioxide), or combinations thereof. In a still further aspect, the metal oxide comprises zinc (I) oxide, zinc (II) oxide, or combinations thereof. In a yet further aspect, the metal oxide comprises zinc (I) oxide. In an even further aspect, the metal oxide can be a mixture comprising two or metal oxides.

In a further aspect, the cooling material comprises a metal such as aluminum.

In a further aspect, is the aluminum and/or zinc of a cooling composition deposited on a substrate is a nanoparticle. In a further aspect, the nanoparticles of aluminum and/or zinc have a size of about 1 nm to about 100 nm. In a still further aspect, the nanoparticles have a size of about 1 nm to about 50 nm. In a yet further aspect, the nanoparticles have a size of about 1 nm to about 40 nm. In an even further aspect, the nanoparticles have a size of about 1 nm; about 2 nm; about 3 nm; about 4 nm; about 5 nm; about 6 nm; about 7 nm; about 8 nm; about 9 nm; about 10 nm; about 11 nm; about 12 nm; about 13 nm; about 14 nm; about 15 nm; about 16 nm; about 17 nm; about 18 nm; about 19 nm; about 20 nm; about 21 nm; about 22 nm; about 23 nm; about 24 nm; about 25 nm; about 26 nm; about 27 nm; about 28 nm; about 29 nm; about 30 nm; about 31 nm; about 32 nm; about 33 nm; about 34 nm; about 35 nm; about 36 nm; about 37 nm; about 38 nm; about 39 nm; about 40 nm; about 41 nm; about 42 nm; about 43 nm; about 44 nm; about 45 nm; about 46 nm; about 47 nm; about 48 nm; about 49 nm; about 50 nm; about 51 nm; about 52 nm; about 53 nm; about 54 nm; about 55 nm; about 56 nm; about 57 nm; about 58 nm; about 59 nm; about 60 nm; about 61 nm; about 62 nm; about 63 nm; about 64 nm; about 65 nm; about 66 nm; about 67 nm; about 68 nm; about 69 nm; about 70 nm; about 71 nm; about 72 nm; about 73 nm; about 74 nm; about 75 nm; about 76 nm; about 77 nm; about 78 nm; about 79 nm; about 80 nm; about 81 nm; about 82 nm; about 83 nm; about 84 nm; about 85 nm; about 86 nm; about 87 nm; about 88 nm; about 89 nm; about 90 nm; about 91 nm; about 92 nm; about 93 nm; about 94 nm; about 95 nm; about 96 nm; about 97 nm; about 98 nm; about 99 nm; about 100 nm; a range utilizing any of the foregoing values; a sub-range with a range utilizing any of the foregoing values; or any set of values utilizing the foregoing values.

C. Cooling Films for Preparation of Masterbatch Materials

In various aspects, the present disclosure pertains to cooling films that are useful in the preparation of the disclosed masterbatch materials. A disclosed cooling film comprises a substrate, e.g., a film, having deposited on at least one surface thereon a cooling material layer comprising one more cooling material as disclosed herein above. In a further aspect, a cooling material layer can comprise a plurality of cooling material layers. In other aspects, a cooling material layer comprises a single layer of essentially uniform thickness on at least one substrate surface. In a further aspect, a cooling material layer comprises a single layer of essentially uniform thickness on each of the substrate surfaces, e.g., a first surface and a second surface opposite of the first surface. In a further aspect, the cooling material layer is deposited on greater than about 80% of the surface area of the substrate. In a still further aspect, the cooling material layer is deposited on greater than about 90% of the surface area of the substrate. The disclosed cooling films can be prepared using the disclosed methods of preparing cooling films, i.e., sputtering one or more cooling material onto a substrate, such as a film.

In a further aspect, the substrate, e.g., a film, can comprise a suitable polymer such as a polyester polymer, a polyamide polymer, a polyolefin polymer, a polyurethane polymer, a fluoropolymer, mixtures or combinations thereof, or copolymers thereof. In a further aspect, the substrate comprises a polyolefin such as a polyethylene, a polypropylene, or combinations thereof. In other aspects, the substrate comprises a fluoropolymer such as a polytetrafluoroethylene (PTFE).

In a further aspect, the substrate, e.g., a film, can comprise a polyester polymer, such as a polyethylene terephthalate, a polytrimethylene terephthalate, or combinations thereof. In a further aspect, the polyester can comprise a polyethylene terephthalate. In further aspects, the polyester can comprise a polytrimethylene terephthalate. In still further aspects, the polyester is a polyeseter co-polymer comprising a polyethylene terephthalate, a polytrimethylene terephthalate, or combinations thereof. In a yet further aspect, the polyester can comprise a co-polymer comprising polyethylene terephthalate. In a further aspect, the polyester can comprise a co-polymer comprising polytrimethylene terephthalate.

In a further aspect, the substrate, e.g., a film, can comprise a polyamide polymer, such as a nylon 6, nylon 4/6, nylon 6/6, nylon 6/10, nylon 6/12, nylon 11, nylon 12, or combinations thereof. In a further aspect, the polyamide can comprise a nylon 6/6. In a still further aspect, the polyamide is a polyamide co-polymer comprising nylon 6, nylon 4/6, nylon 6/6, nylon 6/10, nylon 6/12, nylon 11, nylon 12, or combinations thereof. In a yet further aspect, the polyamide is a polyamide co-polymer comprising nylon 6/6.

In a further aspect, the substrate, e.g., a film, can have a thickness that is convenient for use in sputtering. In a still further aspect, the film can have a thickness of from about 10 μm to about 100 μm. In a yet further aspect, the substrate, e.g., a film, can have a thickness that is about 10 μm, about 11 μm, about 12 μm, about 13 μm, about 14 μm, about 15 μm, about 16 μm, about 17 μm, about 18 μm, about 19 μm, about 20 μm, about 21 μm, about 22 μm, about 23 μm, about 24 μm, about 25 μm, about 26 μm, about 27 μm, about 28 μm, about 29 μm, about 30 μm, about 31 μm, about 32 μm, about 33 μm, about 34 μm, about 35 μm, about 36 μm, about 37 μm, about 38 μm, about 39 μm, about 40 μm, about 41 μm, about 42 μm, about 43 μm, about 44 μm, about 45 μm, about 46 μm, about 47 μm, about 48 μm, about 49 μm, about 50 μm; or any combination of the foregoing values; or a range encompassing any of the foregoing values.

In a further aspect, the cooling material layer deposited on the substrate has a thickness of about 1 nm to about 100 nm. In a still further aspect, the cooling material layer deposited on the substrate has a thickness of about 1 nm to about 50 nm. In a yet further aspect, the cooling material layer deposited on the substrate has a thickness of about 1 nm to about 40 nm. In an even further aspect, the nanoparticles have a size of about 1 nm; about 2 nm; about 3 nm; about 4 nm; about 5 nm; about 6 nm; about 7 nm; about 8 nm; about 9 nm; about 10 nm; about 11 nm; about 12 nm; about 13 nm; about 14 nm; about 15 nm; about 16 nm; about 17 nm; about 18 nm; about 19 nm; about 20 nm; about 21 nm; about 22 nm; about 23 nm; about 24 nm; about 25 nm; about 26 nm; about 27 nm; about 28 nm; about 29 nm; about 30 nm; about 31 nm; about 32 nm; about 33 nm; about 34 nm; about 35 nm; about 36 nm; about 37 nm; about 38 nm; about 39 nm; about 40 nm; about 41 nm; about 42 nm; about 43 nm; about 44 nm; about 45 nm; about 46 nm; about 47 nm; about 48 nm; about 49 nm; about 50 nm; about 51 nm; about 52 nm; about 53 nm; about 54 nm; about 55 nm; about 56 nm; about 57 nm; about 58 nm; about 59 nm; about 60 nm; about 61 nm; about 62 nm; about 63 nm; about 64 nm; about 65 nm; about 66 nm; about 67 nm; about 68 nm; about 69 nm; about 70 nm; about 71 nm; about 72 nm; about 73 nm; about 74 nm; about 75 nm; about 76 nm; about 77 nm; about 78 nm; about 79 nm; about 80 nm; about 81 nm; about 82 nm; about 83 nm; about 84 nm; about 85 nm; about 86 nm; about 87 nm; about 88 nm; about 89 nm; about 90 nm; about 91 nm; about 92 nm; about 93 nm; about 94 nm; about 95 nm; about 96 nm; about 97 nm; about 98 nm; about 99 nm; about 100 nm; a range utilizing any of the foregoing values; a sub-range with a range utilizing any of the foregoing values; or any set of values utilizing the foregoing values.

In a further aspect, the cooling material layer deposited on the substrate comprises particles having a particle size of about 1 nm to about 100 nm. In a still further aspect, the cooling material layer deposited on the substrate comprises particles having a particle size of about 1 nm to about 50 nm. In a yet further aspect, the cooling material layer deposited on the substrate comprises particles having a particle size of about 1 nm to about 40 nm. In an even further aspect, the nanoparticles have a size of about 1 nm; about 2 nm; about 3 nm; about 4 nm; about 5 nm; about 6 nm; about 7 nm; about 8 nm; about 9 nm; about 10 nm; about 11 nm; about 12 nm; about 13 nm; about 14 nm; about 15 nm; about 16 nm; about 17 nm; about 18 nm; about 19 nm; about 20 nm; about 21 nm; about 22 nm; about 23 nm; about 24 nm; about 25 nm; about 26 nm; about 27 nm; about 28 nm; about 29 nm; about 30 nm; about 31 nm; about 32 nm; about 33 nm; about 34 nm; about 35 nm; about 36 nm; about 37 nm; about 38 nm; about 39 nm; about 40 nm; about 41 nm; about 42 nm; about 43 nm; about 44 nm; about 45 nm; about 46 nm; about 47 nm; about 48 nm; about 49 nm; about 50 nm; about 51 nm; about 52 nm; about 53 nm; about 54 nm; about 55 nm; about 56 nm; about 57 nm; about 58 nm; about 59 nm; about 60 nm; about 61 nm; about 62 nm; about 63 nm; about 64 nm; about 65 nm; about 66 nm; about 67 nm; about 68 nm; about 69 nm; about 70 nm; about 71 nm; about 72 nm; about 73 nm; about 74 nm; about 75 nm; about 76 nm; about 77 nm; about 78 nm; about 79 nm; about 80 nm; about 81 nm; about 82 nm; about 83 nm; about 84 nm; about 85 nm; about 86 nm; about 87 nm; about 88 nm; about 89 nm; about 90 nm; about 91 nm; about 92 nm; about 93 nm; about 94 nm; about 95 nm; about 96 nm; about 97 nm; about 98 nm; about 99 nm; about 100 nm; a range utilizing any of the foregoing values; a sub-range with a range utilizing any of the foregoing values; or any set of values utilizing the foregoing values.

In an aspect, the cooling film can comprise the one or more cooling materials in a weight percent amount of about 0.001 wt % to about 5 wt % based on the total weight of the substrate and cooling materials. In a further aspect, the cooling film can comprise the one or more cooling materials in a weight percent, based on the total weight of the substrate and cooling materials, of about 0.001 wt %; about 0.002 wt %; about 0.003 wt %; about 0.004 wt %; about 0.005 wt %; about 0.006 wt %; about 0.007 wt %; about 0.008 wt %; about 0.009 wt %; about 0.010 wt %; about 0.02 wt %; about 0.03 wt %; about 0.04 wt %; about 0.05 wt %; about 0.06 wt %; about 0.07 wt %; about 0.08 wt %; about 0.09 wt %; about 0.10 wt %; about 0.11 wt %; about 0.12 wt %; about 0.13 wt %; about 0.14 wt %; about 0.15 wt %; about 0.16 wt %; about 0.17 wt %; about 0.18 wt %; about 0.19 wt %; about 0.20 wt %; about 0.21 wt %; about 0.22 wt %; about 0.23 wt %; about 0.24 wt %; about 0.25 wt %; about 0.26 wt %; about 0.27 wt %; about 0.28 wt %; about 0.29 wt %; 0.30 wt %; about 0.31 wt %; about 0.32 wt %; about 0.33 wt %; about 0.34 wt %; about 0.35 wt %; about 0.36 wt %; about 0.37 wt %; about 0.38 wt %; about 0.39 wt %; about 0.40 wt %; about 0.41 wt %; about 0.42 wt %; about 0.43 wt %; about 0.44 wt %; about 0.45 wt %; about 0.46 wt %; about 0.47 wt %; about 0.48 wt %; about 0.49 wt %; about 0.50 wt %; about 0.51 wt %; about 0.52 wt %; about 0.53 wt %; about 0.54 wt %; about 0.55 wt %; about 0.56 wt %; about 0.57 wt %; about 0.58 wt %; about 0.59 wt %; about 0.60 wt %; about 0.61 wt %; about 0.62 wt %; about 0.63 wt %; about 0.64 wt %; about 0.65 wt %; about 0.66 wt %; about 0.67 wt %; about 0.68 wt %; about 0.69 wt %; about 0.70 wt %; about 0.71 wt %; about 0.72 wt %; about 0.73 wt %; about 0.74 wt %; about 0.75 wt %; about 0.76 wt %; about 0.77 wt %; about 0.78 wt %; about 0.79 wt %; about 0.80 wt %; about 0.81 wt %; about 0.82 wt %; about 0.83 wt %; about 0.84 wt %; about 0.85 wt %; about 0.86 wt %; about 0.87 wt %; about 0.88 wt %; about 0.89 wt %; about 0.90 wt %; about 0.91 wt %; about 0.92 wt %; about 0.93 wt %; about 0.94 wt %; about 0.95 wt %; about 0.96 wt %; about 0.97 wt %; about 0.98 wt %; about 0.99 wt %; about 1.0 wt %; about 1.1 wt %; about 1.2 wt %; about 1.3 wt %; about 1.4 wt %; about 1.5 wt %; about 1.6 wt %; about 1.7 wt %; about 1.8 wt %; about 1.9 wt %; about 2.0 wt %; about 2.1 wt %; about 2.2 wt %; about 2.3 wt %; about 2.4 wt %; about 2.5 wt %; about 2.6 wt %; about 2.7 wt %; about 2.8 wt %; about 2.9 wt %; about 3.0 wt %; about 3.1 wt %; about 3.2 wt %; about 3.3 wt %; about 3.4 wt %; about 3.5 wt %; about 3.6 wt %; about 3.7 wt %; about 3.8 wt %; about 3.9 wt %; about 4.0 wt %; about 4.1 wt %; about 4.2 wt %; about 4.3 wt %; about 4.4 wt %; about 4.5 wt %; about 4.6 wt %; about 4.7 wt %; about 4.8 wt %; about 4.9 wt %; about 5.0 wt %; a range utilizing any of the foregoing values; a sub-range with a range utilizing any of the foregoing values; or any set of values utilizing the foregoing values.

As discussed above, a disclosed cooling film can have deposited thereon one more cooling materials, as disclosed herein above, dispersed therein. For example, a disclosed cooling film can have deposited thereon one cooling material deposited thereon, e.g., zinc oxide or aluminum, or two cooling materials, e.g., zinc oxide and aluminum, deposited thereon.

In a further aspect, a disclosed cooling film comprises zinc oxide having a particle size of from about 1 to about 1000 nm present on the cooling in an amount of from about 0.01 wt % to about 50 wt % or from about 0.01 vol % to about 50 vol %, with the polymer of the substrate representing from about 99.99 wt % to about 50 wt % of the cooling film.

In a further aspect, a disclosed cooling film comprises aluminum having a particle size of from about 1 to about 1000 nm present on the cooling in an amount of from about 0.01 wt % to about 50 wt % or from about 0.01 vol % to about 50 vol %, with the polymer of the substrate representing from about 99.99 wt % to about 50 wt % of the cooling film.

In a further aspect, a disclosed cooling film comprises zinc oxide and aluminum, each independently having a particle size of from about 1 to about 1000 nm present on the cooling in an amount of from about 0.01 wt % to about 50 wt % or from about 0.01 vol % to about 50 vol %, with the polymer of the substrate representing from about 99.99 wt % to about 50 wt % of the cooling film.

In a further aspect, a disclosed cooling film comprises zinc oxide having a particle size of from about 1 to about 100 nm present on the cooling in an amount of from about 0.01 wt % to about 10 wt % or from about 0.01 vol % to about 10 vol %, with the polymer of the substrate representing from about 99.99 wt % to about 90 wt % of the cooling film.

In a further aspect, a disclosed cooling film comprises aluminum having a particle size of from about 1 to about 100 nm present on the cooling in an amount of from about 0.01 wt % to about 10 wt % or from about 0.01 vol % to about 10 vol %, with the polymer of the substrate representing from about 99.99 wt % to about 90 wt % of the cooling film.

In a further aspect, a disclosed cooling film comprises zinc oxide and aluminum, each independently having a particle size of from about 1 to about 100 nm present on the cooling in an amount of from about 0.01 wt % to about 10 wt % or from about 0.01 vol % to about 10 vol %, with the polymer of the substrate representing from about 99.99 wt % to about 90 wt % of the cooling film.

In a further aspect, a disclosed cooling film comprises zinc oxide having a particle size of from about 1 to about 50 nm present on the cooling in an amount of from about 0.01 wt % to about 1 wt % or from about 0.01 vol % to about 1 vol %, with the polymer of the substrate representing from about 99.99 wt % to about 99 wt % of the cooling film.

In a further aspect, a disclosed cooling film comprises aluminum having a particle size of from about 1 to about 50 nm present on the cooling in an amount of from about 0.01 wt % to about 1 wt % or from about 0.01 vol % to about 1 vol %, with the polymer of the substrate representing from about 99.99 wt % to about 99 wt % of the cooling film.

In a further aspect, a disclosed cooling film comprises zinc oxide and aluminum, each independently having a particle size of from about 1 to about 50 nm present on the cooling in an amount of from about 0.01 wt % to about 1 wt % or from about 0.01 vol % to about 1 vol %, with the polymer of the substrate representing from about 99.99 wt % to about 99 wt % of the cooling film.

D. Cooling Compositions Prepared by Ultrasonic Depolymerization

In various aspects, disclosed herein are cooling compositions suitable for use in cooling masterbatch compositions, cooling filaments, cooling yarns, and cooling fabrics that comprise nanoparticles of titanium, e.g., titanium dioxide, and/or calcium, e.g., calcium carbonate. The nanoparticles of titanium, e.g., titanium dioxide, and/or calcium, e.g., calcium carbonate, can be prepared by the disclosed methods of ultrasonic depolymerization.

In a further aspect, the nanoparticles of titanium, e.g., titanium dioxide, and/or calcium, e.g., calcium carbonate, can have an average particle size of from about 10 nm-2,000 nm. In a still further aspect, the nanoparticles of titanium, e.g., titanium dioxide, and/or calcium, e.g., calcium carbonate, can have an average particle size of from about 20 nm-1,000 nm. In an even further aspect, the nanoparticles of titanium, e.g., titanium dioxide, and/or calcium, e.g., calcium carbonate, can have an average particle size of from about 30 nm-400 nm.

In a further aspect, the nanoparticles of titanium, e.g., titanium dioxide, and/or calcium, e.g., calcium carbonate, can have an average particle size of from about 10 nm, 20 nm, 30 nm, 40 nm, 50 nm, 60 nm, 70 nm, 80 nm, 90 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 310 nm, 320 nm, 330 nm, 340 nm, 350 nm, 360 nm, 370 nm, 380 nm, 390 nm, 400 nm, 410 nm, 420 nm, 430 nm, 440 nm, 450 nm, 460 nm, 470 nm, 480 nm, 490 nm, 500 nm, 510 nm, 520 nm, 530 nm, 540 nm, 550 nm, 560 nm, 570 nm, 580 nm, 590 nm, 600 nm, 610 nm, 620 nm, 630 nm, 640 nm, 650 nm, 660 nm, 670 nm, 680 nm, 690 nm, 700 nm, 710 nm, 720 nm, 730 nm, 740 nm, 750 nm, 760 nm, 770 nm, 780 nm, 790 nm, 800 nm, 810 nm, 820 nm, 830 nm, 840 nm, 850 nm, 860 nm, 870 nm, 880 nm, 890 nm, 900 nm, 910 nm, 920 nm, 930 nm, 940 nm, 950 nm, 960 nm, 970 nm, 980 nm, 990 nm, 1000 nm; or any combination of the foregoing values; or a range having as an lower limit and an upper limit chosen from any of the foregoing values.

In a further aspect, the nanoparticles of titanium dioxide can have an average particle size of from about 10 nm, 20 nm, 30 nm, 40 nm, 50 nm, 60 nm, 70 nm, 80 nm, 90 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 310 nm, 320 nm, 330 nm, 340 nm, 350 nm, 360 nm, 370 nm, 380 nm, 390 nm, 400 nm, 410 nm, 420 nm, 430 nm, 440 nm, 450 nm, 460 nm, 470 nm, 480 nm, 490 nm, 500 nm, 510 nm, 520 nm, 530 nm, 540 nm, 550 nm, 560 nm, 570 nm, 580 nm, 590 nm, 600 nm, 610 nm, 620 nm, 630 nm, 640 nm, 650 nm, 660 nm, 670 nm, 680 nm, 690 nm, 700 nm, 710 nm, 720 nm, 730 nm, 740 nm, 750 nm, 760 nm, 770 nm, 780 nm, 790 nm, 800 nm, 810 nm, 820 nm, 830 nm, 840 nm, 850 nm, 860 nm, 870 nm, 880 nm, 890 nm, 900 nm, 910 nm, 920 nm, 930 nm, 940 nm, 950 nm, 960 nm, 970 nm, 980 nm, 990 nm, 1000 nm; or any combination of the foregoing values; or a range having as an lower limit and an upper limit chosen from any of the foregoing values.

In a further aspect, the nanoparticles of calcium carbonate can have an average particle size of from about 10 nm, 20 nm, 30 nm, 40 nm, 50 nm, 60 nm, 70 nm, 80 nm, 90 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 310 nm, 320 nm, 330 nm, 340 nm, 350 nm, 360 nm, 370 nm, 380 nm, 390 nm, 400 nm, 410 nm, 420 nm, 430 nm, 440 nm, 450 nm, 460 nm, 470 nm, 480 nm, 490 nm, 500 nm, 510 nm, 520 nm, 530 nm, 540 nm, 550 nm, 560 nm, 570 nm, 580 nm, 590 nm, 600 nm, 610 nm, 620 nm, 630 nm, 640 nm, 650 nm, 660 nm, 670 nm, 680 nm, 690 nm, 700 nm, 710 nm, 720 nm, 730 nm, 740 nm, 750 nm, 760 nm, 770 nm, 780 nm, 790 nm, 800 nm, 810 nm, 820 nm, 830 nm, 840 nm, 850 nm, 860 nm, 870 nm, 880 nm, 890 nm, 900 nm, 910 nm, 920 nm, 930 nm, 940 nm, 950 nm, 960 nm, 970 nm, 980 nm, 990 nm, 1000 nm; or any combination of the foregoing values; or a range having as an lower limit and an upper limit chosen from any of the foregoing values.

E. Cooling Pre-Masterbatch Materials

In various aspects, the present disclosure pertains to cooling pre-masterbatch materials that are useful in the preparation of the disclosed cooling masterbatch material. A disclosed cooling pre-masterbatch material comprises a polymer, e.g., a polymer present in a cooling film, and nanoparticles of a cooling material, e.g., nanoparticles provided from a cooling film. The disclosed cooling pre-masterbatch materials can be prepared using the disclosed methods of preparing cooling masterbatch materials, i.e., melting in a hopper one or more disclosed cooling films, followed by extrusion and pelletizing.

F. Cooling Masterbatch Materials

In various aspects, the present disclosure pertains to cooling masterbatch materials that are useful in the preparation of the disclosed cooling filament yarns. A disclosed cooling masterbatch materials comprises a masterbatch polymer matrix comprising one more cooling materials, as disclosed herein above, dispersed therein. The disclosed cooling masterbatch materials can be prepared using the disclosed methods of preparing cooling masterbatch materials, providing a premelt cooling material, e.g., providing to a hopper one or more disclosed pre-masterbatch materials and/or one or more of the cooling materials prepared by ultrasonication, together with a suitable polymer, e.g., a polyester or polyamide, followed by extrusion and pelletizing. In the present disclosure reference to a premelt polymer is a masterbatch polymer matrix that is provided with a premelt cooling material in the preparation a masterbatch, and upon formation of the masterbatch, following extrusion and cooling, the cooling masterbatch material comprises a masterbatch polymer matrix and cooling masterbatch materials formed from, respectively, the premelt polymer and premelt cooling material that were provided to form the premelt mixture.

In various aspects, the disclosure pertains to cooling masterbatch compositions comprising: a masterbatch polymer selected from a polyester, a polyamide, and combinations thereof; a masterbatch cooling material selected from aluminum, zinc oxide, titanium dioxide, calcium carbonate, and combinations thereof; wherein the aluminum, when present, has an average particle size of from about 1 nm to about 50 nm and is in the cooling masterbatch composition in an amount of from about 0.1 wt % to about 10 wt %; wherein the zinc oxide, when present, has an average particle size of from about 1 nm to about 50 nm and is in the cooling masterbatch composition in an amount of from about 0.1 wt % to about 10 wt %; wherein the titanium dioxide, when present, has an average particle size of from about 10 nm to about 2000 nm and is in the cooling masterbatch composition in an amount of from about 1 wt % to about 90 wt %; and wherein the calcium carbonate, when present, has an average particle size of from about 10 nm to about 2000 nm and is in the cooling masterbatch composition in an amount of from about 1 wt % to about 90 wt %; and wherein the wt % is based on a total weight of the cooling masterbatch material polymer and all materials in the cooling masterbatch material cooling material.

In a further aspect, the cooling masterbatch material polymer matrix can comprise a suitable polymer such as a polyester polymer, a polyamide polymer, a polyolefin polymer, a polyurethane polymer, a fluoropolymer, mixtures or combinations thereof, or copolymers thereof. In a further aspect, the cooling masterbatch material polymer matrix comprises a polyolefin such as a polyethylene, a polypropylene, or combinations thereof. In other aspects, the cooling masterbatch material polymer matrix comprises a fluoropolymer such as a polytetrafluoroethylene (PTFE).

In a further aspect, the cooling masterbatch material polymer matrix can comprise a polyester polymer, such as a polyethylene terephthalate, a polytrimethylene terephthalate, or combinations thereof. In a further aspect, the polyester can comprise a polyethylene terephthalate. In further aspects, the polyester can comprise a polytrimethylene terephthalate.

In still further aspects, the polyester is a polyeseter co-polymer comprising a polyethylene terephthalate, a polytrimethylene terephthalate, or combinations thereof. In a yet further aspect, the polyester can comprise a co-polymer comprising polyethylene terephthalate. In a further aspect, the polyester can comprise a co-polymer comprising polytrimethylene terephthalate.

In a further aspect, the cooling masterbatch material polymer matrix can comprise a polyamide polymer, such as a nylon 6, nylon 4/6, nylon 6/6, nylon 6/10, nylon 6/12, nylon 11, nylon 12, or combinations thereof. In a further aspect, the polyamide can comprise a nylon 6/6. In a still further aspect, the polyamide is a polyamide co-polymer comprising nylon 6, nylon 4/6, nylon 6/6, nylon 6/10, nylon 6/12, nylon 11, nylon 12, or combinations thereof. In a yet further aspect, the polyamide is a polyamide co-polymer comprising nylon 6/6.

In various aspects, the cooling masterbatch material polymer matrix can comprise a virgin polymer, a recycled polymer, and combinations thereof. In a further aspect, the cooling masterbatch material polymer matrix comprises a virgin polymer. In a still further aspect, the cooling masterbatch material polymer matrix comprises a recycled polymer.

In a further aspect, the cooling masterbatch material polymer matrix comprises cooling materials having a particle size of about 1 nm to about 100 nm. In a still further aspect, the cooling masterbatch material polymer matrix comprises cooling materials having a particle size of about 1 nm to about 50 nm. In a yet further aspect, the cooling masterbatch material polymer matrix comprises cooling materials having a particle size of about 1 nm to about 40 nm. In an even further aspect, the nanoparticles have a size of about 1 nm; about 2 nm; about 3 nm; about 4 nm; about 5 nm; about 6 nm; about 7 nm; about 8 nm; about 9 nm; about 10 nm; about 11 nm; about 12 nm; about 13 nm; about 14 nm; about 15 nm; about 16 nm; about 17 nm; about 18 nm; about 19 nm; about 20 nm; about 21 nm; about 22 nm; about 23 nm; about 24 nm; about 25 nm; about 26 nm; about 27 nm; about 28 nm; about 29 nm; about 30 nm; about 31 nm; about 32 nm; about 33 nm; about 34 nm; about 35 nm; about 36 nm; about 37 nm; about 38 nm; about 39 nm; about 40 nm; about 41 nm; about 42 nm; about 43 nm; about 44 nm; about 45 nm; about 46 nm; about 47 nm; about 48 nm; about 49 nm; about 50 nm; about 51 nm; about 52 nm; about 53 nm; about 54 nm; about 55 nm; about 56 nm; about 57 nm; about 58 nm; about 59 nm; about 60 nm; about 61 nm; about 62 nm; about 63 nm; about 64 nm; about 65 nm; about 66 nm; about 67 nm; about 68 nm; about 69 nm; about 70 nm; about 71 nm; about 72 nm; about 73 nm; about 74 nm; about 75 nm; about 76 nm; about 77 nm; about 78 nm; about 79 nm; about 80 nm; about 81 nm; about 82 nm; about 83 nm; about 84 nm; about 85 nm; about 86 nm; about 87 nm; about 88 nm; about 89 nm; about 90 nm; about 91 nm; about 92 nm; about 93 nm; about 94 nm; about 95 nm; about 96 nm; about 97 nm; about 98 nm; about 99 nm; about 100 nm; a range utilizing any of the foregoing values; a sub-range with a range utilizing any of the foregoing values; or any set of values utilizing the foregoing values.

In an aspect, the cooling masterbatch material can comprise the one or more cooling materials in a weight percent amount of about 0.001 wt % to about 5 wt % based on the total weight of the cooling masterbatch material polymer matrix and cooling materials. In a further aspect, the cooling masterbatch material can comprise the one or more cooling materials in a weight percent, based on the total weight of the cooling masterbatch material polymer matrix and cooling materials, of about 0.001 wt %; about 0.002 wt %; about 0.003 wt %; about 0.004 wt %; about 0.005 wt %; about 0.006 wt %; about 0.007 wt %; about 0.008 wt %; about 0.009 wt %; about 0.010 wt %; about 0.02 wt %; about 0.03 wt %; about 0.04 wt %; about 0.05 wt %; about 0.06 wt %; about 0.07 wt %; about 0.08 wt %; about 0.09 wt %; about 0.10 wt %; about 0.11 wt %; about 0.12 wt %; about 0.13 wt %; about 0.14 wt %; about 0.15 wt %; about 0.16 wt %; about 0.17 wt %; about 0.18 wt %; about 0.19 wt %; about 0.20 wt %; about 0.21 wt %; about 0.22 wt %; about 0.23 wt %; about 0.24 wt %; about 0.25 wt %; about 0.26 wt %; about 0.27 wt %; about 0.28 wt %; about 0.29 wt %; 0.30 wt %; about 0.31 wt %; about 0.32 wt %; about 0.33 wt %; about 0.34 wt %; about 0.35 wt %; about 0.36 wt %; about 0.37 wt %; about 0.38 wt %; about 0.39 wt %; about 0.40 wt %; about 0.41 wt %; about 0.42 wt %; about 0.43 wt %; about 0.44 wt %; about 0.45 wt %; about 0.46 wt %; about 0.47 wt %; about 0.48 wt %; about 0.49 wt %; about 0.50 wt %; about 0.51 wt %; about 0.52 wt %; about 0.53 wt %; about 0.54 wt %; about 0.55 wt %; about 0.56 wt %; about 0.57 wt %; about 0.58 wt %; about 0.59 wt %; about 0.60 wt %; about 0.61 wt %; about 0.62 wt %; about 0.63 wt %; about 0.64 wt %; about 0.65 wt %; about 0.66 wt %; about 0.67 wt %; about 0.68 wt %; about 0.69 wt %; about 0.70 wt %; about 0.71 wt %; about 0.72 wt %; about 0.73 wt %; about 0.74 wt %; about 0.75 wt %; about 0.76 wt %; about 0.77 wt %; about 0.78 wt %; about 0.79 wt %; about 0.80 wt %; about 0.81 wt %; about 0.82 wt %; about 0.83 wt %; about 0.84 wt %; about 0.85 wt %; about 0.86 wt %; about 0.87 wt %; about 0.88 wt %; about 0.89 wt %; about 0.90 wt %; about 0.91 wt %; about 0.92 wt %; about 0.93 wt %; about 0.94 wt %; about 0.95 wt %; about 0.96 wt %; about 0.97 wt %; about 0.98 wt %; about 0.99 wt %; about 1.0 wt %; about 1.1 wt %; about 1.2 wt %; about 1.3 wt %; about 1.4 wt %; about 1.5 wt %; about 1.6 wt %; about 1.7 wt %; about 1.8 wt %; about 1.9 wt %; about 2.0 wt %; about 2.1 wt %; about 2.2 wt %; about 2.3 wt %; about 2.4 wt %; about 2.5 wt %; about 2.6 wt %; about 2.7 wt %; about 2.8 wt %; about 2.9 wt %; about 3.0 wt %; about 3.1 wt %; about 3.2 wt %; about 3.3 wt %; about 3.4 wt %; about 3.5 wt %; about 3.6 wt %; about 3.7 wt %; about 3.8 wt %; about 3.9 wt %; about 4.0 wt %; about 4.1 wt %; about 4.2 wt %; about 4.3 wt %; about 4.4 wt %; about 4.5 wt %; about 4.6 wt %; about 4.7 wt %; about 4.8 wt %; about 4.9 wt %; about 5.0 wt %; a range utilizing any of the foregoing values; a sub-range with a range utilizing any of the foregoing values; or any set of values utilizing the foregoing values.

As discussed above, a disclosed cooling masterbatch material can comprises a masterbatch polymer matrix comprising one more cooling materials, as disclosed herein above, dispersed therein. For example, a disclosed cooling masterbatch material can comprises a masterbatch polymer matrix comprising 1, 2, 3, or 4 cooling materials, as disclosed herein above, dispersed therein.

A disclosed masterbatch can further comprise one or more auxiliary agents. For example, the auxiliaries may include, but are not limited to, a dispersing agent, a wetting agent, an anti-migrating agent, a pH stabilizer (e.g., a buffering salt, such as monosodium phosphate), and a diffusion accelerant. The one or more auxiliary agents can be present in an amount (wt %) of about 0.1, 0.2, 0.3, 0.4, 0.5, 0.6, 0.7, 0.8, 0.9, 1.0, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9, 3.0, 3.1, 3.2, 3.3, 3.4, 3.5, 3.6, 3.7, 3.8, 3.9, 4.0, 4.1, 4.2, 4.3, 4.4, 4.5, 4.6, 4.7, 4.8, 4.9, and/or 5.0; or a selection of wt % value from the foregoing; or a range of wt % values have a lower limit and an upper limit selected from the foregoing values. In a further aspect, one or more auxiliary agents can be present in an amount of from about 0.1 wt % to about 3.0 wt %. It is to be understood that the wt % is based on the weight of the auxiliary agent and the total weight of all components in the masterbatch.

In a further aspect, the cooling material in the cooling masterbatch material has an increase in surface area/gram versus conventional materials as follows: $TiO_2$ has about a 50-100% increase in surface area/gram versus conventionally available materials; $CaCO_3$ has about a 50-100% increase in surface area/gram versus conventionally available materials; ZnO has about a 400-500% increase in surface area/gram versus conventionally available materials; and aluminum has about a 400-500% increase in surface area/gram versus conventionally available materials.

In a further aspect, the cooling masterbatch material comprises zinc oxide having a particle size of from 1 nm to about 1000 nm and present in the cooling masterbatch material in an amount of from about 0.1 wt % to about 10 wt % or from about 0.1 vol % to about 10 vol %, with the cooling masterbatch material polymer matrix present in an amount of from about 99.9 wt % to about 90 wt %; aluminum having a particle size of from 1 nm to about 1000 nm and present in the cooling masterbatch material in an amount of from about 0.1 wt % to about 10 wt % or from about 0.1 vol % to about 10 vol %, with the cooling masterbatch material polymer matrix present in an amount of from about 99.9 wt % to about 90 wt %; titanium dioxide having a particle size of from 1 nm to about 2000 nm and present in the cooling masterbatch material in an amount of from about 50 wt % to about 90 wt % or from about 50 vol % to about 90 vol %, with the cooling masterbatch material polymer matrix present in an amount of from about 50 wt % to about 10 wt %; calcium carbonate having a particle size of from 1 nm to about 2000 nm and present in the cooling masterbatch material in an amount of from about 50 wt % to about 90 wt % or from about 50 vol % to about 90 vol %, with the cooling masterbatch material polymer matrix present in an amount of from about 50 wt % to about 10 wt %; or combinations thereof.

In a further aspect, the cooling masterbatch material comprises zinc oxide having a particle size of from 1 nm to about 1000 nm and present in the cooling masterbatch material in an amount of from about 0.1 wt % to about 10 wt % or from about 0.1 vol % to about 10 vol %, with the cooling masterbatch material polymer matrix present in an amount of from about 99.9 wt % to about 90 wt %.

In a further aspect, the cooling masterbatch material comprises aluminum having a particle size of from 1 nm to about 1000 nm and present in the cooling masterbatch material in an amount of from about 0.1 wt % to about 10 wt % or from about 0.1 vol % to about 10 vol %, with the cooling masterbatch material polymer matrix present in an amount of from about 99.9 wt % to about 90 wt %.

In a further aspect, the cooling masterbatch material comprises titanium dioxide having a particle size of from 1 nm to about 2000 nm and present in the cooling masterbatch material in an amount of from about 50 wt % to about 90 wt % or from about 50 vol % to about 90 vol %, with the cooling masterbatch material polymer matrix present in an amount of from about 50 wt % to about 10 wt %.

In a further aspect, the cooling masterbatch material comprises calcium carbonate having a particle size of from 1 nm to about 2000 nm and present in the cooling masterbatch material in an amount of from about 50 wt % to about 90 wt % or from about 50 vol % to about 90 vol %, with the cooling masterbatch material polymer matrix present in an amount of from about 50 wt % to about 10 wt %.

In a further aspect, the cooling masterbatch material comprises zinc oxide having a particle size of from 1 nm to about 100 nm and present in the cooling masterbatch material in an amount of from about 0.1 wt % to about 3 wt % or from about 0.1 vol % to about 3 vol %, with the cooling masterbatch material polymer matrix present in an amount of from about 99.9 wt % to about 97 wt %; aluminum having a particle size of from 1 nm to about 100 nm and present in the cooling masterbatch material in an amount of from about 0.1 wt % to about 3 wt % or from about 0.1 vol % to about 3 vol %, with the cooling masterbatch material polymer matrix present in an amount of from about 99.9 wt % to about 97 wt %; titanium dioxide having a particle size of from 20 nm to about 1000 nm and present in the cooling masterbatch material in an amount of from about 60 wt % to about 80 wt % or from about 60 vol % to about 80 vol %, with the cooling masterbatch material polymer matrix present in an amount of from about 40 wt % to about 20 wt %; calcium carbonate having a particle size of from 20 nm to about 1000 nm and present in the cooling masterbatch material in an amount of from about 60 wt % to about 80 wt % or from about 60 vol % to about 80 vol %, with the cooling masterbatch material polymer matrix present in an amount of from about 40 wt % to about 20 wt %; or combinations thereof.

In a further aspect, the cooling masterbatch material comprises zinc oxide having a particle size of from 1 nm to about 100 nm and present in the cooling masterbatch material in an amount of from about 0.1 wt % to about 3 wt % or from about 0.1 vol % to about 3 vol %, with the cooling masterbatch material polymer matrix present in an amount of from about 99.9 wt % to about 97 wt %.

In a further aspect, the cooling masterbatch material comprises aluminum having a particle size of from 1 nm to about 100 nm and present in the cooling masterbatch material in an amount of from about 0.1 wt % to about 3 wt % or from about 0.1 vol % to about 3 vol %, with the cooling masterbatch material polymer matrix present in an amount of from about 99.9 wt % to about 97 wt %.

In a further aspect, the cooling masterbatch material comprises titanium dioxide having a particle size of from 20 nm to about 1000 nm and present in the cooling masterbatch material in an amount of from about 60 wt % to about 80 wt % or from about 60 vol % to about 80 vol %, with the cooling masterbatch material polymer matrix present in an amount of from about 40 wt % to about 20 wt %.

In a further aspect, the cooling masterbatch material comprises calcium carbonate having a particle size of from 20 nm to about 1000 nm and present in the cooling masterbatch material in an amount of from about 60 wt % to about 80 wt % or from about 60 vol % to about 80 vol %, with the cooling masterbatch material polymer matrix present in an amount of from about 40 wt % to about 20 wt %.

In a further aspect, the cooling masterbatch material comprises zinc oxide having a particle size of from 1 nm to about 50 nm and present in the cooling masterbatch material in an amount of from about 0.1 wt % to about 1 wt % or from about 0.1 vol % to about 1 vol %, with the cooling masterbatch material polymer matrix present in an amount of from about 99.9 wt % to about 99 wt %; aluminum having a particle size of from 1 nm to about 50 nm and present in the cooling masterbatch material in an amount of from about 0.1 wt % to about 1 wt % or from about 0.1 vol % to about 1 vol %, with the cooling masterbatch material polymer matrix present in an amount of from about 99.9 wt % to about 99 wt %; titanium dioxide having a particle size of from 30 nm to about 400 nm and present in the cooling masterbatch material in an amount of from about 40 wt % to about 60 wt % or from about 40 vol % to about 60 vol %, with the cooling masterbatch material polymer matrix present in an amount of from about 60 wt % to about 40 wt %; calcium carbonate having a particle size of from 30 nm to about 400 nm and present in the cooling masterbatch material in an amount of from about 40 wt % to about 60 wt % or from about 40 vol % to about 60 vol %, with the cooling masterbatch material polymer matrix present in an amount of from about 60 wt % to about 40 wt %; or combinations thereof.

In a further aspect, the cooling masterbatch material comprises zinc oxide having a particle size of from 1 nm to about 50 nm and present in the cooling masterbatch material in an amount of from about 0.1 wt % to about 1 wt % or from about 0.1 vol % to about 1 vol %, with the cooling masterbatch material polymer matrix present in an amount of from about 99.9 wt % to about 99 wt %.

In a further aspect, the cooling masterbatch material comprises aluminum having a particle size of from 1 nm to about 50 nm and present in the cooling masterbatch material in an amount of from about 0.1 wt % to about 1 wt % or from about 0.1 vol % to about 1 vol %, with the cooling masterbatch material polymer matrix present in an amount of from about 99.9 wt % to about 99 wt %.

In a further aspect, the cooling masterbatch material comprises titanium dioxide having a particle size of from 30 nm to about 400 nm and present in the cooling masterbatch material in an amount of from about 40 wt % to about 60 wt % or from about 40 vol % to about 60 vol %, with the cooling masterbatch material polymer matrix present in an amount of from about 60 wt % to about 40 wt %.

In a further aspect, the cooling masterbatch material comprises calcium carbonate having a particle size of from 30 nm to about 400 nm and present in the cooling masterbatch material in an amount of from about 40 wt % to about 60 wt % or from about 40 vol % to about 60 vol %, with the cooling masterbatch material polymer matrix present in an amount of from about 60 wt % to about 40 wt %.

G. Cooling Filament Yarns

In various aspects, the present disclosure pertains to a filament yarn comprising a disclosed material, e.g., a filament yarn prepared using a disclosed cooling masterbatch material. In a further aspect, a disclosed cooling yarn can be flat. In a still further aspect, or other aspects, a disclosed cooling yarn can be texturized, e.g., via a draw texturizing process.

In a further aspect, a disclosed filament yarn has a linear mass density of about 50d/20f to about 130d/90f; about 105d/20f to about 130d/40f; about 110d/20f to about 130d/40f; about 115d/20f to about 130d/40f; about 105d/20f to about 130d/35f; about 110d/35f to about 130d/35f; about 115d/20f to about 130d/35f; about 105d/20f to about 130d/30f; about 110d/20f to about 130d/30f; about 115d/20f to about 130d/30f; about 105d/20f to about 130d/40f; about 115d/25f to about 135d/35f; a sub-range within any of the foregoing ranges; or any set of values utilizing values within any of the foregoing ranges. It is understood in the foregoing values that "d" indicates Denier for the yarn and "f" indicates number of filaments in a yarn fiber. Thus, a disclosed filament yarn having a weight of 75d/72f would be a yarn have a linear mass density of 75 Denier with 72 filaments per yarn fiber.

In a further aspect, a disclosed filament yarn has a linear mass density of about 120d/20f±10%; about 120d/20f±5%;

about 120d/20f±3%; 121d/20f±10%; about 121d/20f±5%; about 121d/20f±3%; 122d/20f±10%; about 122d/20f±5%; about 122d/20f±3%; 123d/20f±10%; about 123d/20f±5%; about 123d/20f±3%; 124d/20f±10%; about 124d/20f±5%; about 124d/20f±3%; 125d/20f±10%; about 125d/20f±5%; about 125d/20f±3%; 126d/20f±10%; about 126d/20f±5%; about 126d/20f±3%; 127d/20f±10%; about 127d/20f±5%; about 127d/20f±3%; 128d/20f±10%; about 128d/20f±5%; about 128d/20f±3%; 129d/20f±10%; about 129d/20f±5%; about 129d/20f±3%; 130d/20f±10%; about 130d/20f±5%; about 130d/20f±3%; about 120d/25f±10%; about 120d/25f±5%; about 120d/25f±3%; 121d/25f±10%; about 121d/25f±5%; about 121d/25f±3%; 122d/25f±10%; about 122d/25f±5%; about 122d/25f±3%; 123d/25f±10%; about 123d/25f±5%; about 123d/25f±3%; 124d/25f±10%; about 124d/25f±5%; about 124d/25f±3%; 125d/25f±10%; about 125d/25f±5%; about 125d/25f±3%; 126d/25f±10%; about 126d/25f±5%; about 126d/25f±3%; 127d/25f±10%; about 127d/25f±5%; about 127d/25f±3%; 128d/25f±10%; about 128d/25f±5%; about 128d/25f±3%; 129d/25f±10%; about 129d/25f±5%; about 129d/25f±3%; 130d/25f±10%; about 130d/25f±5%; about 130d/25f±3%; about 120d/30f±10%; about 120d/30f±5%; about 120d/30f±3%; 121d/30f±10%; about 121d/30f±5%; about 121d/30f±3%; 122d/30f±10%; about 122d/30f±5%; about 122d/30f±3%; 123d/30f±10%; about 123d/30f±5%; about 123d/30f±3%; 124d/30f±10%; about 124d/30f±5%; about 124d/30f±3%; 125d/30f±10%; about 125d/30f±5%; about 125d/30f±3%; 126d/30f±10%; about 126d/30f±5%; about 126d/30f±3%; 127d/30f±10%; about 127d/30f±5%; about 127d/30f±3%; 128d/30f±10%; about 128d/30f±5%; about 128d/30f±3%; 129d/30f±10%; about 129d/30f±5%; about 129d/30f±3%; 130d/30f±10%; about 130d/30f±5%; about 130d/30f±3%; about 120d/35f±10%; about 120d/35f±5%; about 120d/35f±3%; 121d/35f±10%; about 121d/35f±5%; about 121d/35f±3%; 122d/35f±10%; about 122d/35f±5%; about 122d/35f±3%; 123d/35f±10%; about 123d/35f±5%; about 123d/35f±3%; 124d/35f±10%; about 124d/35f±5%; about 124d/35f±3%; 125d/35f±10%; about 125d/35f±5%; about 125d/35f±3%; 126d/35f±10%; about 126d/35f±5%; about 126d/35f±3%; 127d/35f±10%; about 127d/35f±5%; about 127d/35f±3%; 128d/35f±10%; about 128d/35f±5%; about 128d/35f±3%; 129d/35f±10%; about 129d/35f±5%; about 129d/35f±3%; 130d/35f±10%; about 130d/35f±5%; about 130d/35f±3%; about 120d/40f±10%; about 120d/40f±5%; about 120d/40f±3%; 121d/40f±10%; about 121d/40f±5%; about 121d/40f±3%; 122d/40f±10%; about 122d/40f±5%; about 122d/40f±3%; 123d/40f±10%; about 123d/40f±5%; about 123d/40f±3%; 124d/40f±10%; about 124d/40f±5%; about 124d/40f±3%; 125d/40f±10%; about 125d/40f±5%; about 125d/40f±3%; 126d/40f±10%; about 126d/40f±5%; about 126d/40f±3%; 127d/40f±10%; about 127d/40f±5%; about 127d/40f±3%; 128d/40f±10%; about 128d/40f±5%; about 128d/40f±3%; 129d/40f±10%; about 129d/40f±5%; about 129d/40f±3%; 130d/40f±10%; about 130d/40f±5%; about 130d/40f±3%; a range encompassing any of the foregoing value; or any combination of the foregoing values.

In a further aspect, a disclosed filament yarn has a linear mass density of about 70d/70f±10%; about 70d/70f±5%; about 70d/70f±3%; 71d/70f±10%; about 71d/70f±5%; about 71d/70f±3%; 72d/70f±10%; about 72d/70f±5%; about 72d/70f±3%; 73d/70f±10%; about 73d/70f±5%; about 73d/70f±3%; 74d/70f±10%; about 74d/70f±5%; about 74d/70f±3%; 75d/70f±10%; about 75d/70f±5%; about 75d/70f±3%; 76d/70f±10%; about 76d/70f±5%; about 76d/70f±3%; 77d/70f±10%; about 77d/70f±5%; about 77d/70f±3%; 78d/70f±10%; about 78d/70f±5%; about 78d/70f±3%; 79d/70f±10%; about 79d/70f±5%; about 79d/70f±3%; 80d/70f±10%; about 80d/70f±5%; about 80d/70f±3%; about 70d/75f±10%; about 70d/75f±5%; about 70d/75f±3%; 71d/75f±10%; about 71d/75f±5%; about 71d/75f±3%; 72d/75f±10%; about 72d/75f±5%; about 72d/75f±3%; 73d/75f±10%; about 73d/75f±5%; about 73d/75f±3%; 74d/75f±10%; about 74d/75f±5%; about 74d/75f±3%; 75d/75f±10%; about 75d/75f±5%; about 75d/75f±3%; 76d/75f±10%; about 76d/75f±5%; about 76d/75f±3%; 77d/75f±10%; about 77d/75f±5%; about 77d/75f±3%; 78d/75f±10%; about 78d/75f±5%; about 78d/75f±3%; 79d/75f±10%; about 79d/75f±5%; about 79d/75f±3%; 80d/75f±10%; about 80d/75f±5%; about 80d/75f±3%; about 70d/80f±10%; about 70d/80f±5%; about 70d/80f±3%; 71d/80f±10%; about 71d/80f±5%; about 71d/80f±3%; 72d/80f±10%; about 72d/80f±5%; about 72d/80f±3%; 73d/80f±10%; about 73d/80f±5%; about 73d/80f±3%; 74d/80f±10%; about 74d/80f±5%; about 74d/80f±3%; 75d/80f±10%; about 75d/80f±5%; about 75d/80f±3%; 76d/80f±10%; about 76d/80f±5%; about 76d/80f±3%; 77d/80f±10%; about 77d/80f±5%; about 77d/80f±3%; 78d/80f±10%; about 78d/80f±5%; about 78d/80f±3%; 79d/80f±10%; about 79d/80f±5%; about 79d/80f±3%; 80d/80f±10%; about 80d/80f±5%; about 80d/80f±3%; about 70d/85f±10%; about 70d/85f±5%; about 70d/85f±3%; 71d/85f±10%; about 71d/85f±5%; about 71d/85f±3%; 72d/85f±10%; about 72d/85f±5%; about 72d/85f±3%; 73d/85f±10%; about 73d/85f±5%; about 73d/85f±3%; 74d/85f±10%; about 74d/85f±5%; about 74d/85f±3%; 75d/85f±10%; about 75d/85f±5%; about 75d/85f±3%; 76d/85f±10%; about 76d/85f±5%; about 76d/85f±3%; 77d/85f±10%; about 77d/85f±5%; about 77d/85f±3%; 78d/85f±10%; about 78d/85f±5%; about 78d/85f±3%; 79d/85f±10%; about 79d/85f±5%; about 79d/85f±3%; 80d/85f±10%; about 80d/85f±5%; about 80d/85f±3%; about 70d/90f±10%; about 70d/90f±5%; about 70d/90f±3%; 71d/90f±10%; about 71d/90f±5%; about 71d/90f±3%; 72d/90f±10%; about 72d/90f±5%; about 72d/90f±3%; 73d/90f±10%; about 73d/90f±5%; about 73d/90f±3%; 74d/90f±10%; about 74d/90f±5%; about 74d/90f±3%; 75d/90f±10%; about 75d/90f±5%; about 75d/90f±3%; 76d/90f±10%; about 76d/90f±5%; about 76d/90f±3%; 77d/90f±10%; about 77d/90f±5%; about 77d/90f±3%; 78d/90f±10%; about 78d/90f±5%; about 78d/90f±3%; 79d/90f±10%; about 79d/90f±5%; about 79d/90f±3%; 80d/90f±10%; about 80d/90f±5%; about 80d/90f±3%; a range encompassing any of the foregoing value; or any combination of the foregoing values.

In various aspects, a disclosed filament yarn has a linear mass density of about 250 Denier to about 370 Denier; about 260 Denier to about 370 Denier; about 270 Denier to about 370 Denier; about 280 Denier to about 370 Denier; about 290 Denier to about 370 Denier; about 300 Denier to about 370 Denier; about 310 Denier to about 370 Denier; about 320 Denier to about 370 Denier; about 330 Denier to about 370 Denier; about 340 Denier to about 370 Denier; about 350 Denier to about 370 Denier; about 355 Denier to about 370 Denier; about 360 Denier to about 370 Denier; about 250 Denier to about 360 Denier; about 260 Denier to about 360 Denier; about 270 Denier to about 360 Denier; about 280 Denier to about 360 Denier; about 290 Denier to about 360 Denier; about 300 Denier to about 360 Denier; about 310 Denier to about 360 Denier; about 320 Denier to about 360 Denier; about 330 Denier to about 360 Denier; about 340 Denier to about 360 Denier; about 350 Denier to about 360 Denier; about 250 Denier to about 350 Denier; about 260 Denier to about 350 Denier; about 270 Denier to about 350 Denier; about 280 Denier to about 350 Denier; about 290 Denier to about 350 Denier; about 300 Denier to about 350 Denier; about 310 Denier to about 350 Denier; about 320 Denier to about 350 Denier; about 330 Denier to about 350 Denier; about 340 Denier to about 350 Denier; about 250 Denier to about 340 Denier; about 260 Denier to about 340 Denier; about 270 Denier to about 340 Denier; about 280 Denier to about 340 Denier; about 290 Denier to about 340 Denier; about 300 Denier to about 340 Denier; about 310 Denier to about 340 Denier; about 320 Denier to about 340 Denier; about 330 Denier to about 340 Denier; about 250 Denier to about 330 Denier; about 260 Denier to about 330 Denier; about 270 Denier to about 330 Denier; about 280 Denier to about 330 Denier; about 285 Denier to about 330 Denier; about 290 Denier to about 330 Denier; about 300 Denier to about 330 Denier; about 310 Denier to about 330 Denier; about 320 Denier to about 330 Denier; about 250 Denier to about 320 Denier; about 260 Denier to about 320 Denier; about 270 Denier to about 320 Denier; about 280 Denier to about 320 Denier; about 290 Denier to about 320 Denier; about 300 Denier to about 320 Denier; about 310 Denier to about 320 Denier; about 250 Denier to about 310 Denier; about 260 Denier to about 310 Denier; about 270 Denier to about 310 Denier; about 280 Denier to about 310 Denier; about 290 Denier to about 310 Denier; about 300 Denier to about 310 Denier; about 250 Denier to about 300 Denier; about 260 Denier to about 300 Denier; about 270 Denier to about 300 Denier; about 280 Denier to about 300 Denier; about 290 Denier to about 300 Denier; about 250 Denier to about 350 Denier; about 270 Denier to about 330 Denier; about 280 Denier to about 320 Denier; about 285 Denier to about 310 Denier; about 250 Denier to about 360 Denier; about 270 Denier to about 360 Denier; about 280 Denier to about 360 Denier; about 285 Denier to about 360 Denier; a sub-range within any of the foregoing ranges; or any set of values utilizing values within any of the foregoing ranges.

In a further aspect, a disclosed filament yarn has a linear mass density of about 270 Denier±10%; 270 Denier±5%; about 270 Denier±3%; about 271 Denier±10%; 271 Denier±5%; about 271 Denier±3%; about 272 Denier±10%; 272 Denier±5%; about 272 Denier±3%; about 273 Denier±10%; 273 Denier±5%; about 273 Denier±3%; about 274 Denier±10%; 274 Denier±5%; about 274 Denier±3%; about 275 Denier±10%; 275 Denier±5%; about 275 Denier±3%; about 276 Denier±10%; 276 Denier±5%; about 276 Denier±3%; about 277 Denier±10%; 277 Denier±5%; about 277 Denier±3%; about 278 Denier±10%; 278 Denier±5%; about 278 Denier±3%; about 279 Denier±10%; 279 Denier±5%; about 279 Denier±3%; about 280 Denier±10%; 280 Denier±5%; about 280 Denier±3%; about 281 Denier±10%; 281 Denier±5%; about 281 Denier±3%; about 282 Denier±10%; 282 Denier±5%; about 282 Denier±3%; about 283 Denier±10%; 283 Denier±5%; about 283 Denier±3%; about 284 Denier±10%; 284 Denier±5%; about 284 Denier±3%; about 285 Denier±10%; 285 Denier±5%; about 285 Denier±3%; about 286 Denier±10%; 286 Denier±5%; about 286 Denier±3%; about 287 Denier±10%; 287 Denier±5%; about 287 Denier±3%; about 288 Denier±10%; 288 Denier±5%; about 288 Denier±3%; about 289 Denier±10%; 289 Denier±5%; about 289 Denier±3%; about 290 Denier±10%; 290 Denier±5%; about 290 Denier±3%; about 291 Denier±10%; 291 Denier±5%; about 291 Denier±3%; about 292 Denier±10%; 292 Denier±5%; about 292 Denier±3%; about 293 Denier±10%; 293 Denier±5%; about 293 Denier±3%; about 294 Denier±10%; 294 Denier±5%; about 294 Denier±3%; about 295 Denier±10%; 295 Denier±5%; about 295 Denier±3%; about 296 Denier±10%; 296 Denier±5%; about 296 Denier±3%; about 297 Denier±10%; 297 Denier±5%; about 297 Denier±3%; about 298 Denier±10%; 298 Denier±5%; about 298 Denier±3%; about 299 Denier±10%; 299 Denier±5%; about 299 Denier±3%; about 300 Denier±10%; 300 Denier±5%; about 300 Denier±3%; about 301 Denier±10%; 301 Denier±5%; about 301 Denier±3%; about 302 Denier±10%; 302 Denier±5%; about 302 Denier±3%; about 303 Denier±10%; 303 Denier±5%; about 303 Denier±3%; about 304 Denier±10%; 304 Denier±5%; about 304 Denier±3%; about 305 Denier±10%; 305 Denier±5%; about 305 Denier±3%; about 306 Denier±10%; 306 Denier±5%; about 306 Denier±3%; about 307 Denier±10%; 307 Denier±5%; about 307 Denier±3%; about 308 Denier±10%; 308 Denier±5%; about 308 Denier±3%; about 309 Denier±10%; 309 Denier±5%; about 309 Denier±3%; about 310 Denier±10%; 310 Denier±5%; about 310 Denier±3%; about 311 Denier±10%; 311 Denier±5%; about 311 Denier±3%; about 312 Denier±10%; 312 Denier±5%; about 312 Denier±3%; about 313 Denier±10%; 313 Denier±5%; about 313 Denier±3%; about 314 Denier±10%; 314 Denier±5%; about 314 Denier±3%; about 315 Denier±10%; 315 Denier±5%; about 315 Denier±3%; about 316 Denier±10%; 316 Denier±5%; about 316 Denier±3%; about 317 Denier±10%; 317 Denier±5%; about 317 Denier±3%; about 318 Denier±10%; 318 Denier±5%; about 318 Denier±3%; about 319 Denier±10%; 319 Denier±5%; about 319 Denier±3%; about 320 Denier±10%; 320 Denier±5%; about 320 Denier±3%; about 321 Denier±10%; 321 Denier±5%; about 321 Denier±3%; about 322 Denier±10%; 322 Denier±5%; about 322 Denier±3%; about 323 Denier±10%; 323 Denier±5%; about 323 Denier±3%; about 324 Denier±10%; 324 Denier±5%; about 324 Denier±3%; about 325 Denier±10%; 325 Denier±5%; about 325 Denier±3%; about 326 Denier±10%; 326 Denier±5%; about 326 Denier±3%; about 327 Denier±10%; 327 Denier±5%; about 327 Denier±3%; about 328 Denier±10%; 328 Denier±5%; about 328 Denier±3%; about 329 Denier±10%; 329 Denier±5%; about 329 Denier±3%; about 330 Denier±10%; 330 Denier±5%; about 330 Denier±3%; about 331 Denier±10%; 331 Denier±5%; about 331 Denier±3%; about 332 Denier±10%; 332 Denier±5%; about 332 Denier±3%; about 333 Denier±10%; 333 Denier±5%; about 333 Denier±3%; about 334 Denier±10%; 334 Denier±5%; about 334 Denier±3%; about 335 Denier±10%; 335 Denier±5%; about 335 Denier±3%; about 336 Denier±10%; 336 Denier±5%; about 336 Denier±3%; about 337 Denier±10%; 337 Denier±5%; about 337 Denier±3%; about 338 Denier±10%; 338 Denier±5%; about 338 Denier±3%; about 339 Denier±10%; 339 Denier±5%; about 339 Denier±3%; about 340 Denier±10%; 340 Denier±5%; about 340 Denier±3%; about 341 Denier±10%; 341 Denier±5%; about 341 Denier±3%; about 342 Denier±10%; 342 Denier±5%; about 342 Denier±3%; about 343 Denier±10%; 343 Denier±5%; about 343 Denier±3%; about 344 Denier±10%; 344 Denier±5%; about 344 Denier±3%; about 345 Denier±10%; 345 Denier±5%; about 345 Denier±3%; about 346 Denier±10%; 346 Denier±5%; about 346 Denier±3%; about 347 Denier±10%; 347 Denier±5%; about 347 Denier±3%; about 348 Denier±10%; 348 Denier±5%; about 348 Denier±3%; about 349 Denier±10%; 349 Denier±5%; about 349 Denier±3%; about 350 Denier±10%; 350 Denier±5%; about 350 Denier±3%; about 351 Denier±10%; 351 Denier±5%; about 351 Denier±3%; about 352 Denier±10%; 352 Denier±5%; about 352 Denier±3%; about 353 Denier±10%; 353 Denier±5%; about 353 Denier±3%; about 354 Denier±10%; 354 Denier±5%; about 354 Denier±3%; about 355 Denier±10%; 355 Denier±5%; about 355 Denier±3%; about 356 Denier±10%; 356 Denier±5%; about 356 Denier±3%; about 357 Denier±10%; 357 Denier±5%; about 357 Denier±3%; about 358 Denier±10%; 358 Denier±5%; about 358 Denier±3%; about 359 Denier±10%; 359 Denier±5%; about 359 Denier±3%; about 360 Denier±10%; 360 Denier±5%; about 360 Denier±3%; about 361 Denier±10%; 361 Denier±5%; about 361 Denier±3%; about 362 Denier±10%; 362 Denier±5%; about 362 Denier±3%; about 363 Denier±10%; 363 Denier±5%; about 363 Denier±3%; about 364 Denier±10%; 364 Denier±5%; about 364 Denier±3%; about 365 Denier±10%; 365 Denier±5%; about 365 Denier±3%; about 366 Denier±10%; 366 Denier±5%; about 366 Denier±3%; about 367 Denier±10%; 367 Denier±5%; about 367 Denier±3%; about 368 Denier±10%; 368 Denier±5%; about 368 Denier±3%; about 369 Denier±10%; about 369 Denier±5%; about 369 Denier±3%; about 370 Denier±10%; 370 Denier±5%; about 370 Denier±3%; about 371 Denier±10%; 371 Denier±5%; about 371 Denier±3%; about 372 Denier±10%; 372 Denier±5%; about 372 Denier±3%; about 373 Denier±10%; 373 Denier±5%; about 373 Denier±3%; about 374 Denier±10%; 374 Denier±5%; 374 Denier±3%; about 375 Denier±10%; 375 Denier±5%; about 375 Denier±3%; about 376 Denier±10%; 376 Denier±5%; about 376 Denier±3%; about 377 Denier±10%; 377 Denier±5%; about 377 Denier±3%; about 378 Denier±10%; 378 Denier±5%; about 378 Denier±3%; about 379 Denier±10%; about 379 Denier±5%; about 379 Denier±3%; about 380 Denier±10%; about 380 Denier±5%; about 380 Denier±3%; a range encompassing any of the foregoing values; or any combination of the foregoing values.

In various aspects, a disclosed filament yarn has a linear mass density of about 50 Denier to about 170 Denier; about 60 Denier to about 170 Denier; about 70 Denier to about 170 Denier; about 80 Denier to about 170 Denier; about 90 Denier to about 170 Denier; about 100 Denier to about 170 Denier; about 110 Denier to about 170 Denier; about 120 Denier to about 170 Denier; about 130 Denier to about 170 Denier; about 140 Denier to about 170 Denier; about 150 Denier to about 170 Denier; about 155 Denier to about 170 Denier; about 160 Denier to about 170 Denier; about 50 Denier to about 160 Denier; about 60 Denier to about 160 Denier; about 70 Denier to about 160 Denier; about 80 Denier to about 160 Denier; about 90 Denier to about 160 Denier; about 100 Denier to about 160 Denier; about 110 Denier to about 160 Denier; about 120 Denier to about 160 Denier; about 130 Denier to about 160 Denier; about 140 Denier to about 160 Denier; about 150 Denier to about 160 Denier; about 50 Denier to about 150 Denier; about 60 Denier to about 150 Denier; about 70 Denier to about 150 Denier; about 80 Denier to about 150 Denier; about 90 Denier to about 150 Denier; about 100 Denier to about 150 Denier; about 110 Denier to about 150 Denier; about 120 Denier to about 150 Denier; about 130 Denier to about 150 Denier; about 140 Denier to about 150 Denier; about 50 Denier to about 140 Denier; about 60 Denier to about 140 Denier; about 70 Denier to about 140 Denier; about 80 Denier to about 140 Denier; about 90 Denier to about 140 Denier; about 100 Denier to about 140 Denier; about 110 Denier to about 140 Denier; about 120 Denier to about 140 Denier; about 130 Denier to about 140 Denier; about 50 Denier to about 130 Denier; about 60 Denier to about 130 Denier; about 70 Denier to about 130 Denier; about 80 Denier to about 130 Denier; about 85 Denier to about 130 Denier; about 90 Denier to about 130 Denier; about 100 Denier to about 130 Denier; about 110 Denier to about 130 Denier; about 120 Denier to about 130 Denier; about 50 Denier to about 120 Denier; about 60 Denier to about 120 Denier; about 70 Denier to about 120 Denier; about 80 Denier to about 120 Denier; about 90 Denier to about 120 Denier; about 100 Denier to about 120 Denier; about 110 Denier to about 120 Denier; about 50 Denier to about 110 Denier; about 60 Denier to about 110 Denier; about 70 Denier to about 110 Denier; about 80 Denier to about 110 Denier; about 90 Denier to about 110 Denier; about 100 Denier to about 110 Denier; about 50 Denier to about 100 Denier; about 60 Denier to about 100 Denier; about 70 Denier to about 100 Denier; about 80 Denier to about 100 Denier; about 90 Denier to about 100 Denier; about 50 Denier to about 150 Denier; about 70 Denier to about 130 Denier; about 80 Denier to about 120 Denier; about 85 Denier to about 110 Denier; about 50 Denier to about 160 Denier; about 70 Denier to about 160 Denier; about 80 Denier to about 160 Denier; about 85 Denier to about 160 Denier; a sub-range within any of the foregoing ranges; or any set of values utilizing values within any of the foregoing ranges.

In a further aspect, a disclosed filament yarn has a linear mass density of about 70 Denier±10%; 270 Denier±5%; about 70 Denier±3%; about 71 Denier±10%; 271 Denier±5%; about 71 Denier±3%; about 72 Denier±10%; 272 Denier±5%; about 72 Denier±3%; about 73 Denier±10%; 273 Denier±5%; about 73 Denier±3%; about 74 Denier±10%; 274 Denier±5%; about 74 Denier±3%; about 75 Denier±10%; 275 Denier±5%; about 75 Denier±3%; about 76 Denier±10%; 276 Denier±5%; about 76 Denier±3%; about 77 Denier±10%; 277 Denier±5%; about 77 Denier±3%; about 78 Denier±10%; 278 Denier±5%; about 78 Denier±3%; about 79 Denier±10%; 279 Denier±5%; about 79 Denier±3%; about 80 Denier±10%; 280 Denier±5%; about 80 Denier±3%; about 81 Denier±10%; 281 Denier±5%; about 81 Denier±3%; about 82 Denier±10%; 282 Denier±5%; about 82 Denier±3%; about 83 Denier±10%; 283 Denier±5%; about 83 Denier±3%; about 84 Denier±10%; 284 Denier±5%; about 84 Denier±3%; about 85 Denier±10%; 285 Denier±5%; about 85 Denier±3%; about 86 Denier±10%; 286 Denier±5%; about 86 Denier±3%; about 87 Denier±10%; 287 Denier±5%; about 87 Denier±3%; about 88 Denier±10%; 288 Denier±5%; about 88 Denier±3%; about 89 Denier±10%; 289 Denier±5%; about 89 Denier±3%; about 90 Denier±10%; 290 Denier±5%; about 90 Denier±3%; about 91 Denier±10%; 291 Denier±5%; about 91 Denier±3%; about 92 Denier±10%; 292 Denier±5%; about 92 Denier±3%; about 93 Denier±10%; 293 Denier±5%; about 93 Denier±3%; about 94 Denier±10%; 294 Denier±5%; about 94 Denier±3%; about 95 Denier±10%; 295 Denier±5%; about 95 Denier±3%; about 96 Denier±10%; 296 Denier±5%; about 96 Denier±3%; about 97 Denier±10%; 297 Denier±5%; about 97 Denier±3%; about 98 Denier±10%; 298 Denier±5%; about 98 Denier±3%; about 99 Denier±10%; 299 Denier±5%; about 99 Denier±3%; about 100 Denier±10%; 300 Denier±5%; about 100 Denier±3%; about 101 Denier±10%; 301 Denier±5%; about 101 Denier±3%; about 102 Denier±10%; 302 Denier±5%; about 102 Denier±3%; about 103 Denier±10%; 303 Denier±5%; about 103 Denier±3%; about 104 Denier±10%; 304 Denier±5%; about 104 Denier±3%; about 105 Denier±10%; 305 Denier±5%; about 105 Denier±3%; about 106 Denier±10%; 306 Denier±5%; about 106 Denier±3%; about 107 Denier±10%;

307 Denier±5%; about 107 Denier±3%; about 108 Denier±10%; 308 Denier±5%; about 108 Denier±3%; about 109 Denier±10%; 309 Denier±5%; about 109 Denier±3%; about 110 Denier±10%; 310 Denier 5%; about 110 Denier±3%; about 111 Denier±10%; 311 Denier 5%; about 111 Denier±3%; about 112 Denier±10%; 312 Denier±5%; about 112 Denier±3%; about 113 Denier±10%; 313 Denier±5%; about 113 Denier±3%; about 114 Denier±10%; 314 Denier±5%; about 114 Denier±3%; about 115 Denier±10%; 315 Denier±5%; about 115 Denier±3%; about 116 Denier±10%; 316 Denier±5%; about 116 Denier±3%; about 117 Denier±10%; 317 Denier±5%; about 117 Denier±3%; about 118 Denier±10%; 318 Denier±5%; about 118 Denier±3%; about 119 Denier±10%; 319 Denier±5%; about 119 Denier±3%; about 120 Denier±10%; 320 Denier±5%; about 120 Denier±3%; about 121 Denier±10%; 321 Denier±5%; about 121 Denier±3%; about 122 Denier±10%; 322 Denier±5%; about 122 Denier±3%; about 123 Denier±10%; 323 Denier±5%; about 123 Denier±3%; about 124 Denier±10%; 324 Denier±5%; about 124 Denier±3%; about 125 Denier±10%; 325 Denier±5%; about 125 Denier±3%; about 126 Denier±10%; 326 Denier±5%; about 126 Denier±3%; about 127 Denier±10%; 327 Denier±5%; about 127 Denier±3%; about 128 Denier±10%; 328 Denier±5%; about 128 Denier±3%; about 129 Denier±10%; 329 Denier±5%; about 129 Denier±3%; about 130 Denier±10%; 330 Denier±5%; about 130 Denier±3%; about 131 Denier±10%; 331 Denier±5%; about 131 Denier±3%; about 132 Denier±10%; 332 Denier±5%; about 132 Denier±3%; about 133 Denier±10%; 333 Denier±5%; about 133 Denier±3%; about 134 Denier±10%; 334 Denier±5%; about 134 Denier±3%; about 135 Denier±10%; 335 Denier±5%; about 135 Denier±3%; about 136 Denier±10%; 336 Denier±5%; about 136 Denier±3%; about 137 Denier±10%; 337 Denier±5%; about 137 Denier±3%; about 138 Denier±10%; 338 Denier±5%; about 138 Denier±3%; about 139 Denier±10%; 339 Denier±5%; about 139 Denier±3%; about 140 Denier±10%; 340 Denier±5%; about 140 Denier±3%; about 141 Denier±10%; 341 Denier±5%; about 141 Denier±3%; about 142 Denier±10%; 342 Denier±5%; about 142 Denier±3%; about 143 Denier±10%; 343 Denier±5%; about 143 Denier±3%; about 144 Denier±10%; 344 Denier±5%; about 144 Denier±3%; about 145 Denier±10%; 345 Denier±5%; about 145 Denier±3%; about 146 Denier±10%; 346 Denier±5%; about 146 Denier±3%; about 147 Denier±10%; 347 Denier±5%; about 147 Denier±3%; about 148 Denier±10%; 348 Denier±5%; about 148 Denier±3%; about 149 Denier±10%; 349 Denier±5%; about 149 Denier±3%; about 150 Denier±10%; 350 Denier±5%; about 150 Denier±3%; about 151 Denier±10%; 351 Denier±5%; about 151 Denier±3%; about 152 Denier±10%; 352 Denier±5%; about 152 Denier±3%; about 153 Denier±10%; 353 Denier±5%; about 153 Denier±3%; about 154 Denier±10%; 354 Denier±5%; about 154 Denier±3%; about 155 Denier±10%; 355 Denier±5%; about 155 Denier±3%; about 156 Denier±10%; 356 Denier±5%; about 156 Denier±3%; about 157 Denier±10%; 357 Denier±5%; about 157 Denier±3%; about 158 Denier±10%; 358 Denier±5%; about 158 Denier±3%; about 159 Denier±10%; 359 Denier±5%; about 159 Denier±3%; about 160 Denier±10%; 360 Denier±5%; about 160 Denier±3%; about 161 Denier±10%; 361 Denier±5%; about 161 Denier±3%; about 162 Denier±10%; 362 Denier±5%; about 162 Denier±3%; about 163 Denier±10%; 363 Denier±5%; about 163 Denier±3%; about 164 Denier±10%; 364 Denier±5%; about 164 Denier±3%; about 165 Denier±10%; 365 Denier±5%; about 165 Denier±3%; about 166 Denier±10%; 366 Denier±5%; about 166 Denier±3%; about 167 Denier±10%; 367 Denier±5%; about 167 Denier±3%; about 168 Denier±10%; 368 Denier±5%; about 168 Denier±3%; about 169 Denier±10%; about 169 Denier±5%; about 169 Denier±3%; about 170 Denier±10%; 370 Denier±5%; about 170 Denier±3%; about 171 Denier±10%; 371 Denier±5%; about 171 Denier±3%; about 172 Denier±10%; 372 Denier±5%; about 172 Denier±3%; about 173 Denier±10%; 373 Denier±5%; about 173 Denier±3%; about 174 Denier±10%; 374 Denier±5%; about 174 Denier±3%; about 175 Denier±10%; 375 Denier±5%; about 175 Denier±3%; about 176 Denier±10%; 376 Denier±5%; about 176 Denier±3%; about 177 Denier±10%; 377 Denier±5%; about 177 Denier±3%; about 178 Denier±10%; 378 Denier±5%; about 178 Denier±3%; about 179 Denier±10%; about 179 Denier±5%; about 179 Denier±3%; about 180 Denier±10%; about 180 Denier±5%; about 180 Denier±3%; a range encompassing any of the foregoing values; or any combination of the foregoing values.

In a further aspect, the disclosed cooling yarn can comprise aluminum. Aluminum can be present in an amount of about 0.005 wt % to about 0.010 wt %; about 0.005 wt % to about 0.020 wt %; about 0.005 wt % to about 0.030 wt %; about 0.005 wt % to about 0.040 wt %; about 0.005 wt % to about 0.050 wt %; about 0.005 wt % to about 0.060 wt %; about 0.005 wt % to about 0.070 wt %; about 0.005 wt % to about 0.080 wt %; about 0.005 wt % to about 0.090 wt %; about 0.005 wt % to about 0.100 wt %; about 0.01 wt % to about 5 wt %; about 0.05 wt % to about 0.9 wt %; about 0.05 wt % to about 0.8 wt %; about 0.05 wt % to about 0.7 wt %; about 0.10 wt % to about 1.0 wt %; about 0.15 wt % to about 1.0 wt %; about 0.20 wt % to about 1.0 wt %; a sub-range within any of the foregoing ranges; or any set of values utilizing values within any of the foregoing ranges.

In a further aspect, the disclosed cooling yarn can comprise zinc oxide. Zinc oxide can be present in an amount of about 0.005 wt % to about 0.010 wt %; about 0.005 wt % to about 0.020 wt %; about 0.005 wt % to about 0.030 wt %; about 0.005 wt % to about 0.040 wt %; about 0.005 wt % to about 0.050 wt %; about 0.005 wt % to about 0.060 wt %; about 0.005 wt % to about 0.070 wt %; about 0.005 wt % to about 0.080 wt %; about 0.005 wt % to about 0.090 wt %; about 0.005 wt % to about 0.100 wt %; about 0.01 wt % to about 5 wt %; about 0.05 wt % to about 0.9 wt %; about 0.05 wt % to about 0.8 wt %; about 0.05 wt % to about 0.7 wt %; about 0.10 wt % to about 1.0 wt %; about 0.15 wt % to about 1.0 wt %; about 0.20 wt % to about 1.0 wt %; a sub-range within any of the foregoing ranges; or any set of values utilizing values within any of the foregoing ranges.

In a further aspect, the disclosed cooling yarn can comprise titanium dioxide. Titanium dioxide can be present in an amount of about 0.005 wt % to about 0.010 wt %; about 0.005 wt % to about 0.020 wt %; about 0.005 wt % to about 0.030 wt %; about 0.005 wt % to about 0.040 wt %; about 0.005 wt % to about 0.050 wt %; about 0.005 wt % to about 0.060 wt %; about 0.005 wt % to about 0.070 wt %; about 0.005 wt % to about 0.080 wt %; about 0.005 wt % to about 0.090 wt %; about 0.005 wt % to about 0.100 wt %; about 0.01 wt % to about 5 wt %; about 0.05 wt % to about 0.9 wt %; about 0.05 wt % to about 0.8 wt %; about 0.05 wt % to about 0.7 wt %; about 0.10 wt % to about 1.0 wt %; about 0.15 wt % to about 1.0 wt %; about 0.20 wt % to about 1.0 wt %; a sub-range within any of the foregoing ranges; or any set of values utilizing values within any of the foregoing ranges.

In a further aspect, the disclosed cooling yarn can comprise calcium carbonate. Calcium carbonate can be present in an amount of about 0.005 wt % to about 0.010 wt %; about 0.005 wt % to about 0.020 wt %; about 0.005 wt % to about 0.030 wt %; about 0.005 wt % to about 0.040 wt %; about 0.005 wt % to about 0.050 wt %; about 0.005 wt % to about 0.060 wt %; about 0.005 wt % to about 0.070 wt %; about 0.005 wt % to about 0.080 wt %; about 0.005 wt % to about 0.090 wt %; about 0.005 wt % to about 0.100 wt %; about 0.01 wt % to about 5 wt %; about 0.05 wt % to about 0.9 wt %; about 0.05 wt % to about 0.8 wt %; about 0.05 wt % to about 0.7 wt %; about 0.10 wt % to about 1.0 wt %; about 0.15 wt % to about 1.0 wt %; about 0.20 wt % to about 1.0 wt %; a sub-range within any of the foregoing ranges; or any set of values utilizing values within any of the foregoing ranges.

In a further aspect, the disclosed cooling yarn can comprise aluminum, zinc oxide, titanium dioxide, calcium carbonate, and combinations thereof. The aluminum, zinc oxide, titanium dioxide, and calcium carbonate can each be independently present in an amount of about 0.005 wt % to about 0.010 wt %; about 0.005 wt % to about 0.020 wt %; about 0.005 wt % to about 0.030 wt %; about 0.005 wt % to about 0.040 wt %; about 0.005 wt % to about 0.050 wt %; about 0.005 wt % to about 0.060 wt %; about 0.005 wt % to about 0.070 wt %; about 0.005 wt % to about 0.080 wt %; about 0.005 wt % to about 0.090 wt %; about 0.005 wt % to about 0.100 wt %; about 0.01 wt % to about 5 wt %; about 0.05 wt % to about 0.9 wt %; about 0.05 wt % to about 0.8 wt %; about 0.05 wt % to about 0.7 wt %; about 0.10 wt % to about 1.0 wt %; about 0.15 wt % to about 1.0 wt %; about 0.20 wt % to about 1.0 wt %; a sub-range within any of the foregoing ranges; or any set of values utilizing values within any of the foregoing ranges.

The weight percent for a cooling composition in a cooling filament yarn, e.g., a cooling composition comprising aluminum, calcium carbonate, titanium dioxide, zinc oxide, and combinations thereof, can be the weight percent based upon elemental analysis. In a particular instance, the elemental analysis can be carried out using field emission scanning electron microscopy with a segmented backscatter detector, an Everhart-Thornley electron detector, in-lens electron detectors, or combinations thereof. In some specific instances, the elemental analysis can be carried out using field emission scanning electron microscopy with energy-dispersive spectroscopy.

In a further aspect, a cooling filament yarn comprises zinc oxide having a particle size of from about 1 nm to about 1000 nm present in the yarn in an amount of from about 0.01 wt % to about 10 wt % and polymer, e.g., a polyamide or polyester, present in an amount of from about 99.99 wt % to about 90 wt %; aluminum having a particle size of from about 1 nm to about 1000 nm present in the yarn in an amount of from about 0.01 wt % to about 10 wt % and polymer, e.g., a polyamide or polyester, present in an amount of from about 99.99 wt % to about 90 wt %; titanium dioxide having a particle size of from about 10 nm to about 2000 nm present in the yarn in an amount of from about 0.01 wt % to about 10 wt % and polymer, e.g., a polyamide or polyester, present in an amount of from about 99.99 wt % to about 90 wt %; calcium carbonate having a particle size of from about 10 nm to about 2000 nm present in the yarn in an amount of from about 0.01 wt % to about 10 wt % and polymer, e.g., a polyamide or polyester, present in an amount of from about 99.99 wt % to about 90 wt %; or combinations thereof.

In a further aspect, a cooling filament yarn comprises zinc oxide having a particle size of from about 1 nm to about 1000 nm present in the yarn in an amount of from about 0.01 wt % to about 10 wt % and polymer, e.g., a polyamide or polyester, present in an amount of from about 99.99 wt % to about 90 wt %.

In a further aspect, a cooling filament yarn comprises aluminum having a particle size of from about 1 nm to about 1000 nm present in the yarn in an amount of from about 0.01 wt % to about 10 wt % and polymer, e.g., a polyamide or polyester, present in an amount of from about 99.99 wt % to about 90 wt %.

In a further aspect, a cooling filament yarn comprises titanium dioxide having a particle size of from about 10 nm to about 2000 nm present in the yarn in an amount of from about 0.01 wt % to about 10 wt % and polymer, e.g., a polyamide or polyester, present in an amount of from about 99.99 wt % to about 90 wt %.

In a further aspect, a cooling filament yarn comprises calcium carbonate having a particle size of from about 10 nm to about 2000 nm present in the yarn in an amount of from about 0.01 wt % to about 10 wt % and polymer, e.g., a polyamide or polyester, present in an amount of from about 99.99 wt % to about 90 wt %.

In a further aspect, a cooling filament yarn comprises zinc oxide having a particle size of from about 1 nm to about 100 nm present in the yarn in an amount of from about 0.01 wt % to about 3 wt % and polymer, e.g., a polyamide or polyester, present in an amount of from about 99.99 wt % to about 97 wt %; aluminum having a particle size of from about 1 nm to about 100 nm present in the yarn in an amount of from about 0.01 wt % to about 3 wt % and polymer, e.g., a polyamide or polyester, present in an amount of from about 99.99 wt % to about 97 wt %; titanium dioxide having a particle size of from about 20 nm to about 1000 nm present in the yarn in an amount of from about 0.01 wt % to about 5 wt % and polymer, e.g., a polyamide or polyester, present in an amount of from about 99.99 wt % to about 95 wt %; calcium carbonate having a particle size of from about 20 nm to about 1000 nm present in the yarn in an amount of from about 0.01 wt % to about 5 wt % and polymer, e.g., a polyamide or polyester, present in an amount of from about 99.99 wt % to about 95 wt %; or combinations thereof.

In a further aspect, a cooling filament yarn comprises zinc oxide having a particle size of from about 1 nm to about 100 nm present in the yarn in an amount of from about 0.01 wt % to about 3 wt % and polymer, e.g., a polyamide or polyester, present in an amount of from about 99.99 wt % to about 97 wt %

In a further aspect, a cooling filament yarn comprises aluminum having a particle size of from about 1 nm to about 100 nm present in the yarn in an amount of from about 0.01 wt % to about 3 wt % and polymer, e.g., a polyamide or polyester, present in an amount of from about 99.99 wt % to about 97 wt %.

In a further aspect, a cooling filament yarn comprises titanium dioxide having a particle size of from about 20 nm to about 1000 nm present in the yarn in an amount of from about 0.01 wt % to about 5 wt % and polymer, e.g., a polyamide or polyester, present in an amount of from about 99.99 wt % to about 95 wt %.

In a further aspect, a cooling filament yarn comprises calcium carbonate having a particle size of from about 20 nm to about 1000 nm present in the yarn in an amount of from about 0.01 wt % to about 5 wt % and polymer, e.g., a polyamide or polyester, present in an amount of from about 99.99 wt % to about 95 wt %.

In a further aspect, a cooling filament yarn comprises zinc oxide having a particle size of from about 1 nm to about 50 nm present in the yarn in an amount of from about 0.01 wt % to about 1 wt % and polymer, e.g., a polyamide or polyester, present in an amount of from about 99.99 wt % to about 99 wt %; titanium dioxide having a particle size of from about 1 nm to about 50 nm present in the yarn in an amount of from about 0.01 wt % to about 1 wt % and polymer, e.g., a polyamide or polyester, present in an amount of from about 99.99 wt % to about 99 wt %; titanium dioxide having a particle size of from about 30 nm to about 400 nm present in the yarn in an amount of from about 0.01 wt % to about 3 wt % and polymer, e.g., a polyamide or polyester, present in an amount of from about 99.99 wt % to about 97 wt %; calcium carbonate having a particle size of from about 30 nm to about 400 nm present in the yarn in an amount of from about 0.01 wt % to about 3 wt % and polymer, e.g., a polyamide or polyester, present in an amount of from about 99.99 wt % to about 97 wt %; or combinations thereof.

In a further aspect, a cooling filament yarn comprises zinc oxide having a particle size of from about 1 nm to about 50 nm present in the yarn in an amount of from about 0.01 wt % to about 1 wt % and polymer, e.g., a polyamide or polyester, present in an amount of from about 99.99 wt % to about 99 wt %.

In a further aspect, a cooling filament yarn comprises aluminum having a particle size of from about 1 nm to about 50 nm present in the yarn in an amount of from about 0.01 wt % to about 1 wt % and polymer, e.g., a polyamide or polyester, present in an amount of from about 99.99 wt % to about 99 wt %.

In a further aspect, a cooling filament yarn comprises titanium dioxide having a particle size of from about 30 nm to about 400 nm present in the yarn in an amount of from about 0.01 wt % to about 3 wt % and polymer, e.g., a polyamide or polyester, present in an amount of from about 99.99 wt % to about 97 wt %.

In a further aspect, a cooling filament yarn comprises calcium carbonate having a particle size of from about 30 nm to about 400 nm present in the yarn in an amount of from about 0.01 wt % to about 3 wt % and polymer, e.g., a polyamide or polyester, present in an amount of from about 99.99 wt % to about 97 wt %.

H. Cooling Fabrics

In various aspects, the disclosure relates to a cooling fabric. The disclosed cooling fabric can be a knit or a woven fabric comprising a disclosed cooling yarn.

In a further aspect, the disclosed cooling fabric has a Qmax value of about 0.15 to about 0.50 when determined in accordance with FTTS-FA-019 as specified by Committee of Conformity Assessment of Accreditation and Certification on Functional and Technical Textiles (Taiwan). In a still further aspect, the disclosed cooling fabric has a Qmax value of about 0.17 to about 0.25 when determined in accordance with FTTS-FA-019 as specified by Committee of Conformity Assessment of Accreditation and Certification on Functional and Technical Textiles (Taiwan). In a yet further aspect, the disclosed cooling fabric has a Qmax value of about 0.20 to about 0.35 when determined in accordance with FTTS-FA-019 as specified by Committee of Conformity Assessment of Accreditation and Certification on Functional and Technical Textiles (Taiwan). In an even further aspect, the disclosed cooling fabric has a Qmax value of about 0.20 to about 0.30 when determined in accordance with FTTS-FA-019 as specified by Committee of Conformity Assessment of Accreditation and Certification on Functional and Technical Textiles (Taiwan).

In a further aspect, the disclosed cooling fabric has a Qmax value, when determined in accordance with FTTS-FA-019 as specified by Committee of Conformity Assessment of Accreditation and Certification on Functional and Technical Textiles (Taiwan), of about 0.10±10%; about 0.10±5%; about 0.10±3%; about 0.11±10%; about 0.11±5%; about 0.11±3%; about 0.12±10%; about 0.12±5%; about 0.12±3%; about 0.13±10%; about 0.13±5%; about 0.13±3%; about 0.14±10%; about 0.14±5%; about 0.14±3%; about 0.15±10%; about 0.15±5%; about 0.15±3%; about 0.16±10%; about 0.16±5%; about 0.16±3%; about 0.17±10%; about 0.17±5%; about 0.17±3%; about 0.18±10%; about 0.18±5%; about 0.18±3%; about 0.19±10%; about 0.19±5%; about 0.19±3%; about 0.20±10%; about 0.20±5%; about 0.20±3%; about 0.21±10%; about 0.21±5%; about 0.21±3%; about 0.22±10%; about 0.22±5%; about 0.22±3%; about 0.23±10%; about 0.23±5%; about 0.23±3%; about 0.24±10%; about 0.24±5%; about 0.24±3%; about 0.25±10%; about 0.25±5%; about 0.25±3%; about 0.26±10%; about 0.26±5%; about 0.26±3%; about 0.27±10%; about 0.27±5%; about 0.27±3%; about 0.28±10%; about 0.28±5%; about 0.28±3%; about 0.29±10%; about 0.29±5%; about 0.29±3 about 0.30±10%; about 0.30±5%; about 0.30±3%; about 0.31±10%; about 0.31±5%; about 0.31±3%; about 0.32±10%; about 0.32±5%; about 0.32±3%; about 0.33±10%; about 0.33±5%; about 0.33±3%; about 0.34±10%; about 0.34±5%; about 0.34±3%; about 0.35±10%; about 0.35±5%; about 0.35±3%; about 0.36±10%; about 0.36±5%; about 0.36±3%; about 0.37±10%; about 0.37±5%; about 0.37±3%; about 0.38±10%; about 0.38±5%; about 0.38±3%; about 0.39±10%; about 0.39±5%; about 0.39±3%; about 0.40±10%; about 0.40±5%; about 0.40±3%; a range utilizing any of the foregoing values; a sub-range with a range utilizing any of the foregoing values; or any set of values utilizing the foregoing values.

In a further aspect, the disclosed cooling fabric has a Qmax value, when determined in accordance with FTTS-FA-019 as specified by Committee of Conformity Assessment of Accreditation and Certification on Functional and Technical Textiles (Taiwan), that is about 20% greater than the Qmax value for a reference fabric. In this context, it is to be understood that the reference fabric consists essentially the same yarns, e.g., same filament yarns, having a fabric weight that is ±10% of the fabric, and the same weave pattern as the fabric, but without a cooling material. In a still further aspect, the disclosed cooling fabric has a Qmax value, when determined in accordance with FTTS-FA-019 as specified by Committee of Conformity Assessment of Accreditation and Certification on Functional and Technical Textiles (Taiwan), that is about 25% greater than the Qmax value for a reference fabric. In a yet further aspect, the disclosed cooling fabric has a Qmax value, when determined in accordance with FTTS-FA-019 as specified by Committee of Conformity Assessment of Accreditation and Certification on Functional and Technical Textiles (Taiwan), that is about 30% greater than the Qmax value for a reference fabric.

In a further aspect, the disclosed cooling fabric can comprise aluminum. Aluminum can be present in an amount of about 0.005 wt % to about 0.010 wt %; about 0.005 wt % to about 0.020 wt %; about 0.005 wt % to about 0.030 wt %; about 0.005 wt % to about 0.040 wt %; about 0.005 wt % to about 0.050 wt %; about 0.005 wt % to about 0.060 wt %; about 0.005 wt % to about 0.070 wt %; about 0.005 wt % to about 0.080 wt %; about 0.005 wt % to about 0.090 wt %; about 0.005 wt % to about 0.100 wt %; about 0.01 wt % to about 5 wt %; about 0.05 wt % to about 0.9 wt %; about 0.05 wt % to about 0.8 wt %; about 0.05 wt % to about 0.7 wt %; about 0.10 wt % to about 1.0 wt %; about 0.15 wt % to about 1.0 wt %; about 0.20 wt % to about 1.0 wt %; a sub-range within any of the foregoing ranges; or any set of values utilizing values within any of the foregoing ranges.

In a further aspect, the disclosed cooling fabric can comprise zinc oxide. Zinc oxide can be present in an amount of about 0.005 wt % to about 0.010 wt %; about 0.005 wt % to about 0.020 wt %; about 0.005 wt % to about 0.030 wt %; about 0.005 wt % to about 0.040 wt %; about 0.005 wt % to about 0.050 wt %; about 0.005 wt % to about 0.060 wt %; about 0.005 wt % to about 0.070 wt %; about 0.005 wt % to about 0.080 wt %; about 0.005 wt % to about 0.090 wt %; about 0.005 wt % to about 0.100 wt %; about 0.01 wt % to about 5 wt %; about 0.05 wt % to about 0.9 wt %; about 0.05 wt % to about 0.8 wt %; about 0.05 wt % to about 0.7 wt %; about 0.10 wt % to about 1.0 wt %; about 0.15 wt % to about 1.0 wt %; about 0.20 wt % to about 1.0 wt %; a sub-range within any of the foregoing ranges; or any set of values utilizing values within any of the foregoing ranges.

In a further aspect, the disclosed cooling fabric can comprise titanium dioxide. Titanium dioxide can be present in an amount of about 0.005 wt % to about 0.010 wt %; about 0.005 wt % to about 0.020 wt %; about 0.005 wt % to about 0.030 wt %; about 0.005 wt % to about 0.040 wt %; about 0.005 wt % to about 0.050 wt %; about 0.005 wt % to about 0.060 wt %; about 0.005 wt % to about 0.070 wt %; about 0.005 wt % to about 0.080 wt %; about 0.005 wt % to about 0.090 wt %; about 0.005 wt % to about 0.100 wt %; about 0.01 wt % to about 5 wt %; about 0.05 wt % to about 0.9 wt %; about 0.05 wt % to about 0.8 wt %; about 0.05 wt % to about 0.7 wt %; about 0.10 wt % to about 1.0 wt %; about 0.15 wt % to about 1.0 wt %; about 0.20 wt % to about 1.0 wt %; a sub-range within any of the foregoing ranges; or any set of values utilizing values within any of the foregoing ranges.

In a further aspect, the disclosed cooling fabric can comprise calcium carbonate. Calcium carbonate can be present in an amount of about 0.005 wt % to about 0.010 wt %; about 0.005 wt % to about 0.020 wt %; about 0.005 wt % to about 0.030 wt %; about 0.005 wt % to about 0.040 wt %; about 0.005 wt % to about 0.050 wt %; about 0.005 wt % to about 0.060 wt %; about 0.005 wt % to about 0.070 wt %; about 0.005 wt % to about 0.080 wt %; about 0.005 wt % to about 0.090 wt %; about 0.005 wt % to about 0.100 wt %; about 0.01 wt % to about 5 wt %; about 0.05 wt % to about 0.9 wt %; about 0.05 wt % to about 0.8 wt %; about 0.05 wt % to about 0.7 wt %; about 0.10 wt % to about 1.0 wt %; about 0.15 wt % to about 1.0 wt %; about 0.20 wt % to about 1.0 wt %; a sub-range within any of the foregoing ranges; or any set of values utilizing values within any of the foregoing ranges.

In a further aspect, the disclosed cooling fabric can comprise aluminum, zinc oxide, titanium dioxide, calcium carbonate, or combinations thereof. The aluminum, zinc oxide, titanium dioxide, and calcium carbonate, can each be independently present in an amount of about 0.005 wt % to about 0.010 wt %; about 0.005 wt % to about 0.020 wt %; about 0.005 wt % to about 0.030 wt %; about 0.005 wt % to about 0.040 wt %; about 0.005 wt % to about 0.050 wt %; about 0.005 wt % to about 0.060 wt %; about 0.005 wt % to about 0.070 wt %; about 0.005 wt % to about 0.080 wt %; about 0.005 wt % to about 0.090 wt %; about 0.005 wt % to about 0.100 wt %; about 0.01 wt % to about 5 wt %; about 0.05 wt % to about 0.9 wt %; about 0.05 wt % to about 0.8 wt %; about 0.05 wt % to about 0.7 wt %; about 0.10 wt % to about 1.0 wt %; about 0.15 wt % to about 1.0 wt %; about 0.20 wt % to about 1.0 wt %; a sub-range within any of the foregoing ranges; or any set of values utilizing values within any of the foregoing ranges.

The weight percent for a cooling material in a disclosed cooling fabric, e.g., a cooling composition comprising aluminum, zinc oxide, titanium dioxide, calcium carbonate, and combinations thereof, can be the weight percent based upon elemental analysis. In a particular instance, the elemental analysis can be carried out using field emission scanning electron microscopy with a segmented backscatter detector, an Everhart-Thornley electron detector, in-lens electron detectors, or combinations thereof. In some specific instances, the elemental analysis can be carried out using field emission scanning electron microscopy with energy-dispersive spectroscopy.

I. Methods of Preparing Cooling Films

In various aspects, the present disclosure pertains to methods of preparing a disclosed cooling film can be prepared by a sputtering process. As known to the skilled artisan, sputtering is a physical technique used to deposit particles, e.g., nanoparticles, onto a substrate, e.g., a film, a sheet, or other material. Without wishing to be bound by a particular theory, it is believed that sputtering occurs when an ionized gas molecule is used to displace atoms of a specific material. These atoms then bond at the atomic level to a substrate and create a thin film. Several types of sputtering processes exist, including ion beam, diode, magnetron, and gas flow sputtering.

In various aspects, the present disclosure pertains to methods of forming a cooling film, the methods comprising: placing a plurality of sputtering targets in a sputtering chamber of sputtering device; placing a substrate in a substrate holder disposed above the plurality of sputtering targets; applying a DC magnetic field to the sputtering targets; and depositing a layer of sputtered material on a surface of the substrate; wherein the plurality of sputtering targets comprise a sputtering material selected from aluminum, zinc oxide, and combinations thereof; wherein the layer of sputtered material comprises nanoparticles of a cooling composition; wherein the cooling composition comprises a material selected from aluminum, zinc oxide, and combinations thereof; and wherein the substrate comprises a polymer; thereby forming a cooling film comprising a substrate having thereon a layer of sputtered material.

Magnetron sputtering coating is a vacuum coating process that is categorized under physical vapor deposition (PVD). The basic mechanism of magnetron sputtering technique consists of a target or a metal precursor (which is made of the desired material to be deposited on the film), which is bombarded with high energy ions of inert gases (such as argon, helium). The forceful collision of these energetic ions with the target ejects target metal atoms into space. These metal atoms are then deposited on the substrate material forming a metallic film. Since sputtering takes place in a high-energy environment, it creates a virtually an unbreakable bond between the film and its substrate at the atomic level, creating one of the thinnest, most uniform, and most cost-effective films possible In the disclosed methods of preparing a disclosed cooling film, one or more cooling materials is fabricated into a sputtering target that can be utilized in a sputtering apparatus, e.g., a magnetron sputtering apparatus. A target can be prepared by compression molding, or if the cooling material is meltable, such as a metal, a target can be prepared by liquid molding. One or more targets, independently comprising one or more cooling material is placed into a suitable sputtering apparatus into which can be feed a suitable substrate. An exemplary sputtering method is disclosed herein below in the Examples.

In various aspects, the disclosed methods of preparing a disclosed cooling film comprise providing a substrate, e.g., a film, comprising a suitable polymer such as a polyester polymer, a polyamide polymer, a polyolefin polymer, a polyurethane polymer, a fluoropolymer, mixtures or combinations thereof, or copolymers thereof. In a further aspect, the substrate comprises a polyolefin such as a polyethylene, a polypropylene, or combinations thereof. In other aspects, the substrate comprises a fluoropolymer such as a polytetrafluoroethylene (PTFE).

In a further aspect, the disclosed methods of preparing a disclosed cooling film comprise providing a substrate, e.g., a film, comprising a suitable polymer such as a polyester polymer, including, but not limited to, a polyethylene terephthalate, a polytrimethylene terephthalate, or combinations thereof. In a further aspect, the polyester can comprise a polyethylene terephthalate. In further aspects, the polyester can comprise a polytrimethylene terephthalate. In still further aspects, the polyester is a polyeseter co-polymer comprising a polyethylene terephthalate, a polytrimethylene terephthalate, or combinations thereof. In a yet further aspect, the polyester can comprise a co-polymer comprising polyethylene terephthalate. In a further aspect, the polyester can comprise a co-polymer comprising polytrimethylene terephthalate.

In a further aspect, the disclosed methods of preparing a disclosed cooling film comprise providing a substrate, e.g., a film, comprising a suitable polymer such as polyamide polymer, including, but not limited to, a nylon 6, nylon 4/6, nylon 6/6, nylon 6/10, nylon 6/12, nylon 11, nylon 12, or combinations thereof. In a further aspect, the polyamide can comprise a nylon 6/6. In a still further aspect, the polyamide is a polyamide co-polymer comprising nylon 6, nylon 4/6, nylon 6/6, nylon 6/10, nylon 6/12, nylon 11, nylon 12, or combinations thereof. In a yet further aspect, the polyamide is a polyamide co-polymer comprising nylon 6/6.

In a further aspect, the substrate, e.g., a film, used in the disclosed methods of preparing a disclosed cooling film utilize a substrate having a thickness that is convenient for use in sputtering. In a still further aspect, the substrate, e.g., a film, can have a thickness of from about 10 μm to about 100 μm. In a yet further aspect, the substrate, e.g., a film, can have a thickness that is about 10 μm, about 11 μm, about 12 μm, about 13 μm, about 14 μm, about 15 μm, about 16 μm, about 17 μm, about 18 μm, about 19 μm, about 20 μm, about 21 μm, about 22 μm, about 23 μm, about 24 μm, about 25 μm, about 26 μm, about 27 μm, about 28 μm, about 29 μm, about 30 μm, about 31 μm, about 32 μm, about 33 μm, about 34 μm, about 35 μm, about 36 μm, about 37 μm, about 38 μm, about 39 μm, about 40 μm, about 41 μm, about 42 μm, about 43 μm, about 44 μm, about 45 μm, about 46 μm, about 47 μm, about 48 μm, about 49 μm, about 50 μm; or any combination of the foregoing values; or a range encompassing any of the foregoing values.

In a further aspect, the disclosed methods of preparing a disclosed cooling film provide at least one layer of cooling material on at least one surface substrate such that the layer of cooling material has a thickness of about 1 nm to about 100 nm. In a still further aspect, the cooling material layer deposited on the substrate has a thickness of about 1 nm to about 50 nm. In a yet further aspect, the cooling material layer deposited on the substrate has a thickness of about 1 nm to about 40 nm. In an even further aspect, the nanoparticles have a size of about 1 nm; about 2 nm; about 3 nm; about 4 nm; about 5 nm; about 6 nm; about 7 nm; about 8 nm; about 9 nm; about 10 nm; about 11 nm; about 12 nm; about 13 nm; about 14 nm; about 15 nm; about 16 nm; about 17 nm; about 18 nm; about 19 nm; about 20 nm; about 21 nm; about 22 nm; about 23 nm; about 24 nm; about 25 nm; about 26 nm; about 27 nm; about 28 nm; about 29 nm; about 30 nm; about 31 nm; about 32 nm; about 33 nm; about 34 nm; about 35 nm; about 36 nm; about 37 nm; about 38 nm; about 39 nm; about 40 nm; about 41 nm; about 42 nm; about 43 nm; about 44 nm; about 45 nm; about 46 nm; about 47 nm; about 48 nm; about 49 nm; about 50 nm; about 51 nm; about 52 nm; about 53 nm; about 54 nm; about 55 nm; about 56 nm; about 57 nm; about 58 nm; about 59 nm; about 60 nm; about 61 nm; about 62 nm; about 63 nm; about 64 nm; about 65 nm; about 66 nm; about 67 nm; about 68 nm; about 69 nm; about 70 nm; about 71 nm; about 72 nm; about 73 nm; about 74 nm; about 75 nm; about 76 nm; about 77 nm; about 78 nm; about 79 nm; about 80 nm; about 81 nm; about 82 nm; about 83 nm; about 84 nm; about 85 nm; about 86 nm; about 87 nm; about 88 nm; about 89 nm; about 90 nm; about 91 nm; about 92 nm; about 93 nm; about 94 nm; about 95 nm; about 96 nm; about 97 nm; about 98 nm; about 99 nm; about 100 nm; a range utilizing any of the foregoing values; a sub-range with a range utilizing any of the foregoing values; or any set of values utilizing the foregoing values.

In a further aspect, the cooling material layer deposited using the disclosed the disclosed methods of preparing a disclosed cooling film deposit on the substrate particles having a particle size of about 1 nm to about 100 nm. In a still further aspect, the cooling material layer deposited on the substrate comprises particles having a particle size of about 1 nm to about 50 nm. In a yet further aspect, the cooling material layer deposited on the substrate comprises particles having a particle size of about 1 nm to about 40 nm. In an even further aspect, the nanoparticles have a size of about 1 nm; about 2 nm; about 3 nm; about 4 nm; about 5 nm; about 6 nm; about 7 nm; about 8 nm; about 9 nm; about 10 nm; about 11 nm; about 12 nm; about 13 nm; about 14 nm; about 15 nm; about 16 nm; about 17 nm; about 18 nm; about 19 nm; about 20 nm; about 21 nm; about 22 nm; about 23 nm; about 24 nm; about 25 nm; about 26 nm; about 27 nm; about 28 nm; about 29 nm; about 30 nm; about 31 nm; about 32 nm; about 33 nm; about 34 nm; about 35 nm; about 36 nm; about 37 nm; about 38 nm; about 39 nm; about 40 nm; about 41 nm; about 42 nm; about 43 nm; about 44 nm; about 45 nm; about 46 nm; about 47 nm; about 48 nm; about 49 nm; about 50 nm; about 51 nm; about 52 nm; about 53 nm; about 54 nm; about 55 nm; about 56 nm; about 57 nm; about 58 nm; about 59 nm; about 60 nm; about 61 nm; about 62 nm; about 63 nm; about 64 nm; about 65 nm; about 66 nm; about 67 nm; about 68 nm; about 69 nm; about 70 nm; about 71 nm; about 72 nm; about 73 nm; about 74 nm; about 75 nm; about 76 nm; about 77 nm; about 78 nm; about 79 nm; about 80 nm; about 81 nm; about 82 nm; about 83 nm; about 84 nm; about 85 nm; about 86 nm; about 87 nm; about 88 nm; about 89 nm; about 90 nm; about 91 nm; about 92 nm; about 93 nm; about 94 nm; about 95 nm; about 96 nm; about 97 nm; about 98 nm; about 99 nm; about 100 nm; a range utilizing any of the foregoing values; a sub-range with a range utilizing any of the foregoing values; or any set of values utilizing the foregoing values.

In an aspect, the cooling film prepared by the disclosed methods of preparing a cooling film can comprise the one or more cooling materials in a weight percent amount of about 0.001 wt % to about 5 wt % based on the total weight of the substrate and cooling materials. In a further aspect, the cooling film can comprise the one or more cooling materials in a weight percent, based on the total weight of the substrate and cooling materials, of about 0.001 wt %; about 0.002 wt %; about 0.003 wt %; about 0.004 wt %; about 0.005 wt %; about 0.006 wt %; about 0.007 wt %; about 0.008 wt %; about 0.009 wt %; about 0.010 wt %; about 0.02 wt %; about 0.03 wt %; about 0.04 wt %; about 0.05 wt %; about 0.06 wt %; about 0.07 wt %; about 0.08 wt %; about 0.09 wt %; about 0.10 wt %; about 0.11 wt %; about 0.12 wt %; about 0.13 wt %; about 0.14 wt %; about 0.15 wt %; about 0.16 wt %; about 0.17 wt %; about 0.18 wt %; about 0.19 wt %; about 0.20 wt %; about 0.21 wt %; about 0.22 wt %; about 0.23 wt %; about 0.24 wt %; about 0.25 wt %; about 0.26 wt %; about 0.27 wt %; about 0.28 wt %; about 0.29 wt %; 0.30 wt %; about 0.31 wt %; about 0.32 wt %; about 0.33 wt %; about 0.34 wt %; about 0.35 wt %; about 0.36 wt %; about 0.37 wt %; about 0.38 wt %; about 0.39 wt %; about 0.40 wt %; about 0.41 wt %; about 0.42 wt %; about 0.43 wt %; about 0.44 wt %; about 0.45 wt %; about 0.46 wt %; about 0.47 wt %; about 0.48 wt %; about 0.49 wt %; about 0.50 wt %; about 0.51 wt %; about 0.52 wt %; about 0.53 wt %; about 0.54 wt %; about 0.55 wt %; about 0.56 wt %; about 0.57 wt %; about 0.58 wt %; about 0.59 wt %; about 0.60 wt %; about 0.61 wt %; about 0.62 wt %; about 0.63 wt %; about 0.64 wt %; about 0.65 wt %; about 0.66 wt %; about 0.67 wt %; about 0.68 wt %; about 0.69 wt %; about 0.70 wt %; about 0.71 wt %; about 0.72 wt %; about 0.73 wt %; about 0.74 wt %; about 0.75 wt %; about 0.76 wt %; about 0.77 wt %; about 0.78 wt %; about 0.79 wt %; about 0.80 wt %; about 0.81 wt %; about 0.82 wt %; about 0.83 wt %; about 0.84 wt %; about 0.85 wt %; about 0.86 wt %; about 0.87 wt %; about 0.88 wt %; about 0.89 wt %; about 0.90 wt %; about 0.91 wt %; about 0.92 wt %; about 0.93 wt %; about 0.94 wt %; about 0.95 wt %; about 0.96 wt %; about 0.97 wt %; about 0.98 wt %; about 0.99 wt %; about 1.0 wt %; about 1.1 wt %; about 1.2 wt %; about 1.3 wt %; about 1.4 wt %; about 1.5 wt %; about 1.6 wt %; about 1.7 wt %; about 1.8 wt %; about 1.9 wt %; about 2.0 wt %; about 2.1 wt %; about 2.2 wt %; about 2.3 wt %; about 2.4 wt %; about 2.5 wt %; about 2.6 wt %; about 2.7 wt %; about 2.8 wt %; about 2.9 wt %; about 3.0 wt %; about 3.1 wt %; about 3.2 wt %; about 3.3 wt %; about 3.4 wt %; about 3.5 wt %; about 3.6 wt %; about 3.7 wt %; about 3.8 wt %; about 3.9 wt %; about 4.0 wt %; about 4.1 wt %; about 4.2 wt %; about 4.3 wt %; about 4.4 wt %; about 4.5 wt %; about 4.6 wt %; about 4.7 wt %; about 4.8 wt %; about 4.9 wt %; about 5.0 wt %; a range utilizing any of the foregoing values; a sub-range with a range utilizing any of the foregoing values; or any set of values utilizing the foregoing values.

As discussed above, a disclosed cooling film prepared by the disclosed methods of preparing a cooling film can have deposited thereon one more cooling materials, as disclosed herein above, deposited thereon. For example, a disclosed cooling film can have deposited thereon one cooling material deposited thereon, e.g., zinc oxide or aluminum, or two cooling materials, e.g., zinc oxide and aluminum, deposited thereon.

In a further aspect, a disclosed cooling film prepared by the disclosed methods of preparing a cooling film comprises zinc oxide having a particle size of from about 1 to about 1000 nm present on the cooling in an amount of from about 0.01 wt % to about 50 wt % or from about 0.01 vol % to about 50 vol %, with the polymer of the substrate representing from about 99.99 wt % to about 50 wt % of the cooling film.

In a further aspect, a disclosed cooling film prepared by the disclosed methods of preparing a cooling film comprises aluminum having a particle size of from about 1 to about 1000 nm present on the cooling in an amount of from about 0.01 wt % to about 50 wt % or from about 0.01 vol % to about 50 vol %, with the polymer of the substrate representing from about 99.99 wt % to about 50 wt % of the cooling film.

In a further aspect, a disclosed cooling film prepared by the disclosed methods of preparing a cooling film comprises zinc oxide and aluminum, each independently having a particle size of from about 1 to about 1000 nm present on the cooling in an amount of from about 0.01 wt % to about 50 wt % or from about 0.01 vol % to about 50 vol %, with the polymer of the substrate representing from about 99.99 wt % to about 50 wt % of the cooling film.

In a further aspect, a disclosed cooling film prepared by the disclosed methods of preparing a cooling film comprises zinc oxide having a particle size of from about 1 to about 100 nm present on the cooling in an amount of from about 0.01 wt % to about 10 wt % or from about 0.01 vol % to about 10 vol %, with the polymer of the substrate representing from about 99.99 wt % to about 90 wt % of the cooling film.

In a further aspect, a disclosed cooling film prepared by the disclosed methods of preparing a cooling film comprises aluminum having a particle size of from about 1 to about 100 nm present on the cooling in an amount of from about 0.01 wt % to about 10 wt % or from about 0.01 vol % to about 10 vol %, with the polymer of the substrate representing from about 99.99 wt % to about 90 wt % of the cooling film.

In a further aspect, a disclosed cooling film prepared by the disclosed methods of preparing a cooling film comprises zinc oxide and aluminum, each independently having a particle size of from about 1 to about 100 nm present on the cooling in an amount of from about 0.01 wt % to about 10 wt % or from about 0.01 vol % to about 10 vol %, with the polymer of the substrate representing from about 99.99 wt % to about 90 wt % of the cooling film.

In a further aspect, a disclosed cooling film prepared by the disclosed methods of preparing a cooling film comprises zinc oxide having a particle size of from about 1 to about 50 nm present on the cooling in an amount of from about 0.01 wt % to about 1 wt % or from about 0.01 vol % to about 1 vol %, with the polymer of the substrate representing from about 99.99 wt % to about 99 wt % of the cooling film.

In a further aspect, a disclosed cooling film prepared by the disclosed methods of preparing a cooling film comprises aluminum having a particle size of from about 1 to about 50 nm present on the cooling in an amount of from about 0.01 wt % to about 1 wt % or from about 0.01 vol % to about 1 vol %, with the polymer of the substrate representing from about 99.99 wt % to about 99 wt % of the cooling film.

In a further aspect, a disclosed cooling film prepared by the disclosed methods of preparing a cooling film comprises zinc oxide and aluminum, each independently having a particle size of from about 1 to about 50 nm present on the cooling in an amount of from about 0.01 wt % to about 1 wt % or from about 0.01 vol % to about 1 vol %, with the polymer of the substrate representing from about 99.99 wt % to about 99 wt % of the cooling film.

J. Methods of Preparing Cooling Compositions by Ultrasonic Depolymerization

In various aspects, disclosed herein are methods for preparing nanoparticles of titanium, e.g., titanium dioxide, and/or calcium, e.g., calcium carbonate. In a further aspect, the methods for preparing nanoparticles of titanium, e.g., titanium dioxide, and/or calcium, e.g., calcium carbonate comprise ultrasonic depolymerization as disclosed herein.

In a further aspect, the disclosed methods of ultrasonic depolymerization comprise forming a dispersion of titanium, e.g., titanium dioxide, and/or calcium, e.g., calcium carbonate, in a suitable liquid carrier, e.g., water, at a wt % of from about 10 wt % to about 80 wt % of the titanium, e.g., titanium dioxide, and/or the calcium, e.g., calcium carbonate, in the liquid carrier. The dispersion is then subjected to ultrasonication at an input energy of from about 5 W/cm$^2$ to about 1000 W/cm$^2$ at a temperature of from about 0° C. to about 95° C. for a suitable period of time as required to obtain the desired nanoparticle distribution, e.g., for a period of from about 1 minutes to about 360 minutes. In some instances it may be desirable to carry out the method at a pressure of from about 0.5 bar to about 50 bar.

The input energy can be varied as suitable to obtain the desired nanoparticle distribution under the various production constraints as the skilled artisan would know. For example, it is generally undesirable to use an input energy less than about 5 W/cm$^2$. In some instances, the tradeoff of time required and achieving the desired nanoparticle size distribution, it may be desirable to use an input energy of from about 10 W/cm$^2$ to about 500 W/cm$^2$.

In a further aspect, the solids or wt % of the titanium dioxide or calcium carbonate in the dispersion can be varied, e.g., it may be desirable to have the dispersion of titanium, e.g., titanium dioxide, and/or calcium, e.g., calcium carbonate, in a suitable liquid carrier, e.g., water, at a wt % of from about 30 wt % to about 75 wt % of the titanium, e.g., titanium dioxide, and/or the calcium, e.g., calcium carbonate, in the liquid carrier.

In a further aspect, the solids or wt % of the titanium dioxide or calcium carbonate in the dispersion can be varied, e.g., it may be desirable to have the dispersion of titanium, e.g., titanium dioxide, and/or calcium, e.g., calcium carbonate, in a suitable liquid carrier, e.g., water, at a wt % of from about 45 wt % to about 65 wt % of the titanium, e.g., titanium dioxide, and/or the calcium, e.g., calcium carbonate, in the liquid carrier.

In a further aspect, the solids or wt % of the titanium dioxide or calcium carbonate in the dispersion can be varied, e.g., it may be desirable to have the dispersion of titanium, e.g., titanium dioxide, and/or calcium, e.g., calcium carbonate, in a suitable liquid carrier, e.g., water, at a wt % of from about 45 wt % to about 55 wt % of the titanium, e.g., titanium dioxide, and/or the calcium, e.g., calcium carbonate, in the liquid carrier.

In a further aspect, the solids or wt % of the titanium dioxide or calcium carbonate in the dispersion can be varied, e.g., it may be desirable to have the dispersion of titanium, e.g., titanium dioxide, and/or calcium, e.g., calcium carbonate, in a suitable liquid carrier, e.g., water, at a wt % of from about 55 wt % to about 65 wt % of the titanium, e.g., titanium dioxide, and/or the calcium, e.g., calcium carbonate, in the liquid carrier.

In a further aspect, the liquid carrier is a volatile carrier, e.g., toluene, ethyl acetate, other commonly used volatile organic liquids, and combinations thereof.

In a further aspect, the disclosed methods of ultrasonic depolymerization form a dispersed slurry of nanoparticle sized titanium, e.g., titanium dioxide, and/or calcium, e.g., calcium carbonate can use a fixed vessel ultrasonicator or a flow cell ultrasonicator for the sonication step.

In a further aspect, the dispersed slurry of nanoparticle sized titanium, e.g., titanium dioxide, and/or calcium, e.g., calcium carbonate, can be further processed to a powder comprising nanoparticle sized titanium, e.g., titanium dioxide, and/or calcium, e.g., calcium carbonate. The further processing can comprising evaporation and drying.

In a further aspect, the dispersed slurry of nanoparticle sized titanium, e.g., titanium dioxide, and/or calcium, e.g., calcium carbonate, can be used without further processing, e.g., as a dispersed slurry that is used directly in the preparation of a disclosed cooling masterbatch.

In some instances, the method may further utilize a dispersant in the dispersion subjected to ultrasonication, e.g., polyacrylate, present in the dispersion in an amount of from about 0.1 wt % to about 8 wt %, about 0.1 wt % to about 5 wt %, about 1 wt % to about 3 wt %, or about 2 wt % to about 4 wt %. Other suitable dispersing agents include, but are not limited to, various surface-active polymers, such as polycarboxylates, polyacrylates, polyethers and fatty-acid derivatives or a mixture thereof.

K. Methods of Preparing Cooling Masterbatch Materials

In various aspects, the present disclosure pertains to methods of preparing a cooling masterbatch material. The method comprises melting a disclosed cooling film a suitable temperature, and then extruding the melted cooling film, thereby forming a cooling masterbatch material. The disclosed cooling film can optionally be cut, shred, or otherwise made into suitable sized pieces prior to melting. Melting can be carried out in a melt hopper in communication with an extruder, e.g., a twin screw extruder. The melt temperature will based upon the substrate material, e.g., if the substrate is a polyester film, then the melt temperature can be about 280-290° C. The extrudate can be dried and cut or granulated into suitable sized pieces after cooling and drying.

In various aspects, similar methods are utilized to prepare the disclosed pre-masterbatch materials, except that the materials provided include one or more cooling films with a polymer, e.g., a polyester or a polyamide. In some instances, an auxiliary agent is provided in preparing, e.g., a dispersing agent in a suitable amount, e.g., about 0.01 wt % to about 0.25 wt % or about 0.05 wt % to about 0.15 wt %. Suitable auxiliary agents to use in the preparation of a pre-masterbatch, including dispersing agents, are as disclosed elsewhere herein, e.g., sodium pyrophosphate, which can be used with various polyamides, or a polyacrylate, which can be used with various polyesters.

In a further aspect, a first cooling masterbatch material comprising one or more cooling materials and prepared as described in the foregoing, can be combined with a second cooling masterbatch material comprising one or more cooling materials and prepared as described in the foregoing to form a final cooling masterbatch material. In this manner, the ratio of cooling materials in the first cooling masterbatch material to the cooling materials in the second cooling masterbatch material can be modulated and optimized to achieve a desired ratio and composition of cooling materials in a final masterbatch material. An exemplary aspect of this is described in the Examples herein below. In the foregoing, it is understood that the first cooling masterbatch material can be formed from a first cooling film, and the second masterbatch material can be formed from a second cooling film. In a further aspect, first and second cooling films can comprise the same cooling materials deposited on the same or different substrate materials. In a still further aspect, the first and second cooling films can independently comprise the distinct cooling materials deposited on the same or different substrate materials.

In a further aspect, the present disclosure pertains to methods for preparing a cooling masterbatch composition, comprising: providing a premelt mixture comprising a premelt polymer and a premelt cooling material; wherein the premelt polymer is selected from a polyester, a polyamide, and combinations thereof; and wherein the premelt cooling material is selected from: (a) a disclosed cooling pre-masterbatch composition; (b) titanium dioxide nanoparticles; (c) calcium carbonate nanoparticles; and (d) combinations of (a), (b) and (c); wherein the cooling pre-masterbatch composition, when present, is in the premelt mixture in an amount of from about 1 wt % to about 10 wt %; wherein the titanium dioxide, when present, is in the premelt mixture in an amount of from about 5 wt % to about 80 wt %; wherein the calcium carbonate, when present, is in the premelt mixture in an amount of from about 5 wt % to about 80 wt %; and wherein the wt % is based on the total weight of the premelt polymer and the premelt cooling material; melting the premelt mixture to form a melt mixture; and extruding the melt mixture; thereby providing the cooling masterbatch composition.

In a further aspect, the present disclosure pertains to methods for preparing a cooling pre-masterbatch composition, comprising: providing a premelt mixture comprising a premelt polymer and a premelt cooling material; wherein the premelt polymer is selected from a polyester, a polyamide, and combinations thereof; and wherein the premelt cooling material is one or more cooling film; wherein the cooling film is present in the premelt mixture in an amount of from about 1 wt % to about 10 wt %; and wherein the wt % is based on the total weight of the premelt polymer and the premelt cooling material; melting the premelt mixture to form a melt mixture; and extruding the melt mixture; thereby providing the cooling masterbatch composition.

In a further aspect, the cooling masterbatch material can comprise in the hopper as part of the melt mixture prior to extrusion the various components in the amounts and types as described herein above for cooling masterbatch materials.

L. Methods of Preparing Cooling Filament Yarns

In various aspects, the present disclosure pertains to methods of preparing a cooling filament yarn. For example, a disclosed filament yarn can be prepared by melt spinning a melt comprising a desired weight percent of one or more virgin polymers and a desired weight percent of one or more disclosed cooling masterbatch materials. The virgin polymer can be the same or different as the cooling masterbatch material polymer matrix.

In various aspects, a disclosed filament yarn can be formed in a melt spinning process using a melt comprising from about 50 wt % to about 99 wt % of one or more virgin polymers and from about 1 wt % to about 50 wt % of one or more cooling masterbatch materials. In a further aspect, the yarn melt mixture can further comprise auxiliary agents such as dispersants, surfactants, UV protective agents, and the like. In a particular aspect, the yarn melt mixture can further comprise a surfactant present in an amount of from about 0.1 wt % to about 5 wt %, including, but not limited to, any wt % within the foregoing range that is suitable such as from about 0.1 wt % to about 3 wt %, or from about 1 wt % to about 3 wt %.

In various aspects, the present disclosure pertains to cooling filament yarns comprising a cooling yarn polymer selected from a polyester, a polyamide, and combinations thereof; a cooling material selected from aluminum, zinc oxide, titanium dioxide, calcium carbonate, and combinations thereof; wherein the aluminum, when present, has an average particle size of from about 1 nm to about 50 nm and is in the cooling masterbatch composition in an amount of from about 0.1 wt % to about 10 wt %; wherein the zinc oxide, when present, has an average particle size of from about 1 nm to about 50 nm and is in the cooling masterbatch composition in an amount of from about 0.1 wt % to about 10 wt %; wherein the titanium dioxide, when present, has an average particle size of from about 10 nm to about 2000 nm and is in the cooling masterbatch composition in an amount of from about 1 wt % to about 90 wt %; and wherein the calcium carbonate, when present, has an average particle size of from about 10 nm to about 2000 nm and is in the cooling masterbatch composition in an amount of from about 1 wt % to about 90 wt %; and wherein the wt % is based on a total weight of the cooling masterbatch material polymer and all materials in the cooling masterbatch material cooling material.

In various aspects, the masterbatch is melted with additional polymer in the amounts and types of components as described herein above for cooling filament yarns. The filaments are extruded, and depending upon the extrusion head, the number of filaments simultaneously extruded can be from about 12 to 160 filaments, including 24-144 filaments. The extruded filaments can then be immediately directed to spinning into a yarn having the desired weight and twist characteristics.

In various aspects, the yarn that is spun from the extruded filaments can be partially oriented yarn (POY) or fully oriented yarn (FOY) depending upon the fabric requirements made from the yarn. In a further aspect, the yarn that is spun from the from the extruded filaments is POY. In a still further aspect, the yarn that is spun from the from the extruded filaments is FOY.

In various aspects, the yarn that is spun from the extruded filaments can be subjected to further processing steps, e.g., the yarn can be further processed to form a drawn textured yarn (DTY).

In various aspects, the yarn that is spun from the extruded filaments can spun to a desired weight, e.g., the disclosed cooling filament yarns can be spun to from about 20 Denier to about 1000 Denier.

M. Articles

In one aspect, the disclosure relates to articles comprising a disclosed composite fiber. In a further aspect, the article comprising the disclosed composite fiber is an article of clothing, including, but not limited to a pair of pants, a shirt, a jacket, a dress, a glove, a skirt, T-shirt, vest, poly top, pullover, male or female brief, underwear, long-john, nightwear such as pajamas, intimate apparel, bra, cardigan, skit, dress, blouse, trousers, tracksuit bottom, shorts, sock, tie, pair of jeans, pair of gloves, coat, jacket, mitt, hat, cap, skull cap, helmet, dressing gown, baby clothing, garments such as gowns, drapes, overalls, masks, uniforms such as chefs jackets and aprons, and an inner lining of clothing and towels. In a still further aspect, the article comprising the disclosed composite fiber is an article of sportswear. Clothing includes footwear, for example, insoles, shoes, sandals and trainers. The fabric comprising the disclosed yarns and fabrics can constitute part of or, preferably, all of a garment fabric. For instance, it is possible to construct trousers, shirts, t-shirts where the fabric of each was the fabric of the present disclosure. Alternatively, only part of a garment may comprise the fabric of the present disclosure. For example, a garment such as a t-shirt or shirt, may comprise the fabric of the present disclosure in locations commonly associate with greater heating and/or generation of moisture, such as the 'armpits' or back of the garment.

In a further aspect, the article comprising the disclosed composite fiber an article of drapery, home textile, home furnishing, upholstery cover, mattress pad, mattress cover, mattress ticking, blanket, bed linen, table linen, sheet, duvet cover, throw, sleeping bag, or combinations of the foregoing articles. An article in the form of upholstery covers, includes, but is not limited to, upholstery covers for furniture for home, institutional and commercial markets, and for transportation seating. In a still further aspect, the article comprising the disclosed composite fiber a floor covering. In a yet further aspect, the article comprising the disclosed composite fiber is a tote bag, a furniture cover, a tarpaulin, or a vehicle seat.

In one aspect, the disclosure relates to articles comprising a disclosed cooling filament yarn. In a further aspect, the article comprising the cooling filament yarn yarn is an article of clothing, including, but not limited to a pair of pants, a shirt, a jacket, a dress, a glove, a skirt, T-shirt, vest, poly top, pullover, male or female brief, underwear, long-john, nightwear such as pajamas, bra, cardigan, skit, dress, blouse, trousers, tracksuit bottom, shorts, sock, tie, pair of jeans, pair of gloves, coat, jacket, boxing glove, mitt, hat, cap, skull cap, helmet, dressing gown, baby clothing, garments such as gowns, drapes, overalls, masks, uniforms such as chefs jackets and aprons, and an inner lining of clothing and towels. In a still further aspect, the article comprising the disclosed cooling filament yarn an article of sportswear. Clothing includes footwear, for example, insoles, shoes, sandals and trainers. The fabric comprising the disclosed yarns and fabrics can constitute part of or, preferably, all of a garment fabric. For instance, it is possible to construct trousers, shirts, t-shirts where the fabric of each was the fabric of the present disclosure. Alternatively, only part of a garment may comprise the fabric of the present disclosure. For example, a garment such as a t-shirt or shirt, may comprise the fabric of the present disclosure in locations commonly associate with greater heating and/or generation of moisture, such as the 'armpits' or back of the garment.

In a further aspect, the article comprising the disclosed cooling filament yarn an article of drapery, home textile, home furnishing, upholstery cover, mattress pad, mattress cover, mattress ticking, blanket, bed linen, table linen, sheet, duvet cover, throw, sleeping bag, or combinations of the foregoing articles. An article in the form of upholstery covers, includes, but is not limited to, upholstery covers for furniture for home, institutional and commercial markets, and for transportation seating. In a still further aspect, the article comprising the cooling filament yarn a floor covering. In a yet further aspect, the article comprising the cooling filament yarn is a tote bag, a furniture cover, a tarpaulin, or a vehicle seat.

In one aspect, the disclosure relates to articles comprising a disclosed fabric. In a further aspect, the article comprising the disclosed fabric is an article of clothing, including, but not limited to a pair of pants, a shirt, a jacket, a dress, a glove, a skirt, T-shirt, vest, poly top, pullover, male or female brief, underwear, long-john, nightwear such as pajamas, bra, cardigan, skit, dress, blouse, trousers, tracksuit bottom, shorts, sock, tie, pair of jeans, pair of gloves, coat, jacket, boxing glove, mitt, hat, cap, skull cap, helmet, dressing gown, baby clothing, garments such as gowns, drapes, overalls, masks, uniforms such as chefs jackets and aprons, and an inner lining of clothing and towels. In a still further aspect, the article comprising the disclosed fabric an article of sportswear. Clothing includes footwear, for example, insoles, shoes, sandals and trainers. The fabric comprising the disclosed yarns and fabrics can constitute part of or, preferably, all of a garment fabric. For instance, it is possible to construct trousers, shirts, t-shirts where the fabric of each was the fabric of the present disclosure. Alternatively, only part of a garment may comprise the fabric of the present disclosure. For example, a garment such as a t-shirt or shirt, may comprise the fabric of the present disclosure in locations commonly associate with greater heating and/or generation of moisture, such as the 'armpits' or back of the garment.

In a further aspect, the article comprising the disclosed fabric an article of drapery, home textile, home furnishing, upholstery cover, mattress pad, mattress cover, mattress ticking, blanket, bed linen, table linen, sheet, duvet cover, throw, sleeping bag, or combinations of the foregoing articles. An article in the form of upholstery covers, includes, but is not limited to, upholstery covers for furniture for home, institutional and commercial markets, and for transportation seating. In a still further aspect, the article comprising the disclosed fabric a floor covering. In a yet further aspect, the article comprising the disclosed fabric is a tote bag, a furniture cover, a tarpaulin, or a vehicle seat.

N. Aspects

The following listing of exemplary aspects supports and is supported by the disclosure provided herein.

Aspect 1. A method of forming a cooling film, comprising: placing a plurality of sputtering targets in a sputtering chamber of sputtering device; placing a substrate in a substrate holder disposed above the plurality of sputtering targets; applying a DC magnetic field to the sputtering targets; and depositing a layer of sputtered material on at least one surface of the substrate; wherein the plurality of sputtering targets comprise a sputtering material selected from aluminum, zinc oxide, and combinations thereof; wherein the layer of sputtered material comprises nanoparticles of a cooling composition; wherein the cooling composition comprises a material selected from aluminum, zinc, and combinations thereof; and wherein the substrate comprises a polymer; thereby forming a cooling film comprising a substrate having thereon a layer of sputtered material.

Aspect 2. The method of Aspect 1, wherein the substrate comprises a polyester.

Aspect 3. The method of Aspect 2, wherein the polyester is a polyethylene terephthalate, a polybutylene terephthalate, a polytrimethylene terephthalate, or combinations thereof.

Aspect 4. The method of Aspect 3, wherein the substrate comprises a polyamide.

Aspect 5. The method of Aspect 4, wherein the polyamide comprises nylon 6, nylon 4/6, nylon 6/6, nylon 6/10, nylon 6/12, nylon 11, nylon 12, or combinations thereof.

Aspect 6. The method of any one of Aspect 1-Aspect 5, wherein the substrate is a film, a filament, or a plate.

Aspect 7. The method of Aspect 6, wherein the substrate is a film.

Aspect 8. The method of Aspect 7, wherein the film has a thickness of about 1 μm to about 100 μm.

Aspect 9. The method of Aspect 8, wherein the film has a thickness of about 5 μm to about 20 μm.

Aspect 10. The method of Aspect 8, wherein the film has a thickness of about 5 μm to about 15 μm.

Aspect 11. The method of Aspect 8, wherein the film has a thickness of about 10 μm to about 30 μm.

Aspect 12. The method of Aspect 8, wherein the film has a thickness of about 15 μm to about 30 μm.

Aspect 13. The method of Aspect 8, wherein the film has a thickness of about 20 μm to about 30 μm.

Aspect 14. The method of Aspect 8, wherein the film has a thickness of about 15 μm to about 25 μm.

Aspect 15. The method of any one of Aspect 1-Aspect 14, wherein zinc is zinc oxide.

Aspect 16. The method of any one of Aspect 1-Aspect 15, wherein aluminum is aluminum metal.

Aspect 17. The method of any one of Aspect 1-Aspect 16, wherein the layer of sputtered material comprises a monolayer of particles of the sputtered cooling composition.

Aspect 18. The method of any one of Aspect 1-Aspect 17, wherein the particles of the sputtered cooling composition have an average particle size from about 1 nm to about 50 nm.

Aspect 19. The method of Aspect 17, wherein the average particle size is from about 2 nm to about 35 nm.

Aspect 20. The method of Aspect 17, wherein the average particle size is from about 5 nm to about 35 nm.

Aspect 21. The method of Aspect 18, wherein the average particle size is from about 10 nm to about 35 nm.

Aspect 22. The method of Aspect 18, wherein the average particle size is from about 20 nm to about 35 nm.

Aspect 23. The method of Aspect 18, wherein the average particle size is from about 30 nm to about 35 nm.

Aspect 24. The method of Aspect 18, wherein the average particle size is from about 1 nm to about 20 nm.

Aspect 25. The method of Aspect 18, wherein the average particle size is from about 2 nm to about 20 nm.

Aspect 26. The method of Aspect 18, wherein the average particle size is from about 5 nm to about 20 nm.

Aspect 27. The method of Aspect 18, wherein the average particle size is from about 10 nm to about 20 nm.

Aspect 28. The method of Aspect 18, wherein the average particle size is from about 15 nm to about 20 nm.

Aspect 29. The method of any one of Aspect 1-Aspect 28, further comprising depositing one or more additional layers of sputtered material on the layer of sputtered material on the substrate.

Aspect 30. The method of Aspect 29, wherein the depositing the one or more additional layers of sputtered material is repeated for 1 to 10 iterations.

Aspect 31. The method of any one of Aspect 1-Aspect 30, wherein the layer of sputtered material or the additional layer of sputtered material has a thickness from about 1 nm to about 50 nm.

Aspect 32. The method of any one of Aspect 1-Aspect 31, wherein the particles of the sputtered cooling composition are present in an amount of from about 0.01 wt % to about 5 wt %.

Aspect 33. The method of Aspect 32, wherein the nanoparticles of the cooling composition are present in an amount of from about 0.01 wt % to about 4.5 wt %.

Aspect 34. The method of Aspect 32, wherein the nanoparticles of the cooling composition are present in an amount of from about 0.01 wt % to about 4.0 wt %.

Aspect 35. The method of Aspect 32, wherein the nanoparticles of the cooling composition are present in an amount of from about 0.01 wt % to about 3.5 wt %.

Aspect 36. The method of Aspect 32, wherein the nanoparticles of the cooling composition are present in an amount of from about 0.01 wt % to about 3.0 wt %.

Aspect 37. The method of Aspect 32, wherein the nanoparticles of the cooling composition are present in an amount of from about 0.01 wt % to about 2.5 wt %.

Aspect 38. The method of Aspect 32, wherein the nanoparticles of the cooling composition are present in an amount of from about 0.01 wt % to about 2.0 wt %.

Aspect 39. The method of Aspect 32, wherein the nanoparticles of the cooling composition are present in an amount of from about 0.01 wt % to about 1.5 wt %.

Aspect 40. The method of Aspect 32, wherein the nanoparticles of the cooling composition position are present in an amount of from about 0.01 wt % to about 1.0 wt %.

Aspect 41. The method of Aspect 32, wherein the nanoparticles of the cooling composition are present in an amount of from about 0.01 wt % to about 0.90 wt %.

Aspect 42. The method of Aspect 32, wherein the nanoparticles of the cooling composition are present in an amount of from about 0.01 wt % to about 0.85 wt %.

Aspect 43. The method of Aspect 32, wherein the nanoparticles of the cooling composition are present in an amount of from about 0.01 wt % to about 0.80 wt %.

Aspect 44. The method of Aspect 32, wherein the nanoparticles of the cooling composition are present in an amount of from about 0.01 wt % to about 0.75 wt %.

Aspect 45. The method of Aspect 32, wherein the nanoparticles of the cooling composition are present in an amount of from about 0.01 wt % to about 0.70 wt %.

Aspect 46. The method of Aspect 32, wherein the nanoparticles of the cooling composition are present in an amount of from about 0.01 wt % to about 0.65 wt %.

Aspect 47. The method of Aspect 32, wherein the nanoparticles of the cooling composition are present in an amount of from about 0.01 wt % to about 0.60 wt %.

Aspect 48. The method of Aspect 32, wherein the nanoparticles of the cooling composition are present in an amount of from about 0.01 wt % to about 0.55 wt %.

Aspect 49. The method of Aspect 32, wherein the nanoparticles of the cooling composition are present in an amount of from about 0.01 wt % to about 0.50 wt %.

Aspect 50. The method of Aspect 32, wherein the nanoparticles of the cooling composition are present in an amount of from about 0.02 wt % to about 0.50 wt %.

Aspect 51. The method of Aspect 32, wherein the nanoparticles of the cooling composition are present in an amount of from about 0.03 wt % to about 0.50 wt %.

Aspect 52. The method of Aspect 32, wherein the nanoparticles of the cooling composition are present in an amount of from about 0.04 wt % to about 0.50 wt %.

Aspect 53. The method of Aspect 32, wherein the nanoparticles of the cooling composition are present in an amount of from about 0.05 wt % to about 0.50 wt %.

Aspect 54. The method of Aspect 32, wherein the nanoparticles of the cooling composition are present in an amount of from about 0.06 wt % to about 0.50 wt %.

Aspect 55. The method of Aspect 32, wherein the nanoparticles of the cooling composition are present in an amount of from about 0.07 wt % to about 0.50 wt %.

Aspect 56. The method of Aspect 32, wherein the nanoparticles of the cooling composition are present in an amount of from about 0.08 wt % to about 0.50 wt %.

Aspect 57. The method of Aspect 32, wherein the nanoparticles of the cooling composition are present in an amount of from about 0.09 wt % to about 0.50 wt %.

Aspect 58. The method of Aspect 32, wherein the nanoparticles of the cooling composition are present in an amount of from about 0.1 wt % to about 5.0 wt %.

Aspect 59. The method of Aspect 32, wherein the particles of the sputtered cooling composition are present in an amount of from about 0.1 wt % to about 4.5 wt %.

Aspect 60. The method of Aspect 32, wherein the nanoparticles of the cooling composition are present in an amount of from about 0.1 wt % to about 4.0 wt %.

Aspect 61. The method of Aspect 32, wherein the nanoparticles of the cooling composition are present in an amount of from about 0.1 wt % to about 3.5 wt %.

Aspect 62. The method of Aspect 32, wherein the nanoparticles of the cooling composition are present in an amount of from about 0.1 wt % to about 3.0 wt %.

Aspect 63. The method of Aspect 32, wherein the nanoparticles of the cooling composition are present in an amount of from about 0.1 wt % to about 2.5 wt %.

Aspect 64. The method of Aspect 32, wherein the nanoparticles of the cooling composition position are present in an amount of from about 0.1 wt % to about 2.0 wt %.

Aspect 65. The method of Aspect 32, wherein the nanoparticles of the cooling composition are present in an amount of from about 0.1 wt % to about 1.5 wt %.

Aspect 66. The method of Aspect 32, wherein the nanoparticles of the cooling composition are present in an amount of from about 0.1 wt % to about 1.0 wt %.

Aspect 67. The method of Aspect 32, wherein the nanoparticles of the cooling composition are present in an amount of from about 0.1 wt % to about 0.90 wt %.

Aspect 68. The method of Aspect 32, wherein the nanoparticles of the cooling composition are present in an amount of from about 0.1 wt % to about 0.85 wt %.

Aspect 69. The method of Aspect 32, wherein the nanoparticles of the cooling composition are present in an amount of from about 0.1 wt % to about 0.80 wt %.

Aspect 70. The method of Aspect 32, wherein the nanoparticles of the cooling composition are present in an amount of from about 0.1 wt % to about 0.75 wt %.

Aspect 71. The method of Aspect 32, wherein the nanoparticles of the cooling composition are present in an amount of from about 0.1 wt % to about 0.70 wt %.

Aspect 72. The method of Aspect 32, wherein the nanoparticles of the cooling composition are present in an amount of from about 0.1 wt % to about 0.65 wt %.

Aspect 73. The method of Aspect 32, wherein the nanoparticles of the cooling composition are present in an amount of from about 0.1 wt % to about 0.60 wt %.

Aspect 74. The method of Aspect 32, wherein the nanoparticles of the cooling composition are present in an amount of from about 0.1 wt % to about 0.55 wt %.

Aspect 75. The method of Aspect 32, wherein the nanoparticles of the cooling composition are present in an amount of from about 0.1 wt % to about 0.50 wt %.

Aspect 76. The method of any one of Aspect 1-Aspect 75, wherein the plurality of sputtering targets consists of 1, 2, 3, 4, or 5 sputtering targets.

Aspect 77. The method of Aspect 76, wherein the plurality of sputtering targets comprises a first plurality of sputtering targets comprising a first sputtering material and a second plurality of sputtering targets comprising a second sputtering material; wherein the first plurality of sputtering targets consists of 1, 2, 3, or 4 first sputtering targets; wherein the second plurality of sputtering targets consists of 1, 2, 3, or 4 second sputtering targets; wherein the total number of the first plurality of sputtering targets and the second plurality of sputtering targets is 2, 3, 4, or 5; wherein the first sputtering material comprises aluminum; and wherein the second sputtering material comprises zinc oxide; wherein the layer of sputtered material comprises a first sputtered cooling composition comprising aluminum; and wherein the layer of sputtered material comprises a second sputtered cooling composition comprising zinc oxide.

Aspect 78. The method of Aspect 77, wherein the first sputtering target cooling composition is present on the substrate in a weight percent amount from about 10 weight percent to about 90 weight percent; wherein the second sputtering target cooling composition is present on the substrate in a weight percent amount from about 90 weight percent to about 10 weight percent; wherein first sputtering target cooling composition and the second sputtering target cooling composition is 100 weight percent.

Aspect 79. The method of Aspect 78, wherein the first sputtering target cooling composition is present in a weight percent amount of about 50 weight percent to about 90 weight percent; and wherein the second sputtering target cooling composition is present in a weight percent amount of about 50 weight percent to about 10 weight percent.

Aspect 80. The method of Aspect 78, wherein the first sputtering target cooling composition is present in a weight percent amount of about 60 weight percent to about 80 weight percent; and wherein the second sputtering target cooling composition is present in a weight percent amount of about 40 weight percent to about 20 weight percent.

Aspect 81. The method of Aspect 78, wherein the first sputtering target cooling composition is present in a weight percent amount of about 65 weight percent to about 75 weight percent; and wherein the second sputtering target cooling composition is present in a weight percent amount of about 35 weight percent to about 25 weight percent.

Aspect 82. The method of any one of Aspect 1-Aspect 81, wherein the layer of sputtered material on a surface of the substrate comprises about 0.005 weight percent to about 3 weight percent; wherein the substrate comprises about 99.995 weight percent to about 97 weight percent; wherein the weight percent is based on the weight of the layer of sputtered material and the weight of the substrate; and wherein the total weight percent of the layer of sputtered material and the substrate is 100 weight percent.

Aspect 83. A cooling film prepared by the method of any one of Aspect 1-Aspect 82.

Aspect 84. A cooling film comprising a substrate and a layer of sputtered material on at least one surface of the substrate; wherein the layer of sputtered material comprises nanoparticles of a cooling composition; wherein the cooling composition comprises a material selected from aluminum, zinc, and combinations thereof; and wherein the substrate comprises a polymer.

Aspect 85. The cooling film of Aspect 84, wherein the substrate comprises a polyester.

Aspect 86. The cooling film of Aspect 85, wherein the polyester is a polyethylene terephthalate, a polybutylene terephthalate, a polytrimethylene terephthalate, or combinations thereof.

Aspect 87. The cooling film of Aspect 86, wherein the substrate comprises a polyamide.

Aspect 88. The cooling film of Aspect 87, wherein the polyamide comprises nylon 6, nylon 4/6, nylon 6/6, nylon 6/10, nylon 6/12, nylon 11, nylon 12, or combinations thereof.

Aspect 89. The cooling film of any one of Aspect 84-Aspect 88, wherein the substrate is a film, a filament, or a plate.

Aspect 90. The cooling film of Aspect 89, wherein the substrate is a film.

Aspect 91. The cooling film of Aspect 90, wherein the film has a thickness of about 1 µm to about 100 µm.

Aspect 92. The cooling film of Aspect 91, wherein the film has a thickness of about 5 µm to about 20 µm.

Aspect 93. The cooling film of Aspect 91, wherein the film has a thickness of about 5 µm to about 15 µm.

Aspect 94. The cooling film of Aspect 91, wherein the film has a thickness of about 10 µm to about 30 µm.

Aspect 95. The cooling film of Aspect 91, wherein the film has a thickness of about 15 µm to about 30 µm.

Aspect 96. The cooling film of Aspect 91, wherein the film has a thickness of about 20 µm to about 30 µm.

Aspect 97. The cooling film of Aspect 91, wherein the film has a thickness of about 15 µm to about 25 µm.

Aspect 98. The cooling film of any one of Aspect 84-Aspect 14, wherein zinc is zinc oxide.

Aspect 99. The cooling film of any one of Aspect 84-Aspect 15, wherein aluminum is aluminum metal.

Aspect 100. The cooling film of any one of Aspect 84-Aspect 16, wherein the layer of sputtered material comprises a monolayer of particles of the sputtered cooling composition.

Aspect 101. The cooling film of any one of Aspect 84-Aspect 17, wherein the particles of the sputtered cooling composition have an average particle size from about 1 nm to about 50 nm.

Aspect 102. The cooling film of Aspect 17, wherein the average particle size is from about 2 nm to about 35 nm.

Aspect 103. The cooling film of Aspect 17, wherein the average particle size is from about 5 nm to about 35 nm.

Aspect 104. The cooling film of Aspect 18, wherein the average particle size is from about 10 nm to about 35 nm.

Aspect 105. The cooling film of Aspect 18, wherein the average particle size is from about 20 nm to about 35 nm.

Aspect 106. The cooling film of Aspect 18, wherein the average particle size is from about 30 nm to about 35 nm.

Aspect 107. The cooling film of Aspect 18, wherein the average particle size is from about 1 nm to about 20 nm.

Aspect 108. The cooling film of Aspect 18, wherein the average particle size is from about 2 nm to about 20 nm.

Aspect 109. The cooling film of Aspect 18, wherein the average particle size is from about 5 nm to about 20 nm.

Aspect 110. The cooling film of Aspect 18, wherein the average particle size is from about 10 nm to about 20 nm.

Aspect 111. The cooling film of Aspect 18, wherein the average particle size is from about 15 nm to about 20 nm.

Aspect 112. The cooling film of any one of Aspect 84-Aspect 28, further comprising depositing one or more additional layers of sputtered material on the layer of sputtered material on the substrate.

Aspect 113. The cooling film of Aspect 29, wherein the depositing the one or more additional layers of sputtered material is repeated for 1 to 10 iterations.

Aspect 114. The cooling film of any one of Aspect 84-Aspect 30, wherein the layer of sputtered material or the additional layer of sputtered material has a thickness from about 1 nm to about 50 nm.

Aspect 115. The cooling film of any one of Aspect 84-Aspect 31, wherein the particles of the sputtered cooling composition are present in an amount of from about 0.01 wt % to about 5 wt %.

Aspect 116. The cooling film of Aspect 32, wherein the nanoparticles of the cooling composition are present in an amount of from about 0.01 wt % to about 4.5 wt %.

Aspect 117. The cooling film of Aspect 32, wherein the nanoparticles of the cooling composition are present in an amount of from about 0.01 wt % to about 4.0 wt %.

Aspect 118. The cooling film of Aspect 32, wherein the nanoparticles of the cooling composition are present in an amount of from about 0.01 wt % to about 3.5 wt %.

Aspect 119. The cooling film of Aspect 32, wherein the nanoparticles of the cooling composition are present in an amount of from about 0.01 wt % to about 3.0 wt %.

Aspect 120. The cooling film of Aspect 32, wherein the nanoparticles of the cooling composition are present in an amount of from about 0.01 wt % to about 2.5 wt %.

Aspect 121. The cooling film of Aspect 32, wherein the nanoparticles of the cooling composition are present in an amount of from about 0.01 wt % to about 2.0 wt %.

Aspect 122. The cooling film of Aspect 32, wherein the nanoparticles of the cooling composition are present in an amount of from about 0.01 wt % to about 1.5 wt %.

Aspect 123. The cooling film of Aspect 32, wherein the nanoparticles of the cooling composition position are present in an amount of from about 0.01 wt % to about 1.0 wt %.

Aspect 124. The cooling film of Aspect 32, wherein the nanoparticles of the cooling composition are present in an amount of from about 0.01 wt % to about 0.90 wt %.

Aspect 125. The cooling film of Aspect 32, wherein the nanoparticles of the cooling composition are present in an amount of from about 0.01 wt % to about 0.85 wt %.

Aspect 126. The cooling film of Aspect 32, wherein the nanoparticles of the cooling composition are present in an amount of from about 0.01 wt % to about 0.80 wt %.

Aspect 127. The cooling film of Aspect 32, wherein the nanoparticles of the cooling composition are present in an amount of from about 0.01 wt % to about 0.75 wt %.

Aspect 128. The cooling film of Aspect 32, wherein the nanoparticles of the cooling composition are present in an amount of from about 0.01 wt % to about 0.70 wt %.

Aspect 129. The cooling film of Aspect 32, wherein the nanoparticles of the cooling composition are present in an amount of from about 0.01 wt % to about 0.65 wt %.

Aspect 130. The cooling film of Aspect 32, wherein the nanoparticles of the cooling composition are present in an amount of from about 0.01 wt % to about 0.60 wt %.

Aspect 131. The cooling film of Aspect 32, wherein the nanoparticles of the cooling composition are present in an amount of from about 0.01 wt % to about 0.55 wt %.

Aspect 132. The cooling film of Aspect 32, wherein the nanoparticles of the cooling composition are present in an amount of from about 0.01 wt % to about 0.50 wt %.

Aspect 133. The cooling film of Aspect 32, wherein the nanoparticles of the cooling composition are present in an amount of from about 0.02 wt % to about 0.50 wt %.

Aspect 134. The cooling film of Aspect 32, wherein the nanoparticles of the cooling composition are present in an amount of from about 0.03 wt % to about 0.50 wt %.

Aspect 135. The cooling film of Aspect 32, wherein the nanoparticles of the cooling composition are present in an amount of from about 0.04 wt % to about 0.50 wt %.

Aspect 136. The cooling film of Aspect 32, wherein the nanoparticles of the cooling composition are present in an amount of from about 0.05 wt % to about 0.50 wt %.

Aspect 137. The cooling film of Aspect 32, wherein the nanoparticles of the cooling composition are present in an amount of from about 0.06 wt % to about 0.50 wt %.

Aspect 138. The cooling film of Aspect 32, wherein the nanoparticles of the cooling composition are present in an amount of from about 0.07 wt % to about 0.50 wt %.

Aspect 139. The cooling film of Aspect 32, wherein the nanoparticles of the cooling composition are present in an amount of from about 0.08 wt % to about 0.50 wt %.

Aspect 140. The cooling film of Aspect 32, wherein the nanoparticles of the cooling composition are present in an amount of from about 0.09 wt % to about 0.50 wt %.

Aspect 141. The cooling film of Aspect 32, wherein the nanoparticles of the cooling composition are present in an amount of from about 0.1 wt % to about 5.0 wt %.

Aspect 142. The cooling film of Aspect 32, wherein the particles of the sputtered cooling composition are present in an amount of from about 0.1 wt % to about 4.5 wt %.

Aspect 143. The cooling film of Aspect 32, wherein the nanoparticles of the cooling composition are present in an amount of from about 0.1 wt % to about 4.0 wt %.

Aspect 144. The cooling film of Aspect 32, wherein the nanoparticles of the cooling composition are present in an amount of from about 0.1 wt % to about 3.5 wt %.

Aspect 145. The cooling film of Aspect 32, wherein the nanoparticles of the cooling composition are present in an amount of from about 0.1 wt % to about 3.0 wt %.

Aspect 146. The cooling film of Aspect 32, wherein the nanoparticles of the cooling composition are present in an amount of from about 0.1 wt % to about 2.5 wt %.

Aspect 147. The cooling film of Aspect 32, wherein the nanoparticles of the cooling composition position are present in an amount of from about 0.1 wt % to about 2.0 wt %.

Aspect 148. The cooling film of Aspect 32, wherein the nanoparticles of the cooling composition are present in an amount of from about 0.1 wt % to about 1.5 wt %.

Aspect 149. The cooling film of Aspect 32, wherein the nanoparticles of the cooling composition are present in an amount of from about 0.1 wt % to about 1.0 wt %.

Aspect 150. The cooling film of Aspect 32, wherein the nanoparticles of the cooling composition are present in an amount of from about 0.1 wt % to about 0.90 wt %.

Aspect 151. The cooling film of Aspect 32, wherein the nanoparticles of the cooling composition are present in an amount of from about 0.1 wt % to about 0.85 wt %.

Aspect 152. The cooling film of Aspect 32, wherein the nanoparticles of the cooling composition are present in an amount of from about 0.1 wt % to about 0.80 wt %.

Aspect 153. The cooling film of Aspect 32, wherein the nanoparticles of the cooling composition are present in an amount of from about 0.1 wt % to about 0.75 wt %.

Aspect 154. The cooling film of Aspect 32, wherein the nanoparticles of the cooling composition are present in an amount of from about 0.1 wt % to about 0.70 wt %.

Aspect 155. The cooling film of Aspect 32, wherein the nanoparticles of the cooling composition are present in an amount of from about 0.1 wt % to about 0.65 wt %.

Aspect 156. The method of Aspect 32, wherein the nanoparticles of the cooling composition are present in an amount of from about 0.1 wt % to about 0.60 wt %.

Aspect 157. The cooling film of Aspect 32, wherein the nanoparticles of the cooling composition are present in an amount of from about 0.1 wt % to about 0.55 wt %.

Aspect 158. The cooling film of Aspect 32, wherein the nanoparticles of the cooling composition are present in an amount of from about 0.1 wt % to about 0.50 wt %.

Aspect 159. A cooling pre-masterbatch composition comprising a cooling film prepared by the method of any one of Aspect 1-Aspect 82 or the cooling of any one of Aspect 84-Aspect 158.

Aspect 160. A method for preparing a cooling pre-masterbatch composition, the method comprising: providing a premelt mixture comprising a premelt polymer and a premelt cooling material; wherein the premelt polymer is selected from a polyester, a polyamide, and combinations thereof; and wherein the premelt cooling material is the cooling film of any one of Aspect 83-Aspect 159; wherein the cooling film is in the premelt mixture in an amount of from about 0.1 wt % to about 10 wt %; wherein the wt % is based on the total weight of the premelt polymer and the premelt cooling material; melting the premelt mixture to form a melt mixture; and extruding the melt mixture; thereby providing the cooling pre-masterbatch composition.

Aspect 161. The method of Aspect 160, wherein the premelt polymer is a polyester.

Aspect 162. The method of Aspect 160, wherein the premelt polymer is a polyamide.

Aspect 163. The method of any one of Aspect 160-Aspect 162, wherein the premelt mixture further comprises an adhesive, a dispersant, or combinations thereof.

Aspect 164. The method of Aspect 163, wherein the adhesive is an acrylic resin.

Aspect 165. The method of Aspect 163 or Aspect 164, wherein the adhesive is present in an amount from about 0.01 weight percent to about 0.50 weight percent; and wherein the weight percent is based on the weight of all components in the premelt mixture.

Aspect 166. The method of Aspect 163, wherein the dispersant is selected from sodium pyrophosphate, polypropylene glycol such as polypropylene glycol 700, and combinations thereof.

Aspect 167. The method of Aspect 163 or Aspect 166, wherein the dispersant is present in an amount from about 0.001 weight percent to about 0.10 weight percent; and wherein the weight percent is based on the weight of all components in the premelt mixture.

Aspect 168. The method of any one of Aspect 160-Aspect 167, wherein the melting is at a temperature of about 250° C. to about 600° C.

Aspect 169. The method of Aspect 168, wherein the melting is at a temperature of about 270° C. to about 600° C.

Aspect 170. The method of any one of Aspect 160-Aspect 169, wherein the premelt cooling material comprises aluminum, zinc oxide, or combination thereof.

Aspect 171. The method of Aspect 170, wherein the premelt cooling material comprises aluminum.

Aspect 172. The method Aspect 170 or Aspect 171, wherein the aluminum is present in the premelt mixture in an amount of from about 0.1 wt % to about 10 wt %.

Aspect 173. The method of Aspect 172, wherein the aluminum is present in the premelt mixture in an amount of from about 0.1 wt % to about 3 wt %.

Aspect 174. The method of Aspect 173, wherein the aluminum is present in the premelt mixture in an amount of from about 0.1 wt % to about 1 wt %.

Aspect 175. The method of Aspect 170, wherein the premelt cooling material comprises zinc oxide.

Aspect 176. The method of Aspect 170 or Aspect 175, wherein the zinc oxide is present in the premelt mixture in an amount of from about 0.1 wt % to about 10 wt %.

Aspect 177. The method of Aspect 176, wherein the zinc oxide is present in the premelt mixture in an amount of from about 0.1 wt % to about 3 wt %.

Aspect 178. The method of Aspect 177, wherein the zinc oxide is present in the premelt mixture in an amount of from about 0.1 wt % to about 1 wt %.

Aspect 179. The method of any one of Aspect 160-Aspect 178, further processing the cooling masterbatch composition to provide cooling composition masterbatch chips, flakes, or pellets.

Aspect 180. The method of Aspect 180, wherein the average size of a cooling masterbatch composition chip, flake, or pellet is about 1 mm to about 10 mm in the longest dimension of the chip, flake, or pellet.

Aspect 181. A cooling pre-masterbatch composition comprising: a polymer and a cooling composition comprises nanoparticles of a cooling composition selected from aluminum, zinc oxide, and combinations thereof.

Aspect 182. The composition of Aspect 181, wherein the polymer is present in an amount of from about 99.99 wt % to about 90 wt %.

Aspect 183. The composition of Aspect 181 or Aspect 182, wherein the polymer comprises a polyester.

Aspect 184. The composition of Aspect 182, wherein the polyester is a polyethylene terephthalate, a polybutylene terephthalate, a polytrimethylene terephthalate, or combinations thereof.

Aspect 185. The composition of Aspect 184, wherein the polymer comprises a polyamide.

Aspect 186. The composition of Aspect 185, wherein the polyamide comprises nylon 6, nylon 4/6, nylon 6/6, nylon 6/10, nylon 6/12, nylon 11, nylon 12, or combinations thereof.

Aspect 187. The composition of any one of Aspect 181-Aspect 186, wherein the nanoparticles of the cooling composition have an average particle size from about 1 nm to about 50 nm.

Aspect 188. The composition of Aspect 187, wherein the average particle size is from about 2 nm to about 35 nm.

Aspect 189. The composition of Aspect 187, wherein the average particle size is from about 5 nm to about 35 nm.

Aspect 190. The composition of Aspect 187, wherein the average particle size is from about 10 nm to about 35 nm.

Aspect 191. The composition of Aspect 187, wherein the average particle size is from about 20 nm to about 35 nm.

Aspect 192. The composition of Aspect 187, wherein the average particle size is from about 30 nm to about 35 nm.

Aspect 193. The composition of Aspect 187, wherein the average particle size is from about 1 nm to about 20 nm.

Aspect 194. The composition of Aspect 187, wherein the average particle size is from about 2 nm to about 20 nm.

Aspect 195. The composition of Aspect 187, wherein the average particle size is from about 5 nm to about 20 nm.

Aspect 196. The composition of Aspect 187, wherein the average particle size is from about 10 nm to about 20 nm.

Aspect 197. The composition of Aspect 187, wherein the average particle size is from about 15 nm to about 20 nm.

Aspect 198. The composition of any one of Aspect 181-Aspect 197, wherein the nanoparticles of the cooling composition are present in an amount of from about 0.01 wt % to about 5 wt %.

Aspect 199. The composition of Aspect 198, wherein the nanoparticles of the cooling composition are present in an amount of from about 0.01 wt % to about 4.5 wt %.

Aspect 200. The composition of Aspect 198, wherein the nanoparticles of the cooling composition are present in an amount of from about 0.01 wt % to about 4.0 wt %.

Aspect 201. The composition of Aspect 198, wherein the nanoparticles of the cooling composition are present in an amount of from about 0.01 wt % to about 3.5 wt %.

Aspect 202. The composition of Aspect 198, wherein the nanoparticles of the cooling composition are present in an amount of from about 0.01 wt % to about 3.0 wt %.

Aspect 203. The composition of Aspect 198, wherein the nanoparticles of the cooling composition are present in an amount of from about 0.01 wt % to about 2.5 wt %.

Aspect 204. The composition of Aspect 198, wherein the nanoparticles of the cooling composition are present in an amount of from about 0.01 wt % to about 2.0 wt %.

Aspect 205. The composition of Aspect 198, wherein the nanoparticles of the cooling composition are present in an amount of from about 0.01 wt % to about 1.5 wt %.

Aspect 206. The composition of Aspect 198, wherein the nanoparticles of the cooling composition are present in an amount of from about 0.01 wt % to about 1.0 wt %.

Aspect 207. The composition of Aspect 198, wherein the nanoparticles of the cooling composition are present in an amount of from about 0.01 wt % to about 0.90 wt %.

Aspect 208. The composition of Aspect 198, wherein the nanoparticles of the cooling composition are present in an amount of from about 0.01 wt % to about 0.85 wt %.

Aspect 209. The composition of Aspect 198, wherein the nanoparticles of the cooling composition are present in an amount of from about 0.01 wt % to about 0.80 wt %.

Aspect 210. The composition of Aspect 198, wherein the nanoparticles of the cooling composition are present in an amount of from about 0.01 wt % to about 0.75 wt %.

Aspect 211. The composition of Aspect 198, wherein the nanoparticles of the cooling composition are present in an amount of from about 0.01 wt % to about 0.70 wt %.

Aspect 212. The composition of Aspect 198, wherein the nanoparticles of the cooling composition are present in an amount of from about 0.01 wt % to about 0.65 wt %.

Aspect 213. The composition of Aspect 198, wherein the nanoparticles of the cooling composition are present in an amount of from about 0.01 wt % to about 0.60 wt %.

Aspect 214. The composition of Aspect 198, wherein the nanoparticles of the cooling composition are present in an amount of from about 0.01 wt % to about 0.55 wt %.

Aspect 215. The composition of Aspect 198, wherein the nanoparticles of the cooling composition are present in an amount of from about 0.01 wt % to about 0.50 wt %.

Aspect 216. The composition of Aspect 198, wherein the nanoparticles of the cooling composition are present in an amount of from about 0.02 wt % to about 0.50 wt %.

Aspect 217. The composition of Aspect 198, wherein the nanoparticles of the cooling composition are present in an amount of from about 0.03 wt % to about 0.50 wt %.

Aspect 218. The composition of Aspect 198, wherein the nanoparticles of the cooling composition are present in an amount of from about 0.04 wt % to about 0.50 wt %.

Aspect 219. The composition of Aspect 198, wherein the nanoparticles of the cooling composition are present in an amount of from about 0.05 wt % to about 0.50 wt %.

Aspect 220. The composition of Aspect 198, wherein the nanoparticles of the cooling composition are present in an amount of from about 0.06 wt % to about 0.50 wt %.

Aspect 221. The composition of Aspect 198, wherein the nanoparticles of the cooling composition are present in an amount of from about 0.07 wt % to about 0.50 wt %.

Aspect 222. The composition of Aspect 198, wherein the nanoparticles of the cooling composition are present in an amount of from about 0.08 wt % to about 0.50 wt %.

Aspect 223. The composition of Aspect 198, wherein the nanoparticles of the cooling composition are present in an amount of from about 0.09 wt % to about 0.50 wt %.

Aspect 224. The composition of Aspect 198, wherein the nanoparticles of the cooling composition are present in an amount of from about 0.1 wt % to about 5.0 wt %.

Aspect 225. The composition of Aspect 198, wherein the nanoparticles of the cooling composition are present in an amount of from about 0.1 wt % to about 4.5 wt %.

Aspect 226. The composition of Aspect 198, wherein the nanoparticles of the cooling composition are present in an amount of from about 0.1 wt % to about 4.0 wt %.

Aspect 227. The composition of Aspect 198, wherein the nanoparticles of the cooling composition are present in an amount of from about 0.1 wt % to about 3.5 wt %.

Aspect 228. The composition of Aspect 198, wherein the nanoparticles of the cooling composition are present in an amount of from about 0.1 wt % to about 3.0 wt %.

Aspect 229. The composition of Aspect 198, wherein the nanoparticles of the cooling composition are present in an amount of from about 0.1 wt % to about 2.5 wt %.

Aspect 230. The composition of Aspect 198, wherein the nanoparticles of the cooling composition are present in an amount of from about 0.1 wt % to about 2.0 wt %.

Aspect 231. The composition of Aspect 198, wherein the nanoparticles of the cooling composition are present in an amount of from about 0.1 wt % to about 1.5 wt %.

Aspect 232. The composition of Aspect 198, wherein the nanoparticles of the cooling composition are present in an amount of from about 0.1 wt % to about 1.0 wt %.

Aspect 233. The composition of Aspect 198, wherein the nanoparticles of the cooling composition are present in an amount of from about 0.1 wt % to about 0.90 wt %.

Aspect 234. The composition of Aspect 198, wherein the nanoparticles of the cooling composition are present in an amount of from about 0.1 wt % to about 0.85 wt %.

Aspect 235. The composition of Aspect 198, wherein the nanoparticles of the cooling composition are present in an amount of from about 0.1 wt % to about 0.80 wt %.

Aspect 236. The composition of Aspect 198, wherein the nanoparticles of the cooling composition are present in an amount of from about 0.1 wt % to about 0.75 wt %.

Aspect 237. The composition of Aspect 198, wherein the nanoparticles of the cooling composition are present in an amount of from about 0.1 wt % to about 0.70 wt %.

Aspect 238. The composition of Aspect 198, wherein the nanoparticles of the cooling composition are present in an amount of from about 0.1 wt % to about 0.65 wt %.

Aspect 239. The composition of Aspect 198, wherein the nanoparticles of the cooling composition are present in an amount of from about 0.1 wt % to about 0.60 wt %.

Aspect 240. The composition of Aspect 198, wherein the nanoparticles of the cooling composition are present in an amount of from about 0.1 wt % to about 0.55 wt %.

Aspect 241. The composition of Aspect 198, wherein the nanoparticles of the cooling composition are present in an amount of from about 0.1 wt % to about 0.50 wt %.

Aspect 242. The composition of any one of Aspect 181-Aspect 241, wherein the composition comprises a first cooling composition and a second cooling composition; wherein the first cooling composition is aluminum; and wherein the second cooling composition is zinc oxide.

Aspect 243. The composition of Aspect 242, wherein the first cooling composition is present in a weight percent amount from about 0.01 weight percent to about 10 weight percent; wherein the second cooling composition is present in a weight percent amount from about 0.01 weight percent to about 10 weight percent; wherein the polymer is present in a weight percent amount of from about 99.99 weight percent to about 90 weight percent; and wherein first cooling composition, the second cooling composition, and the polymer are 100 weight percent.

Aspect 244. The composition of Aspect 243, wherein the first cooling composition is present in a weight percent amount of about 0.01 weight percent to about 5 weight percent; and wherein the second cooling composition is present in a weight percent amount of about 0.01 weight percent to about 5 weight percent.

Aspect 245. The composition of Aspect 243, wherein the first cooling composition is present in a weight percent amount of about 0.01 weight percent to about 3 weight percent; and wherein the second cooling composition is present in a weight percent amount of about 0.01 weight percent to about 3 weight percent.

Aspect 246. The composition of Aspect 243, wherein the first cooling composition is present in a weight percent amount of about 0.01 weight percent to about 1 weight percent; and wherein the second cooling composition is present in a weight percent amount of about 0.01 weight percent to about 1 weight percent.

Aspect 247. A method for preparing a cooling masterbatch composition, the method comprising: providing a premelt mixture comprising a premelt polymer and a premelt cooling material; wherein the premelt polymer is selected from a polyester, a polyamide, and combinations thereof; and wherein the premelt cooling material is selected from: (a) a cooling pre-masterbatch composition of any one of Aspect 181-Aspect 246 or made by the method of any of Aspect 160-Aspect 180; (b) titanium dioxide nanoparticles; (c) calcium carbonate nanoparticles; and (d) combinations of (a), (b), and (c); wherein the cooling pre-masterbatch composition, when present, is in the premelt mixture in an amount of from about 1 wt % to about 10 wt %; wherein the titanium dioxide, when present, is in the premelt mixture in an amount of from about 5 wt % to about 80 wt %; wherein the calcium carbonate, when present, is in the premelt mixture in an amount of from about 5 wt % to about 80 wt %; and wherein the wt % is based on the total weight of the premelt polymer and the premelt cooling material; melting the premelt mixture to form a melt mixture; and extruding the melt mixture; thereby providing the cooling masterbatch composition.

Aspect 248. The method of Aspect 247, wherein the premelt cooling material comprises the cooling pre-masterbatch composition.

Aspect 249. The method of Aspect 247, wherein the premelt cooling material comprises the cooling pre-masterbatch composition and titanium dioxide.

Aspect 250. The method of Aspect 247, wherein the premelt cooling material comprises the cooling pre-masterbatch composition and calcium carbonate.

Aspect 251. The method of Aspect 247, wherein the premelt cooling material comprises titanium dioxide.

Aspect 252. The method of Aspect 247, wherein the premelt cooling material comprises calcium carbonate.

Aspect 253. The method of Aspect 247, wherein the premelt polymer is a polyester.

Aspect 254. The method of Aspect 247, wherein the premelt polymer is a polyamide.

Aspect 255. The method of any one of Aspect 247-Aspect 254, wherein the premelt mixture further comprises an adhesive, a dispersant, or combinations thereof.

Aspect 256. The method of Aspect 255, wherein the adhesive is an acrylic resin.

Aspect 257. The method of Aspect 255 or Aspect 256, wherein the adhesive is present in an amount from about 0.01 weight percent to about 0.50 weight percent; and wherein the weight percent is based on the weight of all components in the premelt mixture.

Aspect 258. The method of Aspect 255, wherein the dispersant is selected from sodium pyrophosphate, polypropylene glycol such as polypropylene glycol 700, and combinations thereof.

Aspect 259. The method of Aspect 255 or Aspect 258, wherein the dispersant is present in an amount from about 0.001 weight percent to about 0.10 weight percent; and wherein the weight percent is based on the weight of all components in the premelt mixture.

Aspect 260. The method of any one of Aspect 247-Aspect 259, wherein the melting is at a temperature of about 250° C. to about 600° C.

Aspect 261. The method of Aspect 260, wherein the melting is at a temperature of about 270° C. to about 600° C.

Aspect 262. The method of any one of Aspect 247-Aspect 261, wherein the cooling pre-masterbatch composition comprises aluminum, zinc oxide, or combination thereof.

Aspect 263. The method of Aspect 262, wherein the cooling pre-masterbatch composition comprises aluminum.

Aspect 264. The method Aspect 262 or Aspect 263, wherein the aluminum is present in the premelt mixture in an amount of from about 0.1 wt % to about 10 wt %.

Aspect 265. The method of Aspect 264, wherein the aluminum is present in the premelt mixture in an amount of from about 0.1 wt % to about 3 wt %.

Aspect 266. The method of Aspect 264, wherein the aluminum is present in the premelt mixture in an amount of from about 0.1 wt % to about 1 wt %.

Aspect 267. The method of Aspect 262, wherein the cooling pre-masterbatch composition comprises zinc oxide.

Aspect 268. The method of Aspect 262 or Aspect 267, wherein the zinc oxide is present in the premelt mixture in an amount of from about 0.1 wt % to about 10 wt %.

Aspect 269. The method of Aspect 268, wherein the zinc oxide is present in the premelt mixture in an amount of from about 0.1 wt % to about 3 wt %.

Aspect 270. The method of Aspect 268, wherein the zinc oxide is present in the premelt mixture in an amount of from about 0.1 wt % to about 1 wt %.

Aspect 271. The method of any one of Aspect 247-Aspect 270, wherein the titanium dioxide is in the premelt mixture in an amount of from about 5 wt % to about 70 wt %.

Aspect 272. The method of Aspect 271, wherein the titanium dioxide is in the premelt mixture in an amount of from about 5 wt % to about 60 wt %.

Aspect 273. The method of Aspect 271, wherein the titanium dioxide is in the premelt mixture in an amount of from about 10 wt % to about 60 wt %.

Aspect 274. The method of Aspect 271, wherein the titanium dioxide is in the premelt mixture in an amount of from about 15 wt % to about 60 wt %.

Aspect 275. The method of Aspect 271, wherein the titanium dioxide is in the premelt mixture in an amount of from about 20 wt % to about 60 wt %.

Aspect 276. The method of Aspect 271, wherein the titanium dioxide is in the premelt mixture in an amount of from about 25 wt % to about 60 wt %.

Aspect 277. The method of any one of Aspect 247-Aspect 276, wherein the calcium carbonate is in the premelt mixture in an amount of from about 5 wt % to about 70 wt %.

Aspect 278. The method of Aspect 277, wherein the calcium carbonate is in the premelt mixture in an amount of from about 5 wt % to about 60 wt %.

Aspect 279. The method of Aspect 277, wherein the calcium carbonate is in the premelt mixture in an amount of from about 10 wt % to about 60 wt %.

Aspect 280. The method of Aspect 277, wherein the calcium carbonate is in the premelt mixture in an amount of from about 15 wt % to about 60 wt %.

Aspect 281. The method of Aspect 277, wherein the calcium carbonate is in the premelt mixture in an amount of from about 20 wt % to about 60 wt %.

Aspect 282. The method of Aspect 277, wherein the calcium carbonate is in the premelt mixture in an amount of from about 25 wt % to about 60 wt %.

Aspect 283. The method of any one of Aspect 247-Aspect 282, further processing the cooling masterbatch composition to provide cooling composition masterbatch chips, flakes, or pellets.

Aspect 284. The method of Aspect 283, wherein the average size of a cooling masterbatch composition chip, flake, or pellet is about 1 mm to about 10 mm in the longest dimension of the chip, flake, or pellet.

Aspect 285. A cooling masterbatch composition prepared by any one of Aspect 247-Aspect 284.

Aspect 286. A cooling masterbatch composition comprising: a masterbatch polymer selected from a polyester, a polyamide, and combinations thereof; a masterbatch cooling material selected from aluminum, zinc oxide, titanium dioxide, calcium carbonate, and combinations thereof; wherein the aluminum, when present, has an average particle size of from about 1 nm to about 50 nm and is in the cooling masterbatch composition in an amount of from about 0.1 wt % to about 10 wt %; wherein the zinc oxide, when present, has an average particle size of from about 1 nm to about 50 nm and is in the cooling masterbatch composition in an amount of from about 0.1 wt % to about 10 wt %; wherein the titanium dioxide, when present, has an average particle size of from about 10 nm to about 2000 nm and is in the cooling masterbatch composition in an amount of from about 1 wt % to about 90 wt %; and wherein the calcium carbonate, when present, has an average particle size of from about 10 nm to about 2000 nm and is in the cooling masterbatch composition in an amount of from about 1 wt % to about 90 wt %; and wherein the wt % is based on a total weight of the masterbatch polymer and all materials in the masterbatch cooling material.

Aspect 287. The cooling masterbatch composition of Aspect 286, wherein the masterbatch cooling material comprises zinc oxide.

Aspect 288. The cooling masterbatch composition of Aspect 286, wherein the masterbatch cooling material comprises aluminum.

Aspect 289. The cooling masterbatch composition of Aspect 286, wherein the masterbatch cooling material comprises titanium dioxide.

Aspect 290. The cooling masterbatch composition of Aspect 286, wherein the masterbatch cooling material comprises calcium carbonate.

Aspect 291. The cooling masterbatch composition of Aspect 286, wherein the masterbatch cooling material comprises zinc oxide and titanium dioxide.

Aspect 292. The cooling masterbatch composition of Aspect 286, wherein the masterbatch cooling material comprises aluminum and titanium dioxide.

Aspect 293. The cooling masterbatch composition of Aspect 286, wherein the masterbatch cooling material comprises zinc oxide, aluminum and titanium dioxide.

Aspect 294. The cooling masterbatch composition of Aspect 286, wherein the masterbatch polymer comprises a polyester.

Aspect 295. The cooling masterbatch composition of Aspect 286, wherein the masterbatch polymer comprises a polyamide.

Aspect 296. The cooling masterbatch composition of any one of Aspect 286-Aspect 295, further comprising an adhesive, a dispersant, or combinations thereof.

Aspect 297. The cooling masterbatch composition of Aspect 296, wherein the adhesive is an acrylic resin.

Aspect 298. The cooling masterbatch composition of Aspect 286 or Aspect 297, wherein the adhesive is present in an amount from about 0.01 weight percent to about 0.50 weight percent; and wherein the weight percent is based on the weight of all components in the premelt mixture.

Aspect 299. The cooling masterbatch composition of Aspect 286, wherein the dispersant is selected from sodium pyrophosphate, polypropylene glycol such as polypropylene glycol 700, and combinations thereof.

Aspect 300. The cooling masterbatch composition of Aspect 286 or Aspect 299, wherein the dispersant is present in an amount from about 0.001 weight percent to about 0.10 weight percent; and wherein the weight percent is based on the weight of all components in the premelt mixture.

Aspect 301. The cooling masterbatch composition of any one of Aspect 286-Aspect 300, wherein the aluminum is present in the cooling masterbatch composition in an amount of from about 0.1 wt % to about 3 wt %.

Aspect 302. The cooling masterbatch composition of Aspect 301, wherein the aluminum is present in the cooling masterbatch composition in an amount of from about 0.1 wt % to about 1 wt %.

Aspect 303. The cooling masterbatch composition of any one of Aspect 286-Aspect 302, wherein the zinc oxide is present in the cooling masterbatch composition in an amount of from about 0.1 wt % to about 3 wt %.

Aspect 304. The cooling masterbatch composition of Aspect 303, wherein the zinc oxide is present in the cooling masterbatch composition in an amount of from about 0.1 wt % to about 1 wt %.

Aspect 305. The cooling masterbatch composition of any one of Aspect 286-Aspect 302, wherein the titanium dioxide is present in the cooling masterbatch composition in an amount of from about 5 wt % to about 60 wt %.

Aspect 306. The cooling masterbatch composition of Aspect 305, wherein the titanium dioxide is in the cooling masterbatch composition in an amount of from about 10 wt % to about 60 wt %.

Aspect 307. The cooling masterbatch composition of Aspect 305, wherein the titanium dioxide is in the cooling masterbatch composition in an amount of from about 15 wt % to about 60 wt %.

Aspect 308. The cooling masterbatch composition of Aspect 305, wherein the titanium dioxide is in the cooling masterbatch composition in an amount of from about 20 wt % to about 60 wt %.

Aspect 309. The cooling masterbatch composition of Aspect 305, wherein the titanium dioxide is in the cooling masterbatch composition in an amount of from about 25 wt % to about 60 wt %.

Aspect 310. The cooling masterbatch composition of any one of Aspect 286-Aspect 309, wherein the calcium carbonate is in the cooling masterbatch composition in an amount of from about 5 wt % to about 70 wt %.

Aspect 311. The cooling masterbatch composition of Aspect 310, wherein the calcium carbonate is in the cooling masterbatch composition in an amount of from about 5 wt % to about 60 wt %.

Aspect 312. The cooling masterbatch composition of Aspect 310, wherein the calcium carbonate is in the cooling masterbatch composition in an amount of from about 10 wt % to about 60 wt %.

Aspect 313. The cooling masterbatch composition of Aspect 310, wherein the calcium carbonate is in the cooling masterbatch composition in an amount of from about 15 wt % to about 60 wt %.

Aspect 314. The cooling masterbatch composition of Aspect 310, wherein the calcium carbonate is in the cooling masterbatch composition in an amount of from about 20 wt % to about 60 wt %.

Aspect 315. The cooling masterbatch composition of Aspect 310, wherein the calcium carbonate is in the cooling masterbatch composition in an amount of from about 25 wt % to about 60 wt %.

Aspect 316. The cooling masterbatch composition of any one of Aspect 286-Aspect 315, wherein the cooling masterbatch composition is in the form chips, flakes, or pellets.

Aspect 317. The cooling masterbatch composition of Aspect 316, wherein the average size of a cooling masterbatch composition chip, flake, or pellet is about 1 mm to about 10 mm in the longest dimension of the chip, flake, or pellet.

Aspect 318. A method for making a cooling composition filament, the method comprising: melting the cooling composition masterbatch of any one of Aspect 285-Aspect 317; melting a filament polymer; mixing the cooling composition masterbatch and the filament polymer; extruding a filament; thereby providing the cooling composition filament.

Aspect 319. The method of Aspect 318, wherein the cooling composition masterbatch and the filament polymer are separately melted; and wherein the mixing comprises blending the melted cooling composition masterbatch and the melted filament polymer.

Aspect 320. The method of Aspect 318, wherein the mixing comprises co-extrusion of the melted cooling composition masterbatch and the melted filament polymer.

Aspect 321. The method of any one of Aspect 318-Aspect 320, wherein the filament polymer is a polyester, a polyamide, or combinations thereof.

Aspect 322. The method of Aspect 321, wherein the polyester is a polyethylene terephthalate, a polybutylene terephthalate, a polytrimethylene terephthalate, or combinations thereof.

Aspect 323. The method of Aspect 321, wherein the polyamide comprises nylon 6, nylon 4/6, nylon 6/6, nylon 6/10, nylon 6/12, nylon 11, nylon 12, or combinations thereof.

Aspect 324. The method of any one of Aspect 318-Aspect 323, wherein the cooling composition filament comprises from about 90 weight percent to about 99 weight percent of the filament polymer.

Aspect 325. A cooling filament made by the method of any one of Aspect 318-Aspect 324.

Aspect 326. A cooling filament yarn comprising: a cooling filament yarn polymer selected from a polyester, a polyamide, and combinations thereof; a cooling material selected from aluminum, zinc oxide, titanium dioxide, calcium carbonate, and combinations thereof; wherein the aluminum, when present, has an average particle size of from about 1 nm to about 50 nm and is in the cooling masterbatch composition in an amount of from about 0.1 wt % to about 10 wt %; wherein the zinc oxide, when present, has an average particle size of from about 1 nm to about 50 nm and is in the cooling masterbatch composition in an amount of from about 0.1 wt % to about 10 wt %; wherein the titanium dioxide, when present, has an average particle size of from about 10 nm to about 2000 nm and is in the cooling masterbatch composition in an amount of from about 1 wt % to about 90 wt %; and wherein the calcium carbonate, when present, has an average particle size of from about 10 nm to about 2000 nm and is in the cooling masterbatch composition in an amount of from about 1 wt % to about 90 wt %; and wherein the wt % is based on a total weight of the masterbatch polymer and all materials in the masterbatch cooling material.

Aspect 327. The cooling filament yarn of Aspect 326, wherein the cooling filament yarn comprises zinc oxide.

Aspect 328. The cooling filament yarn of Aspect 326, wherein the cooling filament yarn comprises aluminum.

Aspect 329. The cooling filament yarn of Aspect 326, wherein the cooling filament yarn comprises titanium dioxide.

Aspect 330. The cooling filament yarn of Aspect 326, wherein the cooling filament yarn comprises calcium carbonate.

Aspect 331. The cooling filament yarn of Aspect 326, wherein the cooling filament yarn comprises zinc oxide and titanium dioxide.

Aspect 332. The cooling filament yarn of Aspect 326, wherein the cooling filament yarn comprises aluminum and titanium dioxide.

Aspect 333. The cooling filament yarn of Aspect 326, wherein the cooling filament yarn comprises zinc oxide, aluminum and titanium dioxide.

Aspect 334. The cooling filament yarn of Aspect 326, wherein the cooling filament yarn polymer comprises a polyester.

Aspect 335. The cooling filament yarn of Aspect 326, wherein the cooling filament yarn polymer comprises a polyamide.

Aspect 336. The cooling filament yarn of any one of Aspect 326-Aspect 335, further comprising an adhesive, a dispersant, or combinations thereof.

Aspect 337. The cooling filament yarn of Aspect 336, wherein the adhesive is an acrylic resin.

Aspect 338. The cooling filament yarn of Aspect 336 or Aspect 337, wherein the adhesive is present in an amount from about 0.01 weight percent to about 0.50 weight percent; and wherein the weight percent is based on the weight of all components in the cooling filament yarn.

Aspect 339. The cooling filament yarn of Aspect 336, wherein the dispersant is selected from sodium pyrophosphate, polypropylene glycol such as polypropylene glycol 700, and combinations thereof.

Aspect 340. The cooling filament yarn of Aspect 336 or Aspect 339, wherein the dispersant is present in an amount from about 0.001 weight percent to about 0.10 weight percent; and wherein the weight percent is based on the weight of all components in the cooling filament yarn.

Aspect 341. The cooling filament yarn of any one of Aspect 326-Aspect 340, wherein the aluminum is present in the cooling filament yarn in an amount of from about 0.1 wt % to about 3 wt %.

Aspect 342. The cooling filament yarn of Aspect 301, wherein the aluminum is present in the cooling filament yarn in an amount of from about 0.1 wt % to about 1 wt %.

Aspect 343. The cooling filament yarn of any one of Aspect 326-Aspect 342, wherein the zinc oxide is present in the cooling filament yarn in an amount of from about 0.1 wt % to about 3 wt %.

Aspect 344. The cooling filament yarn of Aspect 343, wherein the zinc oxide is present in the cooling filament yarn in an amount of from about 0.1 wt % to about 1 wt %.

Aspect 345. The cooling filament yarn of any one of Aspect 326-Aspect 344, wherein the titanium dioxide is present in the cooling filament yarn in an amount of from about 5 wt % to about 60 wt %.

Aspect 346. The cooling filament yarn of Aspect 345, wherein the titanium dioxide is in the cooling filament yarn in an amount of from about 10 wt % to about 60 wt %.

Aspect 347. The cooling filament yarn of Aspect 345, wherein the titanium dioxide is in the cooling filament yarn in an amount of from about 15 wt % to about 60 wt %.

Aspect 348. The cooling filament yarn of Aspect 345, wherein the titanium dioxide is in the cooling filament yarn in an amount of from about 20 wt % to about 60 wt %.

Aspect 349. The cooling filament yarn of Aspect 345, wherein the titanium dioxide is in the cooling filament yarn in an amount of from about 25 wt % to about 60 wt %.

Aspect 350. The cooling filament yarn of any one of Aspect 326-Aspect 349, wherein the calcium carbonate is in the cooling filament yarn in an amount of from about 5 wt % to about 70 wt %.

Aspect 351. The cooling filament yarn of Aspect 350, wherein the calcium carbonate is in cooling filament yarn in an amount of from about 5 wt % to about 60 wt %.

Aspect 352. The cooling filament yarn of Aspect 350, wherein the calcium carbonate is in the cooling filament yarn in an amount of from about 10 wt % to about 60 wt %.

Aspect 353. The cooling filament yarn of Aspect 350, wherein the calcium carbonate is in the cooling filament yarn in an amount of from about 15 wt % to about 60 wt %.

Aspect 354. The cooling filament yarn of Aspect 350, wherein the calcium carbonate is in the cooling filament yarn in an amount of from about 20 wt % to about 60 wt %.

Aspect 355. The cooling filament yarn of Aspect 350, wherein the calcium carbonate is in the cooling filament yarn in an amount of from about 25 wt % to about 60 wt %.

Aspect 356. A cooling filament yarn comprising the cooling filament of any one of Aspect 325-Aspect 355.

Aspect 357. An article comprising the cooling filament yarn of Aspect 327.

Aspect 358. The article of Aspect 357, wherein the article is an article of clothing.

Aspect 359. The article of Aspect 358, wherein the article of clothing is a pair of pants, a shirt, a jacket, a dress, or a skirt.

Aspect 360. The article of Aspect 358, wherein the article of clothing is an article of sportswear.

Aspect 361. The article of Aspect 357, wherein is the article is an article of drapery.

Aspect 362. The article of Aspect 357, wherein is the article is a floor covering.

Aspect 363. The article of Aspect 357, wherein is the article is a tote bag, a furniture cover, a tarpaulin, or a vehicle seat.

Aspect 364. A fabric comprising the cooling filament yarn of Aspect 356.

Aspect 365. The fabric of Aspect 364, wherein the cooling filament yarn is a warp yarn.

Aspect 366. The fabric of Aspect 364, wherein the cooling filament yarn is a weft yarn.

Aspect 367. The fabric of Aspect 364, wherein the fabric comprises a warp yarn different from cooling filament yarn.

Aspect 368. The fabric of Aspect 367, wherein the warp yarn is a cotton yarn.

Aspect 369. The fabric of Aspect 364, wherein the warp yarn is a cotton yarn having a weight of about 8's to about 50's.

Aspect 370. The fabric of any one of Aspect 364-Aspect 369, wherein the fabric is a warp-faced fabric.

Aspect 371. The fabric of any one of Aspect 364-Aspect 370, wherein the fabric is a left-handed twill weave; and wherein the left-handed twill weave has diagonals run from the right to the left of the fabric.

Aspect 372. The fabric of any one of Aspect 364-Aspect 371, wherein the fabric is a right-handed twill weave; and wherein the left-handed twill weave has diagonals run from the left to the right of the fabric.

Aspect 373. The fabric of any one of Aspect 364-Aspect 372, wherein the weave pattern is a 3 by 1 weave; and wherein 3 warp yarns are woven over and under a weft yarn.

From the foregoing, it will be seen that aspects herein are well adapted to attain all the ends and objects hereinabove set forth together with other advantages which are obvious in view of the present disclosure and which are inherent to the structure.

While specific elements and steps are discussed in connection to one another, it is understood that any element and/or steps provided herein is contemplated as being combinable with any other elements and/or steps regardless of explicit provision of the same while still being within the scope provided herein.

It will be understood that certain features and subcombinations are of utility and may be employed without reference to other features and subcombinations. This is contemplated by and is within the scope of the claims.

Since many possible aspects may be made without departing from the scope thereof, it is to be understood that all matter herein set forth or shown in the accompanying drawings and detailed description is to be interpreted as illustrative and not in a limiting sense.

It is also to be understood that the terminology used herein is for the purpose of describing particular aspects only and is not intended to be limiting. The skilled artisan will recognize many variants and adaptations of the aspects described herein. These variants and adaptations are intended to be included in the teachings of this disclosure and to be encompassed by the claims herein.

Now having described the aspects of the present disclosure, in general, the following Examples describe some additional aspects of the present disclosure. While aspects of the present disclosure are described in connection with the following examples and the corresponding text and figures, there is no intent to limit aspects of the present disclosure to this description. On the contrary, the intent is to cover all alternatives, modifications, and equivalents included within the spirit and scope of the present disclosure.

O. Examples

The following examples are put forth so as to provide those of ordinary skill in the art with a complete disclosure and description of how the compounds, compositions, articles, devices and/or methods claimed herein are made and evaluated, and are intended to be purely exemplary of the disclosure and are not intended to limit the scope of what the inventors regard as their disclosure. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric.

1. Example 1: Preparation of Coated Polyester Film

Materials. Cooling materials used in this example were graphene, silica ($SiO_2$), zinc oxide (ZnO), and aluminum sourced from suppliers in China. Zinc oxide was obtained as a powder having an average particle size of 2-10 μm. Aluminum was obtained in metallic form. Polyester film was sourced from suppliers in Taiwan and had a thickness of 23 μm.

Sputterinq Targets. The sputtering targets were prepared by compression molding or liquid molding as described herein.

Zinc oxide sputtering target: Zinc oxide powder was compression molded at a pressure of 2 ton/in$^3$ and a temperature of 1007° C. in vacuum. The target prepared by compression molding for use in the sputtering method was about 3.5 kg with dimensions of 30 cm long x 15 cm wide x up to 18 mm thick.

Aluminum sputtering target: Aluminum metal was melted at 660° C. and poured into a mold. The molded target prepared for use in the sputtering method was about 3.0 kg with dimensions of 30 cm long x 15 cm wide x up to 18 mm thick.

Sputterinq method: preparation of zinc oxide coated polyester film. Up to five zinc targets, prepared as described above, were placed in the sputter coating machine at a distance of 7-12 cm from the substrate to be sputter coated, i.e., in the present example the substrate was polyester film having a 23 μm thickness. The targets were negatively charged and the film was positively charged. The polyester film was sputtered using high energy ionized argon gas molecules under vacuum. The sputtering process deposits a single, uniform layer of sputtered material comprising graphene, silica and zinc oxide having a thickness of 10-15 nm on the polyester film. The layer of sputtered material provides essentially 100% coverage of the substrate film. The target ion hopping temperature was about 7500-8000° C., and the surface contact temperature of the film was about 65-70° C. The argon gas was supplied in the sputtering chamber at the rate of 1-1.5 m$^3$/hr and a continuous DC magnetic field was used having a frequency range of 20,000 Hz.

Sputterinq method: preparation of aluminum coated polyeseter film. An aluminum target, prepared as described above, was placed in the sputter coating machine at a distance of 7-12 cm from the substrate to be sputter coated, i.e., in the present example the substrate was polyester film having a 23 μm thickness. The target was negatively charged and the film was positively charged. The polyester film was sputtered using high energy ionized argon gas molecules under vacuum. The sputtering process deposits a single, uniform layer of sputtered material comprising aluminum having a thickness of 5-8 nm on the polyester film. The layer of sputtered material provides essentially 100% coverage of the substrate film. The target ion hopping temperature was about 7500-8000° C., and the surface contact temperature of the film was about 65-70° C. The argon gas was supplied in the sputtering chamber at the rate of 1-1.5 m$^3$/hr and a continuous DC magnetic field was used having a frequency range of 20,000 Hz.

2. Example 2: Preparation of Cooling Masterbatch

A coated film, e.g., the graphene/silica/zinc oxide coated polyester film or the aluminum coated polyester film, was melted at a temperature of 280-290° C. in a hopper and extruded in a twin-screw extruder to form extruded masterbatch pellets comprising polyester and cooling material. Extrusion was carried out at 100 kg/hr (450 cycles/min) and 14.7 lbf/sq. in. Pellets of each type of polyester and cooling material prepared above, i.e., masterbatch pellets comprising polyester, graphene, silica, and zinc oxide (designated herein as the PE/graphene/silica/ZnO masterbatch) and masterbatch pellets comprising polyester and aluminum (designated herein as the PE/Al masterbatch) were mixed in an amount of 70 wt % PE/Al masterbatch and 30 wt % PE/graphene/silica/ZnO masterbatch in a hopper, melted at a temperature of 280-290° C., and extruded as described above to form cooling masterbatch pellets.

3. Example 3: Preparation of Cooling Filament Yarn by Melting Spinning

Cooling masterbatch pellets (10 wt %) were mixed with virgin polyester pellets (90 wt %) are dried at a temperature of 170° C. to reduce the moisture content and thus prevent the hydrolysis of the polymer which leads to the deterioration of its properties. Following moisture reduction, the mixture of virgin polyester and cooling masterbatch pellets are melted and extruded through a spinneret at a temperature of 265-290° C. at 4000 m/min. The extruded material is solidified by a flow of cooling air in a cooling zone, and then drawn through tension rollers at a temperature above the material glass transition temperature, e.g., 69° C., to improve polymer chain orientation and increase filament strength.

4. Example 4: Preparation of Cooling Drawn Texturized Yarn

The filament yarn prepared as described above was subjected to texturizing by heat setting in a twisted condition to provide a yarn with greater bulk, higher stretch and better aesthetic properties. Briefly, the cooling filament yarn prepared above was passed through heated rollers (i.e., heated to temperature above glass transition temperature) and simultaneously twisted and drawn to produce a draw texturized yarn. The resultant cooling texturized yarn was 75 Denier/72 filament, semi dull, Draw Texturized Yarn (75D/72 SD DTY).

5. Example 5: Analysis Cooling Films, Cooling Masterbatch Pellets, and Cooling Yarns Samples of cooling films, masterbatch pellets, and yarns, prepared as described above, were coated with Gold-Palladium coating using a Leica EM ACE600 Coater in the presence of Argon and Nitrogen gases. The coating process was carried out for 20 minutes to deposit a layer of 15 nm of coating on the samples. The samples were then loaded in a FEI Teneo scanning electron microscope (FEI, Inc., Hillsboro, Oregon, US) and examined under the Concentric backscatter detector under a range of potential differences (5-20 volts) and magnifications (200-700X). All SEM images were obtained at the Georgia Electron Microscopy Center (University of Georgia, 151 Barrow Hall, 115 D.W. Brooks Drive, Athens GA 30602, USA). The FEI Teneo was used to obtain images of all the sputtered films, pellets and yarns.

Figure 2:
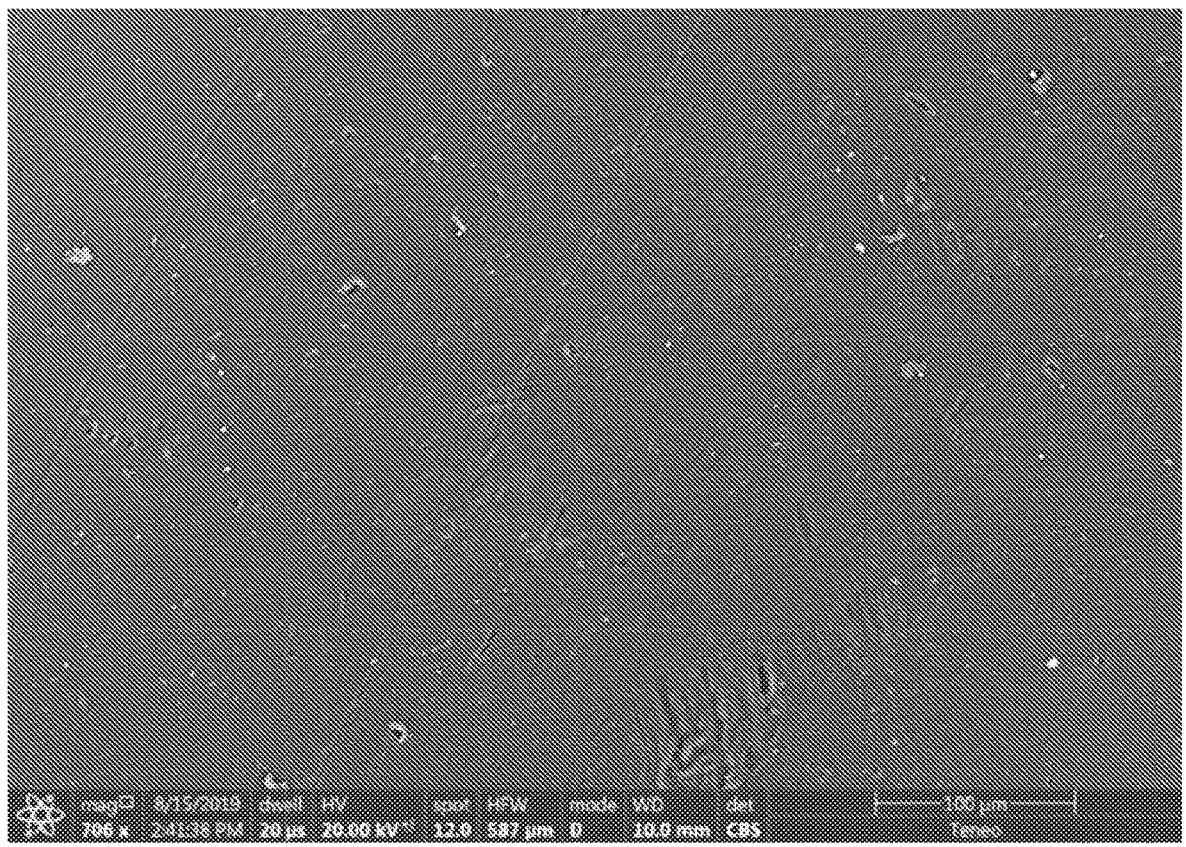
FIG. 2 shows a representative image obtained using SEM of a representative disclosed masterbatch pellet comprising polyester and a nanoparticle cooling composition comprising aluminum. A scalar bar (100 μm) for dimensional context is shown in the lower right corner of the figure.
Figure 3B:
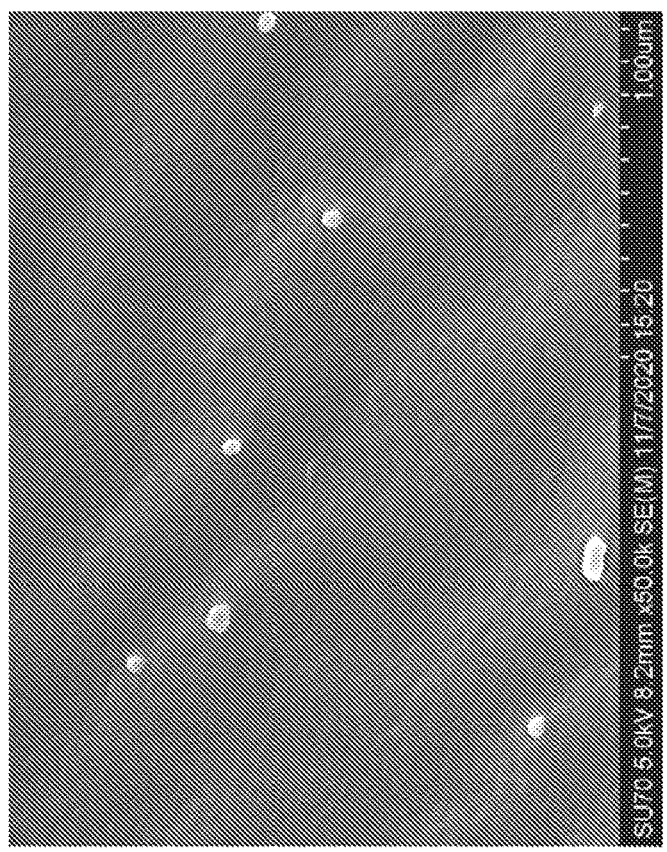
FIGS. 3A-3B shows representative scanning electron micrograph (SEM) images of a representative disclosed yarn comprising nanoparticles of aluminum. The SEM images were prepared according to ASTM E1479-16.
Figure 3A:
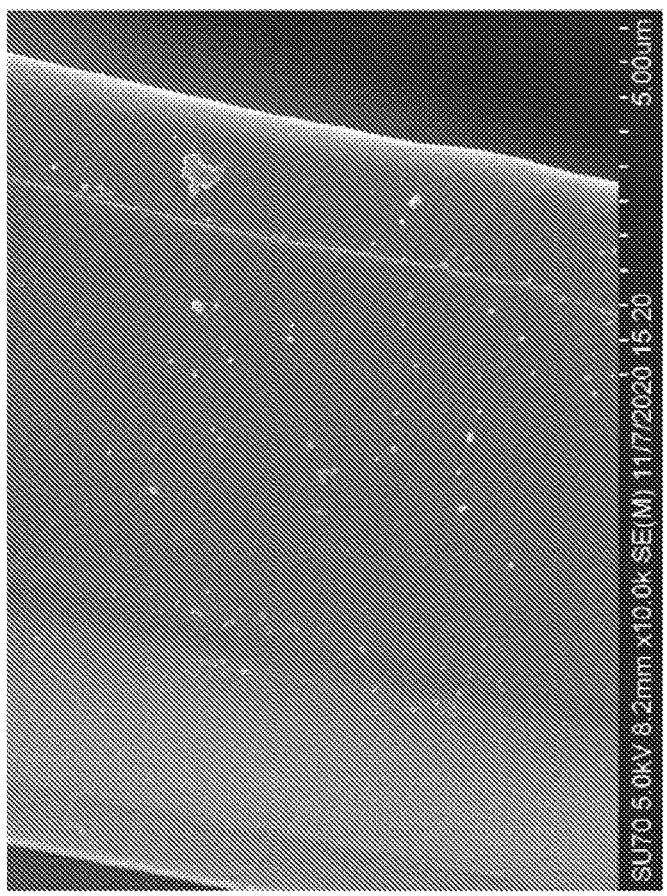
Figure 4B:
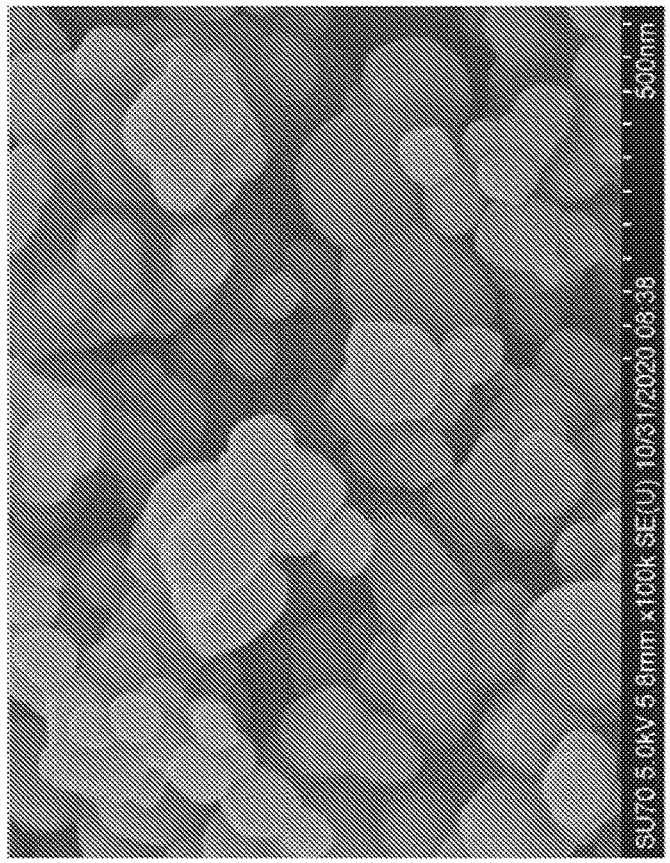
FIG. 4A-4B shows representative scanning electron micrograph (SEM) images of a representative disclosed titanium nanoparticles and a yarn comprising nanoparticles of same. The SEM images were prepared according to ASTM E1479-16.
Figure 4A:
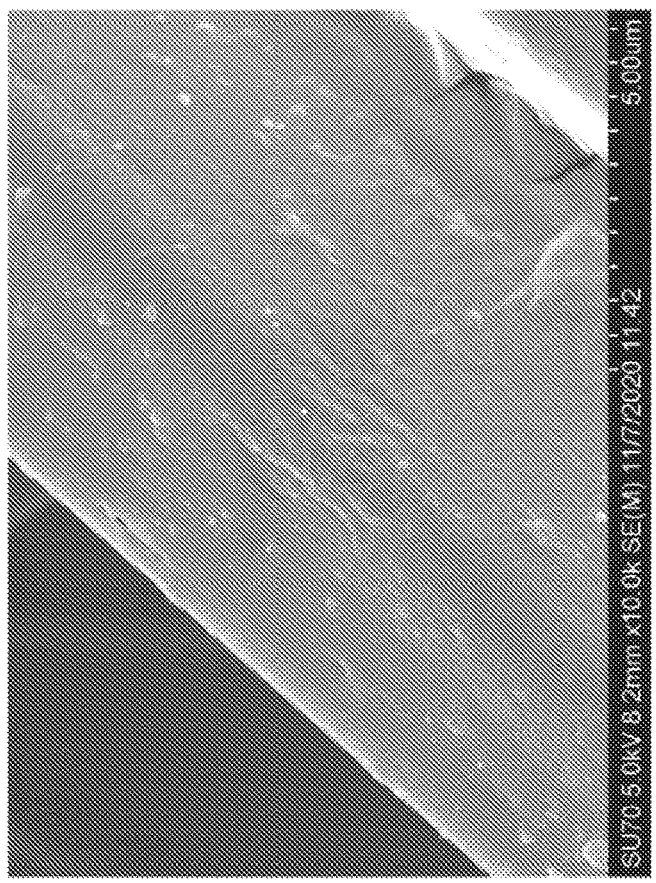
Figure 5:
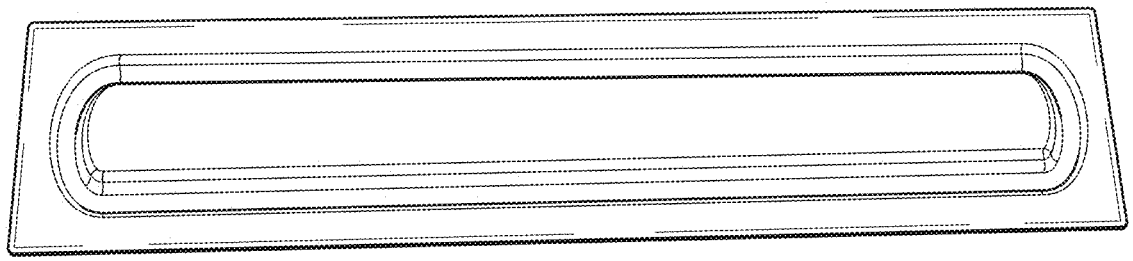
FIG. 5 shows a photographic image of a representative disclosed sputtering target.
Figure 6:
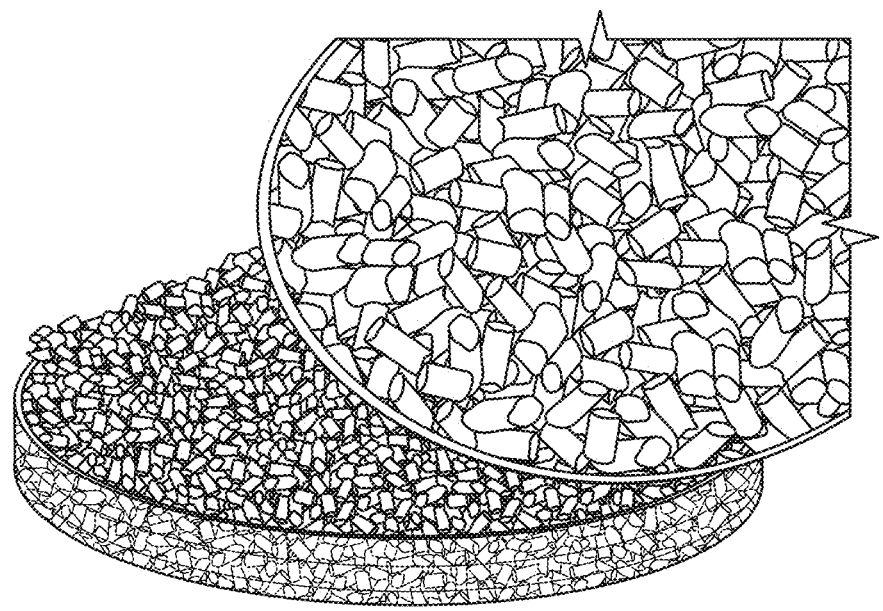
FIG. 6 shows a photographic image of a representative disclosed cooling masterbatch material that has been pelletized.
Figure 7:
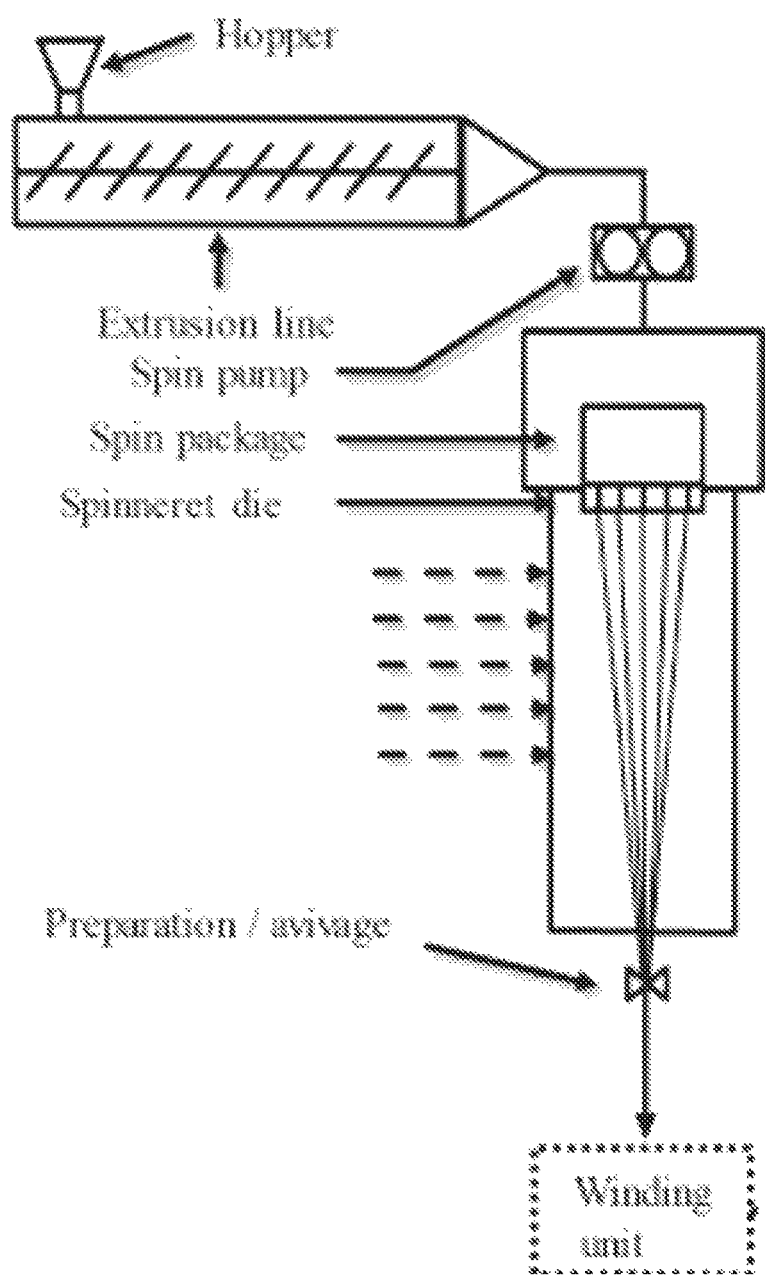
FIG. 7 shows a representative schematic representation of the method workflow and machinery used to prepare a disclosed cooling filament yarn.

Scanning electron microscopy ("SEM") images are shown in FIGS. 1-6. FIG. 1 shows a representative image obtained using SEM of a representative disclosed film comprising polyester having thereon a nanoparticle cooling composition comprising aluminum. FIG. 2 shows a representative image obtained using SEM of a representative disclosed masterbatch pellet comprising polyester and a nanoparticle cooling composition comprising aluminum. FIG. 3 shows a representative image obtained using SEM of a representative disclosed film comprising polyester having thereon a nanoparticle cooling composition comprising graphene, silica, and zinc oxide. FIG. 4 shows a representative image obtained using SEM of a representative disclosed masterbatch pellet comprising polyester and a nanoparticle cooling composition comprising graphene, silica, and zinc oxide. FIGS. 5-6 shows a representative images obtained using SEM of a representative polyester yarn comprising a disclosed masterbatch pellet comprising polyester and a nanoparticle cooling composition comprising aluminum, graphene, silica, and zinc oxide.

Quantitative elemental analysis was performed using the Aztec software platform, and elements were reported in weight percentages (see Table 1 below).

TABLE 1

| Sample | C (wt %) | O (wt %) | ZnO (wt %) | $SiO_2$ (wt %) | Al (wt %) |
|---|---|---|---|---|---|
| Al pellet | 63 | 36.4 | N/A | N/A | 0.6 |
| Al film | 77.4 | 17.9 | N/A | N/A | 0.1 |

Average particle size of cooling particles was determined using Image J software to analyze SEM images (see Table 2 below).

TABLE 2

| Sample Name | Average Particle Size from Scanning Electron Microscope | Range Max for Scanning Electron Microscope | Range Min for Scanning Electron Microscope | Sample size (n) for Scanning Electron Microscope |
|---|---|---|---|---|
| Al pellet | 6.11 (nm) | 39.45 (nm) | 3.95 (nm) | 304 |
| Al film | 6.03 (nm) | 38.48 (nm) | 3.76 (nm) | 211 |

6. Example 6: Preparation and Analysis of Cooling Woven Fabric

The cooling texturized yarn prepared above was used to prepare a woven cooling fabric. Briefly, the sputtered cooling yarn (Polyester 75D/72 DTY SD) prepared above was woven in a plain 1×1 weave using a commercial weaving machine to provide a disclosed cooling woven fabric. The disclosed cooling woven fabric had a weight of 79 grams per square meter. A comparator woven fabric was prepared having a similar weight (79 grams per square meter) using a 75D/72 DTY SD polyester yarn comprising cooling materials that were micron-sized versus the nano-sized cooling materials of the representative disclosed cooling woven fabric. Each of the woven fabrics (the disclosed fabric and the comparator fabric) were de-sized, scoured, bleached and finished before being used in Qmax analysis. Qmax was determined in accordance with FTTS-FA-019 as specified by Committee of Conformity Assessment of Accreditation and Certification on Functional and Technical Textiles (Taiwan). The samples analyzed and Qmax results are summarized in Table 3 below. The data below show that the disclosed cooling fabric utilizing a cooling yarn with nano-sized cooling materials had a significantly improved Qmax (0.251 W/cm$^2$) compared to the comparator cooling fabric Qmax (0.198 W/cm$^2$). The approximately ~27% improvement in Qmax demonstrates that reduction of the cooling material particle size using the disclosed method of preparing a cooling yarn having nano-sized cooling materials from masterbatch materials prepared using the disclosed sputtering method provides a superior cooling fabric.

TABLE 3

| Test Sample | Fiber content | Fabric weight | Fabric construction | Q max (FTTS-FA-019) W/cm2 | Yarn used |
|---|---|---|---|---|---|
| Disclosed fabric sample | 100% Polyester | 79 GSM | 1 × 1 Plain Weave | 0.251 | Polyester 75D/72 DTY SD with nano-sized cooling materials |
| Comparator fabric sample | 100% Polyester | 75 GSM | 1 × 1 Plain Weave | 0.198 | Polyester 75D/72 DTY SD with micron-sized cooling materials |

In the aggregate, the disclosed representative fabric showed a surprisingly significant improvement in a number of characteristics and properties compared to a conventional denim fabric.

7. Example 7: Representative Disclosed Cooling Films, Masterbatches, and Yarns—Composition Analysis Table 4 below shows elemental analysis of representative disclosed films, masterbatches, and yarns prepared as described in the Examples herein above. Elemental analysis was carried out via ICP using ASTM E1479-16.

presence of Argon and Nitrogen gases. The coating process was carried out for 20 minutes to deposit a layer of 15 nm of coating on the samples.

The samples were then loaded in the FEI Teneo Scanning electron microscope where they were examined under the Concentric backscatter detector under a range of potential differences (5-20 volts) and magnifications (200-700X).

Composition of the cooling minerals, quantitative elemental analysis was performed using the Aztec software platform. The elements were reported in weight percentages.

In some instances, particle size was determined using Hitachi SU-70 FE-SEM at VCU NCC (Virginia Commonwealth University: Nanomaterials Core Characterization

TABLE 4

| | | Elemental analysis via ICP using ASTM E1479-16 Method | | | |
|---|---|---|---|---|---|
| No. | Sample ID | Element Analyzed | Compound Reported | wt % of Compound | vol % of Compound* |
| 1 | Cooling film (substrate: polyester; sputtered material: aluminum) | Aluminum | Aluminum | 0.52% | 0.270% |
| 2 | Masterbatch (polymer: polyester; cooling composition: aluminum nanoparticles) | Aluminum | Aluminum | 0.75% | 0.390% |
| 3 | Yarn 50/72 DTY (polymer: polyester; cooling composition: aluminum nanoparticles) | Aluminum | Aluminum | 0.01% | 0.005% |
| 4 | Cooling film (substrate: polyester; sputtered material: ZnO) | Zinc | Zinc Oxide | 0.24% | 0.059% |
| 5 | Masterbatch (polymer: polyester; cooling composition: ZnO nanoparticles) | Zirsc | Zinc Oxide | 0.27% | 0.068% |
| 6 | Masterbatch (polymer: polyester; cooling composition: $CaCO_3$ nanoparticles) | Calcium | Calcium Carbonate | 26.50% | 15.70% |
| 7 | Masterbatch (polymer: nylon; cooling composition: $CaCO_3$ nanoparticles) | Calcium | Calcium Carbonate | 24.95% | 14.66% |
| 8 | Yarn 75/72 FD DTY (polymer: polyester; cooling composition: 5% $TiO_2$ nanoparticles; 1% ZnO nanoparticles) | Zinc Titanium | Zinc Oxide Titanium Dioxide | 0.0037% 3.20% | 0.001% 1.083% |

*calculated based on densities of the compounds

8. Example 8: Particle and Wt % Analysis of Representative Disclosed Cooling Films, Masterbatches, and Yarns—Composition Analysis Compositional and particle size analysis were carried out as described herein. Briefly, all SEM images were obtained at the Georgia Electron Microscopy Center (University of Georgia, 151 Barrow Hall, 115 D.W. Brooks Drive, Athens GA 30602, USA). The FEI Teneo was used to obtain images of all the sputtered films, pellets and yarns.

The samples that were imaged were coated with Gold-Palladium coating using a Leica EM ACE600 Coater in the facility) on 08/19/2020. The resolution of the Hitachi SU-70 FE-SEM is 2.0 nanometer and was deemed ideal to determine the particle sizes of the powders as the expected particle size was 10-50 nm. Particle size and particle size distribution was performed using the ImageJ software.

Tables 5-7 show average particle size, particle size range, and wt % in representative disclose cooling films, cooling masterbatch compositions, and cooling yarns prepared as disclosed herein.

TABLE 5

| Material | Avg Particle Size (nm) | Particle Size Range (nm) | Weight % |
|---|---|---|---|
| Aluminum Sputtering Target (solid metal) | n.a. | n.a. | 100 |
| Aluminum (film) | 18 | 10-30 | 0.52% |
| Aluminum (masterbatch: MBP1) | 18 | 10-30 | 0.33-0.75% |
| X112 Polyester 50/72 FD DTY 10% MBP1 Al | 28 | n.d. | Al 0.08% |

TABLE 6

| Material | Avg Particle Size (nm) | Particle Size Range (nm) | Weight % |
|---|---|---|---|
| Zinc Oxide (powder used to create sputtering target) | 160 | 40-400 | 100% |
| Zinc Oxide (film) | 28 | 7-55 | 0.24% |
| Zinc Oxide (masterbatch: MBP3) | 28 | 7-55 | 0.25-0.27% |
| X98 Polyester 50/72 FD DTY 5% MBP2 $TiO_2$ & 1% MBP3 ZnO | 101 | 70-190 | Zn 0.0012% $TiO_2$ 2.85% |

TABLE 7

| Material | Avg Particle Size (nm) | Particle Size Range (nm) | Weight % |
|---|---|---|---|
| Titanium Dioxide (powder) | 228 | 80-550 | 100 |
| Titanium Dioxide (masterbatch) | 199 | 76-600 | 57.73 |
| Titanium Dioxide reduced particle size (powder) | 90 | 20-230 | 100 |
| Titanium Dioxide reduced particle size (masterbatch: MBP2) | 110$_{(3/29)}$ | 47-380$_{(3/29)}$ | 54.1$_{(3/29)}$ |
| Polyester Full Dull Yarn (made from TIO2 NORMAL sized) | 200 | 60-325 | 0.30 |
| X98 Polyester Yarn 50/72 FD DTY (5% MBP2 & 1% MBP3 (reduced particle TiO2 & sputtered Zinc Oxide) | 101 | 70-190 | Zn 0.0012% $TiO_2$ 2.85% |

9. Example 9: Cooling Fabrics

Table 8 herein below shows a comparator fabric with no cooling composition and representative disclosed cooling fabrics prepared as disclosed herein.

TABLE 8

| Fabric | Fabric Weight (g/m²) | Gauge | Calculated % (wt %) of Cooling Additive | Composition of Yarn | Yarn Size |
|---|---|---|---|---|---|
| Virgin Polyester | 165 | 44 | — | 82% Polyester/ 18% Spandex | 50D/72F |
| K0146-3 | 165 | 44 | 5% MBP2 (reduced TiO2) + 1% MBP3 (sputtered ZnO) | 82% Polyester/ 18% Spandex | 50D/72F |
| K0146 | 165 | 44 | 5% MBP2 (reduced TiO2) + 3% MBP1 (Sputtered Aluminum) | 82% Polyester/ 18% Spandex | 50D/72F |
| K0146-4 | 165 | 44 | 10% MBP1 (Sputtered Aluminum) | 82% Polyester/ 18% Spandex | 50D/72F |

| Fabric | Structure | Yarn/Yarn Additive | Qmax (W/cm²) | Intertek Test# |
|---|---|---|---|---|
| Virgin Polyester | Circular Knit Jersey | none | 0.139 | TWNT 01864810 |
| K0146-3 | Circular Knit Jersey | X98/TiO2 reduced particle size & ZnO sputtered | 0.184 | TWNT 01860537 |
| K0146 | Circular Knit Jersey | X90/TiO2 reduced particle size & Aluminum sputtered | 0.194 | TWNT 01860548 |
| K0146-4 | Circular Knit Jersey | X112/Aluminum sputtered | 0.203 | TWNT 01870288 |

Table 9 shows representative properties of the comparator fabric and representative cooling fabrics of Table 8. The tests were carried out as follows: Qmax Cool Feeling Test (FTTS-FA-019, Version 3.0, Refer To KES-F7 Thermo Labo II) labeled as "Qmax (W/cm$^2$)" in Table 9; Vertical Wicking of Textile (AATCC TM197-2011e2(2018)e, Option A) labeled as "Reach 20 mm (minutes)" in Table 9; and Drying Rate Of Fabric As Received (AATCC 201-2012(2014)e, Heated Plate Method) labeled as "Drying Time" in Table 9, with the values given as minutes.

TABLE 9

| Fabric | Qmax (W/cm$^2$) | Drying Time | Reach 20 mm (minutes) |
|---|---|---|---|
| Virgin Polyester | 0.139 | 12.02 | 3 min L × 5 min W |
| K0146-3 | 0.184 | 7.27 | 1 min L × 1 min W |
| K0146 | 0.194 | 4.07 | 1 min L × 1 min W |
| K0146-4 | 0.203 | 6.51 | 1 min L × 1 min W |

It will be apparent to those skilled in the art that various modifications and variations can be made in the present disclosure without departing from the scope or spirit of the disclosure. Other embodiments of the disclosure will be apparent to those skilled in the art from consideration of the specification and practice of the disclosure disclosed herein. It is intended that the specification and examples be considered as exemplary only, with a true scope and spirit of the disclosure being indicated by the following claims.

What is claimed is:

1. A method of forming a cooling film, comprising:
   placing a plurality of sputtering targets in a sputtering chamber of sputtering device;
   placing a substrate in a substrate holder disposed above the plurality of sputtering targets;
   applying a DC magnetic field to the sputtering targets; and
   depositing at least one layer of sputtered material on a surface of the substrate;
   wherein the plurality of sputtering targets comprise a sputtering material selected from aluminum metal and a combination of aluminum metal and zinc oxide;
   wherein the layer of sputtered material comprises nanoparticles of a cooling composition;
      wherein the cooling composition comprises a material selected from aluminum metal and combination of aluminum metal and zinc oxide; and
   wherein the substrate comprises a polymer;
   wherein the substrate is a film;
   wherein the film has a thickness of about 5 μm to about 20 μm;
   wherein the particles of the sputtered material have an average particle size from about 1 nm to about 50 nm; and
   wherein the particles of the sputtered material are present in an amount of from about 0.01 wt % to about 1 wt % based on the total weight of the cooling film; thereby forming a cooling film comprising a substrate having thereon a layer of sputtered material.

2. The method of claim 1, wherein the substrate comprises a polyester.

3. The method of claim 2, wherein the polyester is a polyethylene terephthalate, a polybutylene terephthalate, a polytrimethylene terephthalate, or combinations thereof.

4. The method of claim 3, wherein the substrate comprises a polyamide.

5. The method of claim 4, wherein the polyamide comprises nylon 6, nylon 4/6, nylon 6/6, nylon 6/10, nylon 6/12, nylon 11, nylon 12, or combinations thereof.

6. The method of claim 1, wherein the at least one layer of sputtered material comprises a monolayer of particles of the sputtered material on at least one surface of the substrate.

7. The method of claim 1, wherein the plurality of sputtering targets comprises a first plurality of sputtering targets comprising a first sputtering material and a second plurality of sputtering targets comprising a second sputtering material;
   wherein the first plurality of sputtering targets consists of 1, 2, 3, or 4 first sputtering targets;
   wherein the second plurality of sputtering targets consists of 1, 2, 3, or 4 second sputtering targets;
   wherein the total number of the first plurality of sputtering targets and the second plurality of sputtering targets is 2, 3, 4, or 5;
   wherein the first sputtering material comprises aluminum metal; and wherein the second sputtering material comprises zinc oxide;
   wherein the layer of sputtered material comprises a first sputtered cooling composition comprising aluminum metal; and
   wherein the layer of sputtered material comprises a second sputtered cooling composition comprising zinc oxide.

8. The method of claim 7, wherein the first sputtering target cooling composition is present on the substrate in a weight percent amount from about 10 weight percent to about 90 weight percent; wherein the second sputtering target cooling composition is present on the substrate in a weight percent amount from about 90 weight percent to about 10 weight percent; wherein first sputtering target cooling composition and the second sputtering target cooling composition is 100 weight percent.

9. The method of claim 1, wherein the average particle size is from about 2 nm to about 35 nm.

10. The method of claim 1, wherein the average particle size is from about 1 nm to about 20 nm.

11. The method of claim 1, further comprising depositing one or more additional layers of sputtered material on the layer of sputtered material on the substrate.

12. The method of claim 11, wherein the depositing the one or more additional layers of sputtered material is repeated for 1 to 10 iterations.

* * * * *